(12) United States Patent
Zhang et al.

(10) Patent No.: US 6,869,750 B2
(45) Date of Patent: Mar. 22, 2005

(54) STRUCTURE AND METHOD FOR FORMING A MULTILAYERED STRUCTURE

(75) Inventors: Lei Zhang, San Jose, CA (US); Hunt Hang Jiang, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 92 days.

(21) Appl. No.: 10/126,334

(22) Filed: Apr. 19, 2002

(65) Prior Publication Data

US 2002/0150838 A1 Oct. 17, 2002

Related U.S. Application Data

(63) Continuation-in-part of application No. 09/429,854, filed on Oct. 28, 1999, now Pat. No. 6,428,942, and a continuation of application No. 09/956,605, filed on Sep. 18, 2001.

(51) Int. Cl.[7] .............................................. G03C 5/00
(52) U.S. Cl. ..................... 430/312; 430/311; 430/314; 430/316; 430/317; 430/322; 430/324; 430/330; 430/394; 428/106; 428/119
(58) Field of Search .................. 430/317, 311, 430/316, 312, 314, 322, 324, 330, 394; 428/106, 119

(56) References Cited

U.S. PATENT DOCUMENTS

| | | | |
|---|---|---|---|
| 3,791,858 A | 2/1974 | McPherson et al. | 117/201 |
| 3,976,524 A | 8/1976 | Feng | 156/8 |
| 4,181,755 A | 1/1980 | Liu et al. | 430/314 |
| 4,614,021 A | 9/1986 | Hulseweh | 29/590 |
| 4,824,802 A | 4/1989 | Brown et al. | 437/192 |
| 4,908,940 A | 3/1990 | Amano et al. | 29/852 |
| 4,915,983 A | 4/1990 | Lake et al. | 427/98 |
| 4,921,777 A | 5/1990 | Fraenkel et al. | 430/314 |
| 4,980,034 A | 12/1990 | Volfson et al. | 437/195 |
| 5,063,175 A | 11/1991 | Broadbent | 437/192 |
| 5,071,518 A | 12/1991 | Pan | 205/122 |
| 5,091,289 A | 2/1992 | Cronin et al. | 430/312 |
| 5,097,393 A | 3/1992 | Nelson et al. | 361/386 |
| 5,106,461 A | 4/1992 | Volfson et al. | 205/125 |
| 5,118,385 A | 6/1992 | Kumar | 156/644 |
| 5,137,597 A | 8/1992 | Curry, II et al. | 156/636 |
| 5,162,260 A | 11/1992 | Leibovitz | 427/195 |
| 5,188,702 A | 2/1993 | Takayama et al. | 156/630 |
| 5,283,081 A | 2/1994 | Kata et al. | 427/96 |
| 5,287,619 A | 2/1994 | Smith et al. | 29/852 |
| 5,316,974 A | 5/1994 | Crank | 437/190 |
| 5,337,466 A | 8/1994 | Ishida | 29/830 |
| 5,454,928 A | 10/1995 | Rogers et al. | 205/125 |
| 5,464,653 A | 11/1995 | Chantraine et al. | 427/96 |

(List continued on next page.)

FOREIGN PATENT DOCUMENTS

| | | | | |
|---|---|---|---|---|
| JP | 56-116697 | 9/1981 | | 3/46 |
| JP | 63-244796 | 10/1988 | | 3/46 |

OTHER PUBLICATIONS

Pan et al., "A Planar Approach to High Density Copper-Polymide Interconnect Fabrication," pp. 174–189, Proceeding of the Technical Conference—8th Int'l Electronics Packaging Conference (1988).

Iwasaki et al., "A Pillar–Shaped Via Structure in a Cu–Polymide Multilayer Substrate," pp. 127–131, Proceedings of the 1989 Japan International Electronic Manufacturing Technology Symposium.

Primary Examiner—Amanda Walke
(74) Attorney, Agent, or Firm—Sheppard Mullin Richter & Hampton LLP

(57) ABSTRACT

Improved methods for forming multilayer circuit structures are disclosed. In some embodiments, conductive layers, dielectric layers and conductive posts can be formed on both sides of a circuitized core structure. The conductive posts are disposed in the dielectric layers and can be stacked to form a generally vertical conduction pathway which passes at least partially through a multilayer circuit structure. The formed multilayer circuit structures can occupy less space than corresponding multilayer circuit structures with stacked via structures.

64 Claims, 38 Drawing Sheets

U.S. PATENT DOCUMENTS

| | | | |
|---|---|---|---|
| 5,495,665 A | 3/1996 | Carpenter et al. | 29/830 |
| 5,512,514 A | 4/1996 | Lee | 437/195 |
| 5,529,504 A | 6/1996 | Greenstein et al. | 439/91 |
| 5,654,237 A | 8/1997 | Suguro et al. | 438/624 |
| 5,699,613 A | 12/1997 | Chong et al. | 29/852 |
| 5,707,893 A | 1/1998 | Bhatt et al. | 437/195 |
| 5,763,324 A | 6/1998 | Nogami | 438/675 |
| 5,784,782 A | 7/1998 | Boyko et al. | 29/848 |
| 5,817,574 A | 10/1998 | Gardner | 438/637 |
| 5,819,406 A | 10/1998 | Yoshizawa et al. | 29/877 |
| 5,830,533 A | 11/1998 | Lin et al. | 427/272 |
| 5,834,845 A | 11/1998 | Stolmeijer | 257/752 |
| 5,843,839 A | 12/1998 | Ng | 438/637 |
| 5,851,910 A | 12/1998 | Hsu et al. | 438/612 |
| 5,879,568 A | 3/1999 | Urasaki et al. | 216/18 |
| 5,891,606 A | 4/1999 | Brown | 430/312 |
| 5,891,799 A | 4/1999 | Tsui | 438/624 |
| 5,916,453 A | 6/1999 | Beilin et al. | 216/38 |
| 5,925,206 A | 7/1999 | Boyko et al. | 156/150 |
| 5,939,789 A | 8/1999 | Kawai et al. | 257/758 |
| 5,998,291 A | 12/1999 | Bakhit et al. | 438/618 |
| 6,013,417 A | 1/2000 | Sebesta et al. | 430/312 |
| 6,071,814 A | 6/2000 | Jang | 438/687 |
| 6,451,509 B2 * | 9/2002 | Keesler et al. | 430/311 |
| 6,462,107 B1 * | 10/2002 | Sinclair et al. | 523/456 |
| 6,541,712 B1 * | 4/2003 | Gately et al. | 174/266 |
| 6,594,891 B1 * | 7/2003 | Kamperman et al. | 29/840 |
| 6,627,824 B1 * | 9/2003 | Lin | 174/268 |
| 6,638,690 B1 * | 10/2003 | Meier et al. | 430/313 |

* cited by examiner

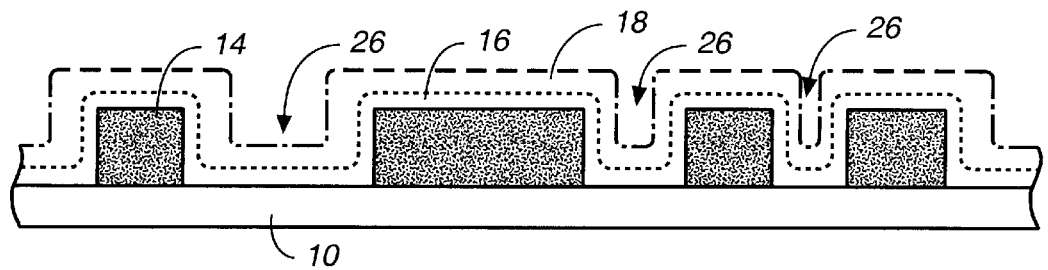
FIG._1
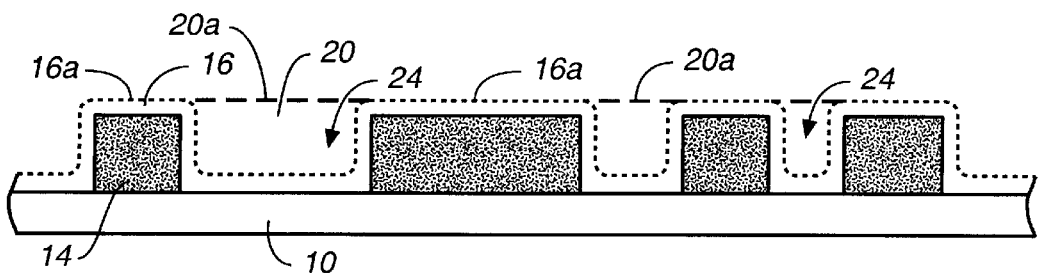
FIG._2A
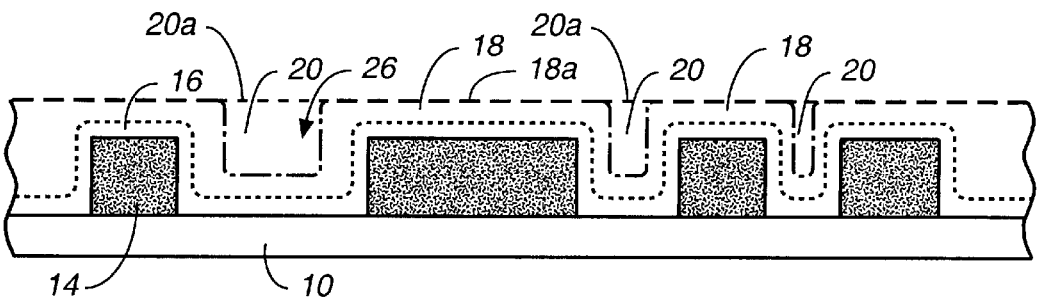
FIG._2B
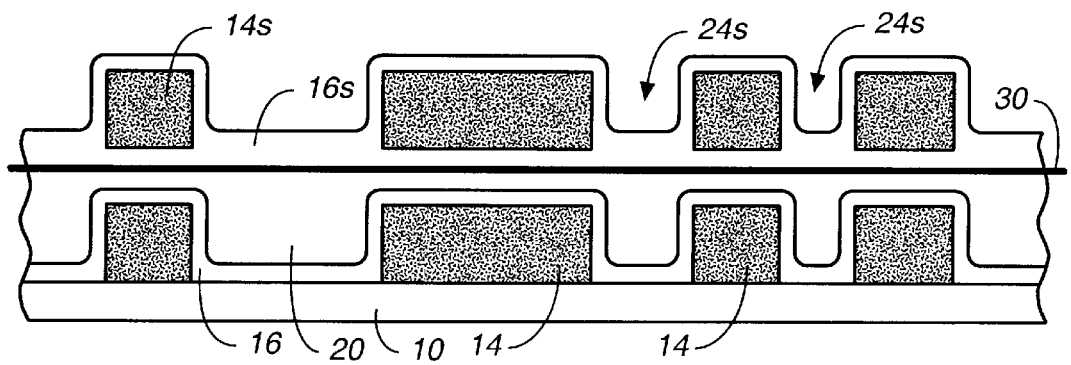
FIG._3

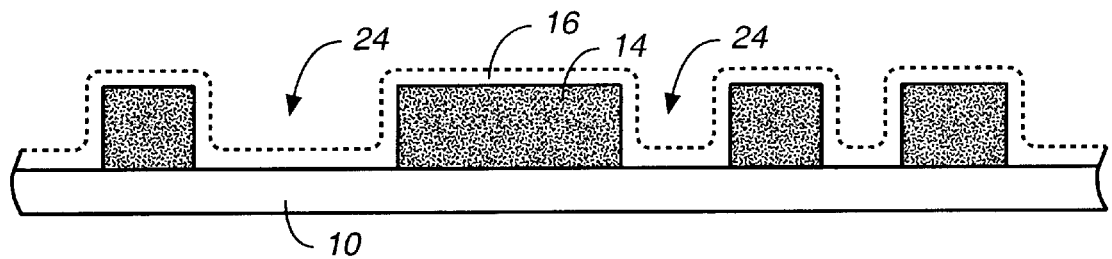
FIG._4
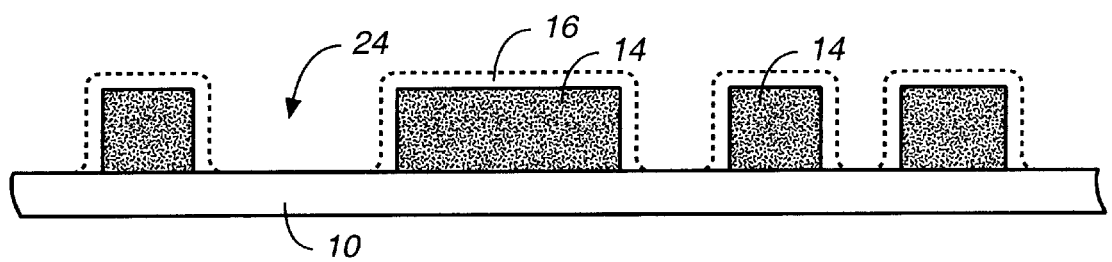
FIG._5
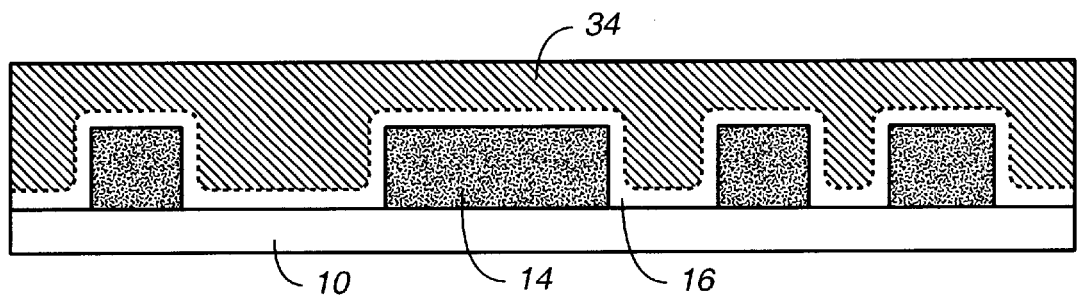
FIG._6
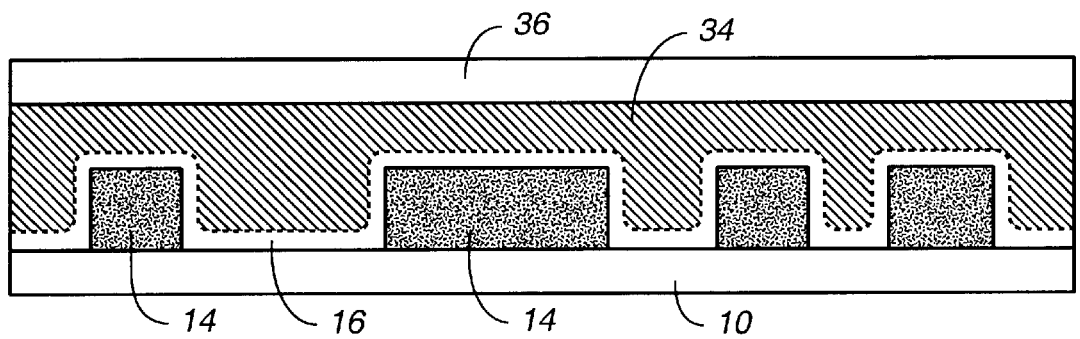
FIG._7

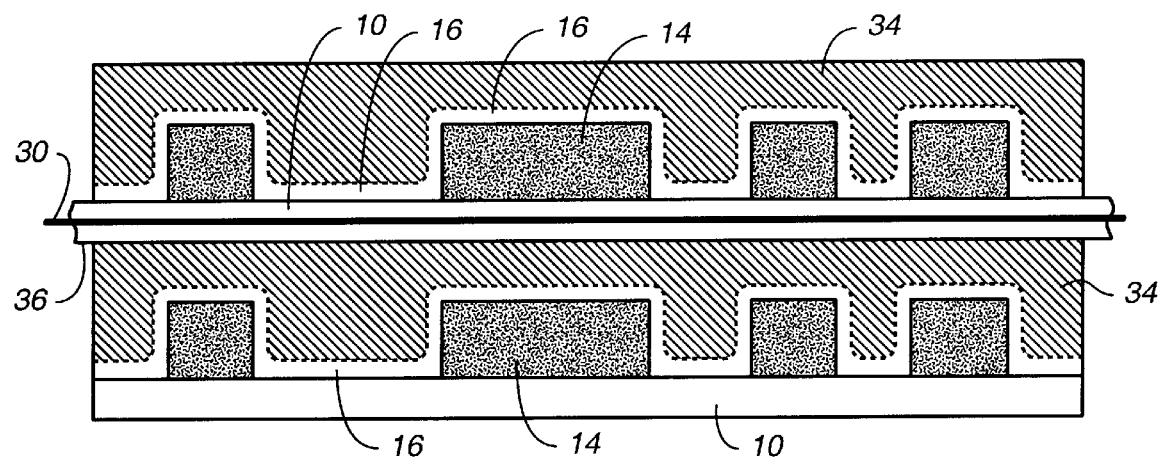
FIG._8
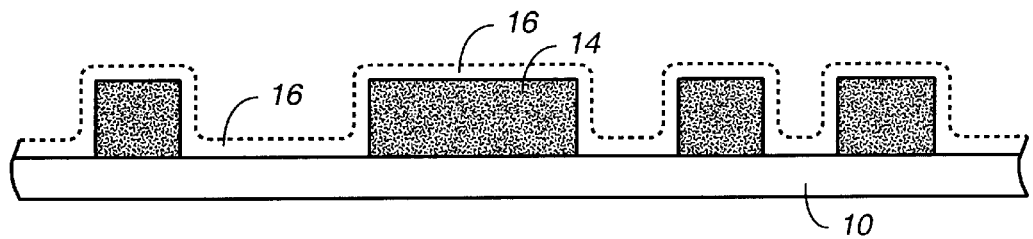
FIG._9
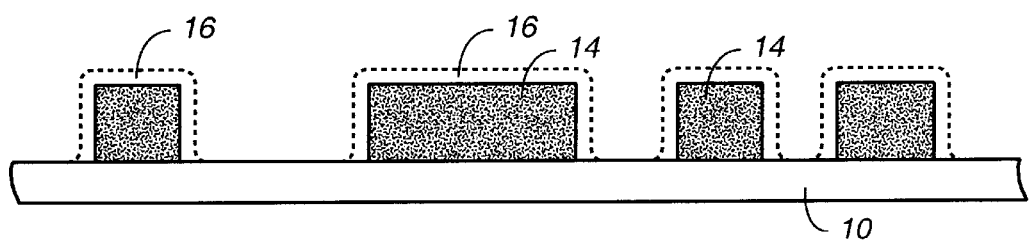
FIG._10
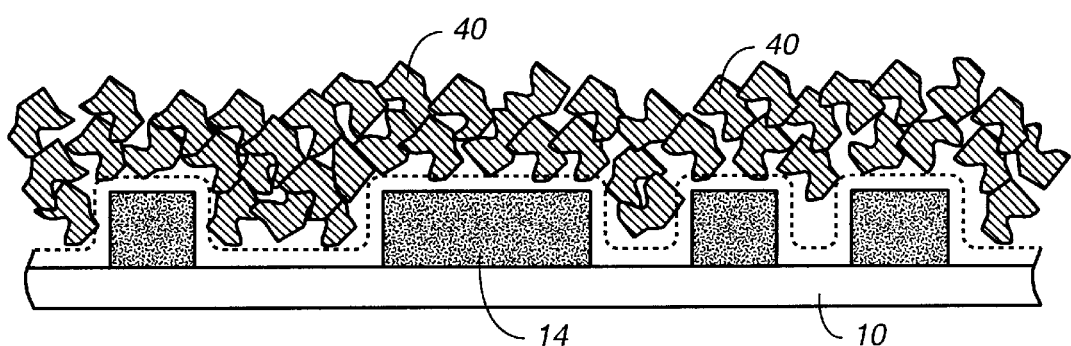
FIG._11

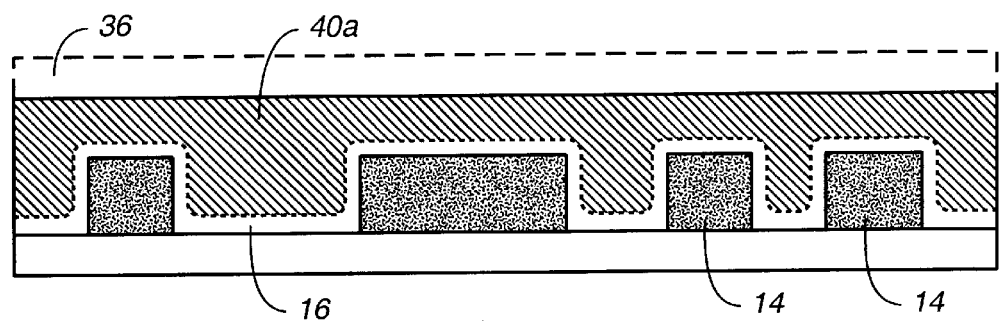
FIG._12
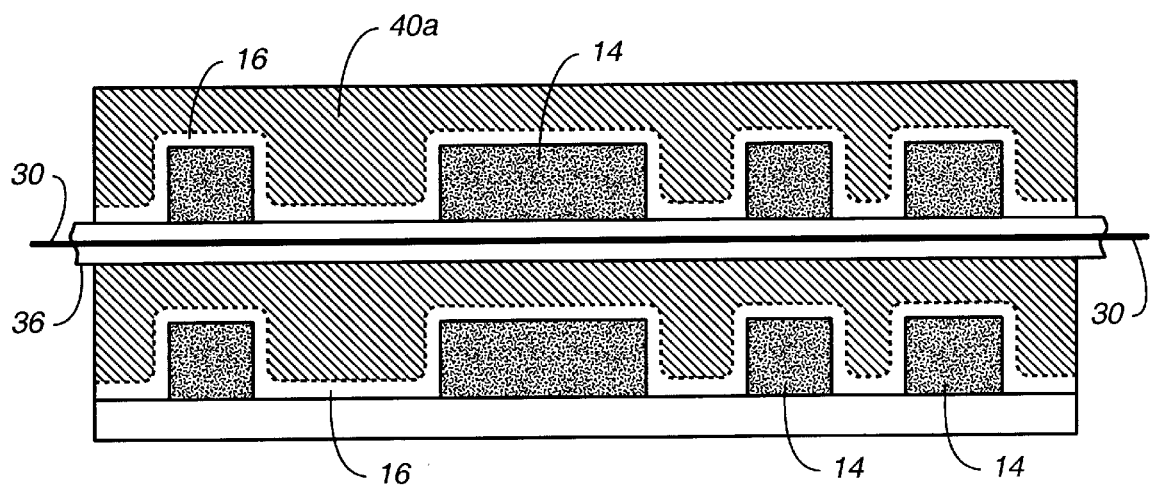
FIG._13
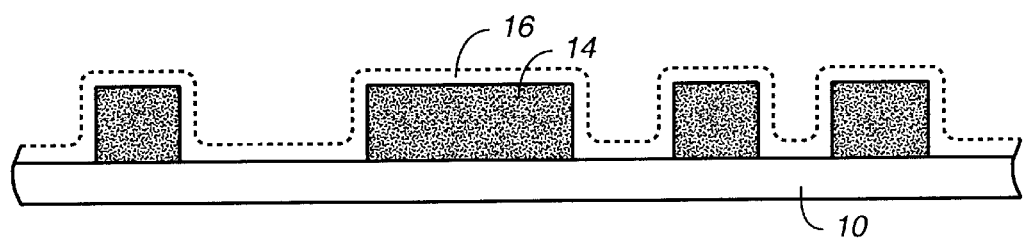
FIG._14
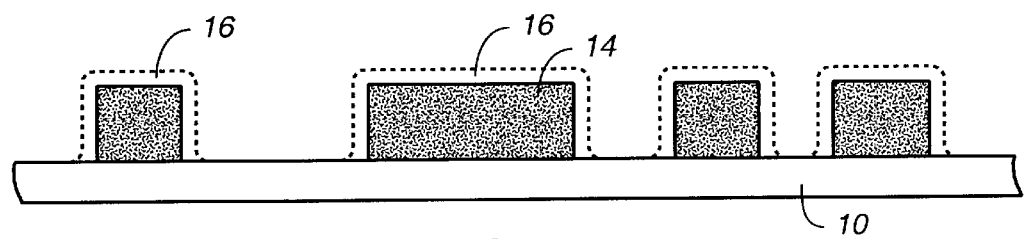
FIG._15

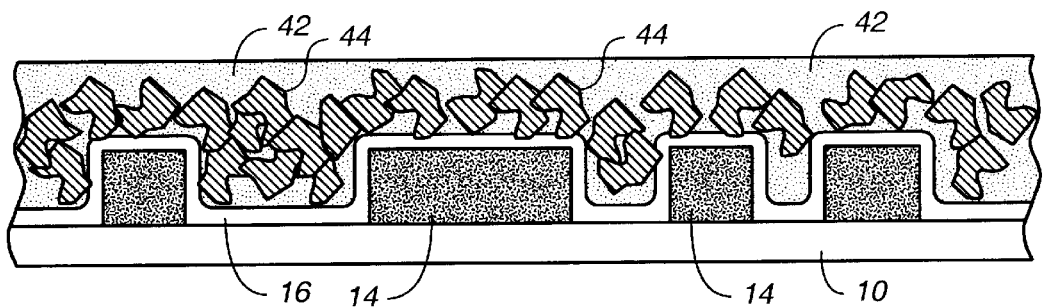
FIG._16
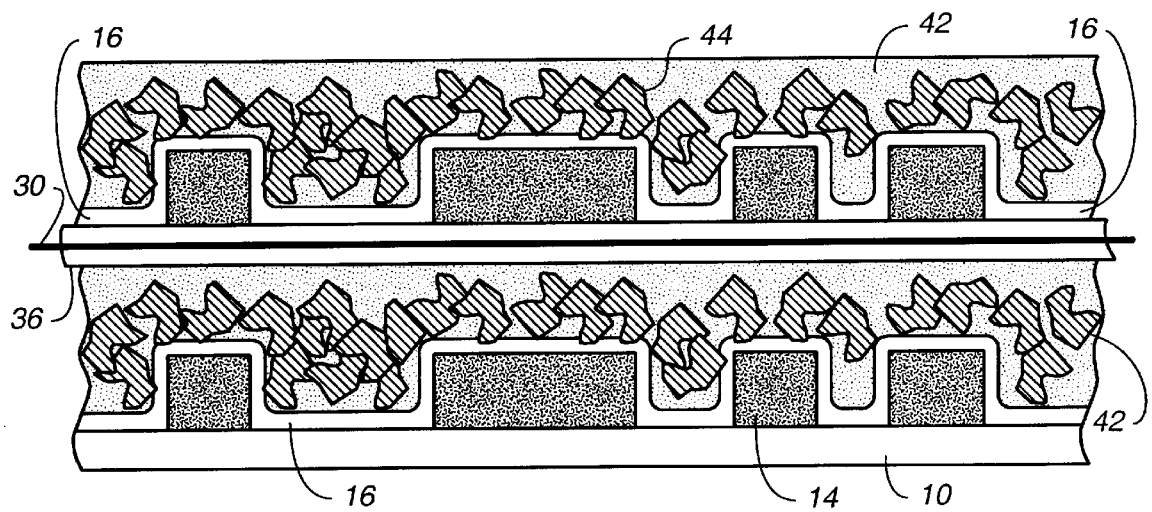
FIG._17
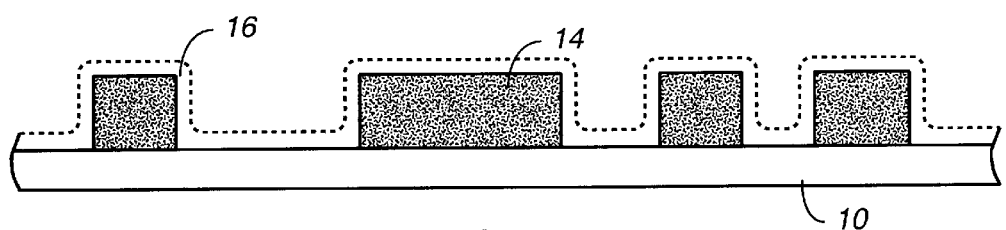
FIG._18
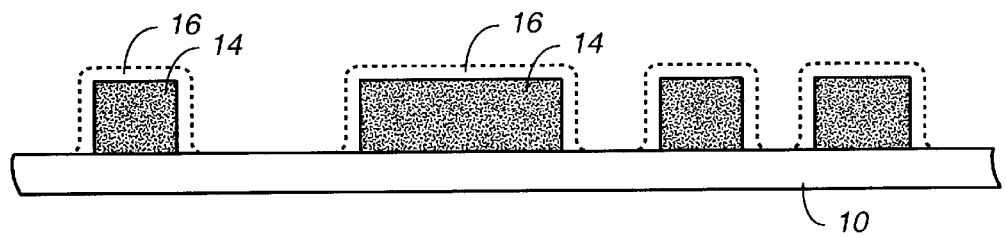
FIG._19

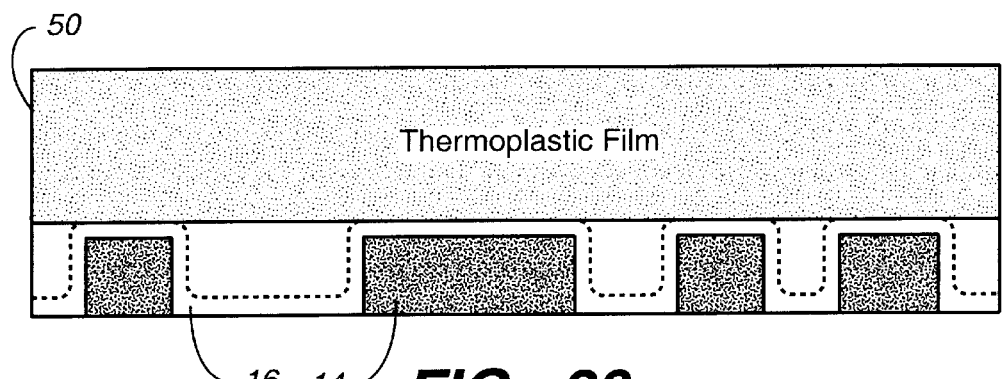
FIG._20
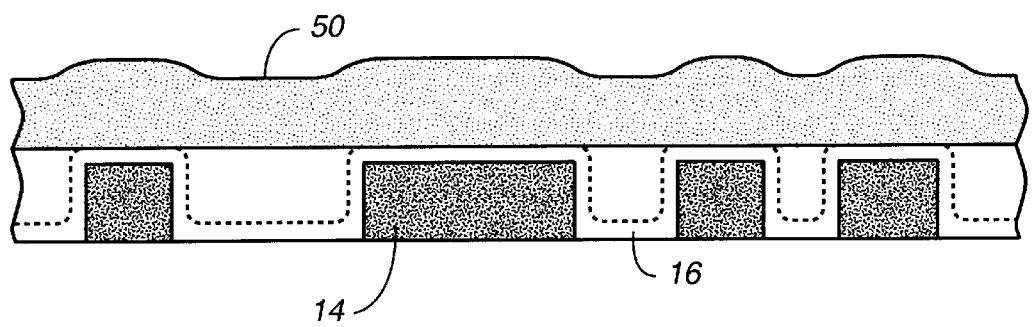
FIG._21
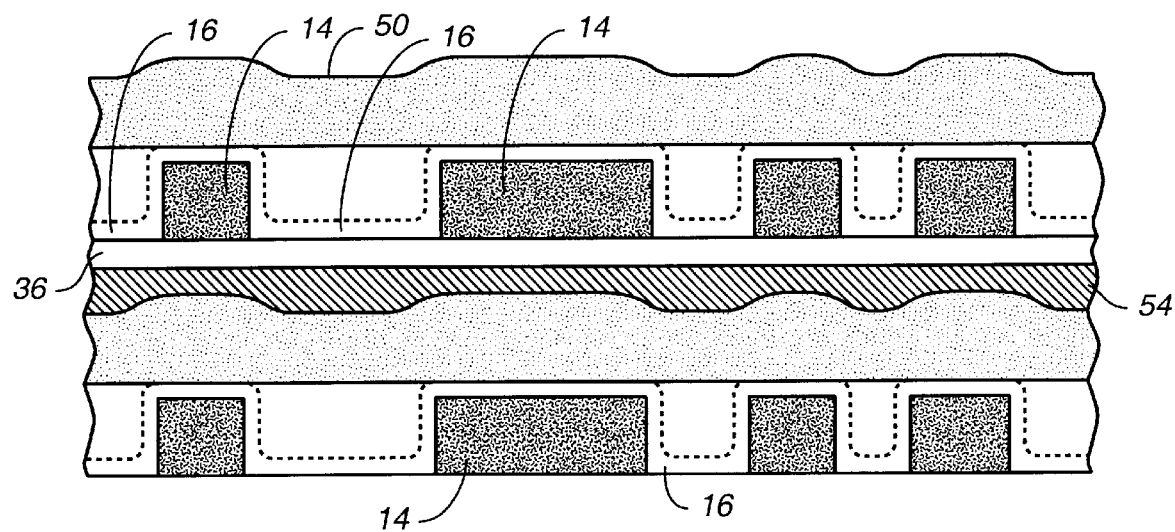
FIG._22

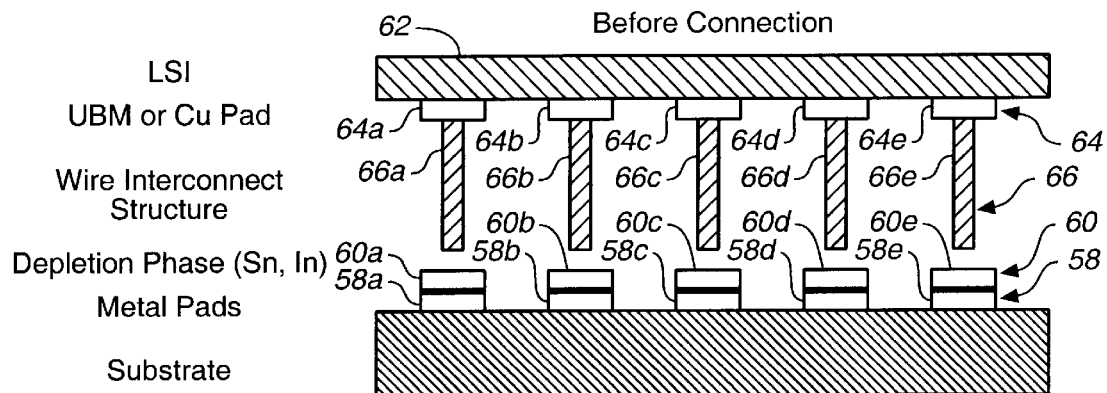
FIG._23
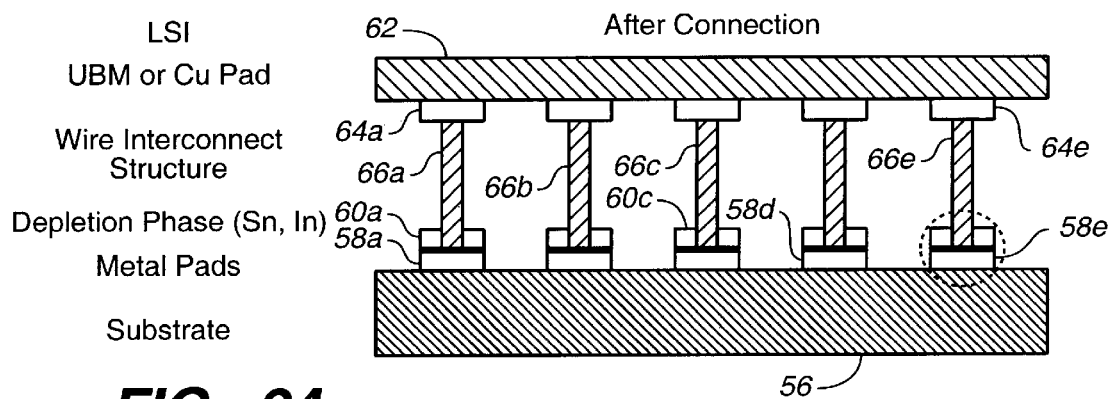
FIG._24
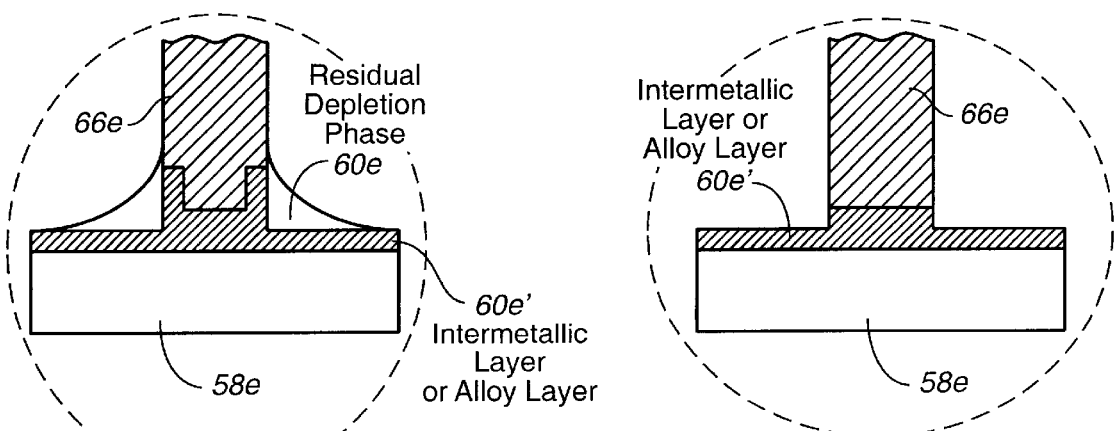
FIG._25          FIG._26

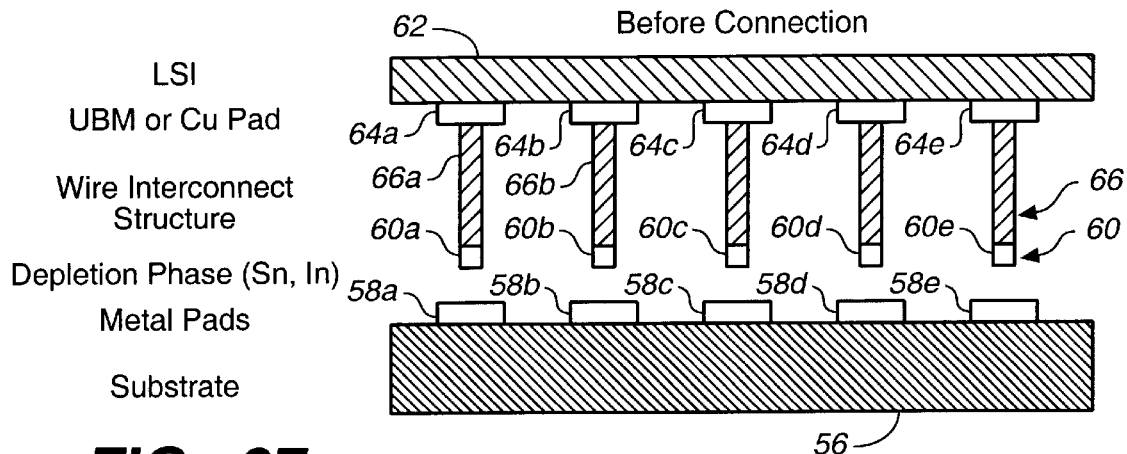
FIG._27
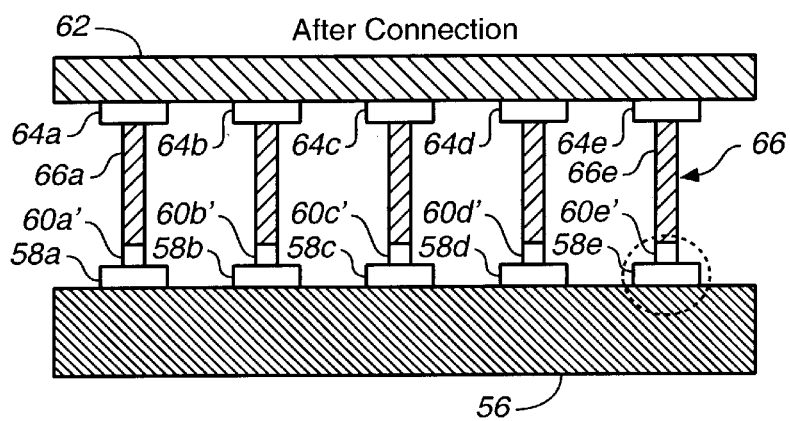
FIG._28
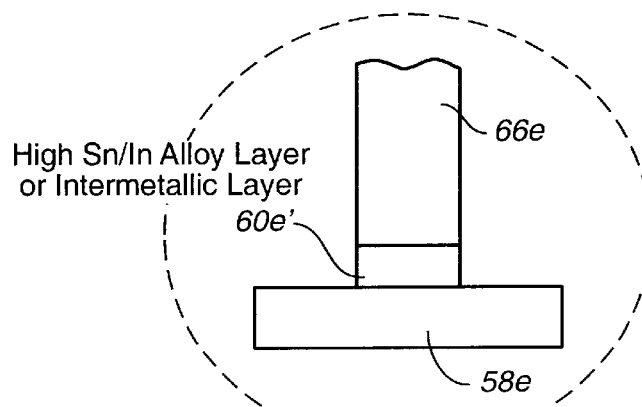
FIG._29

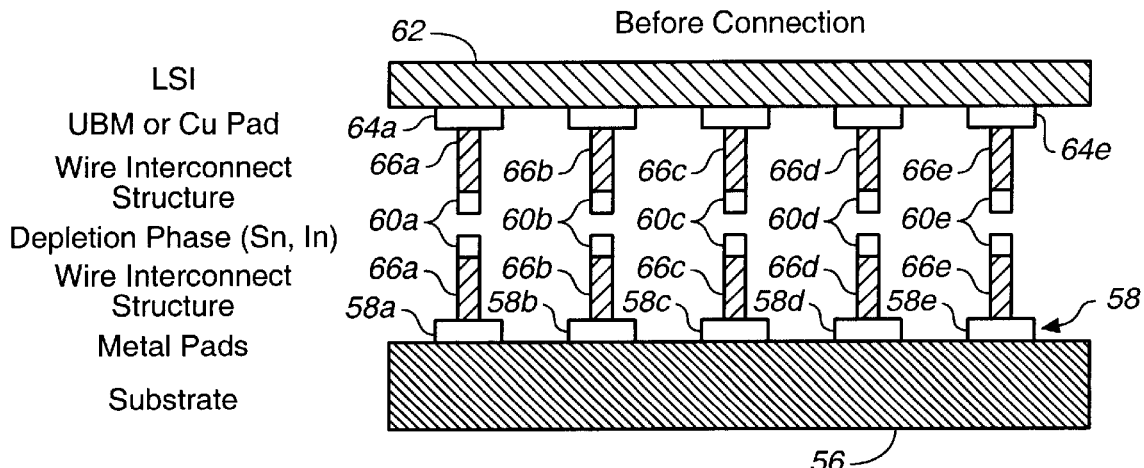
FIG._30
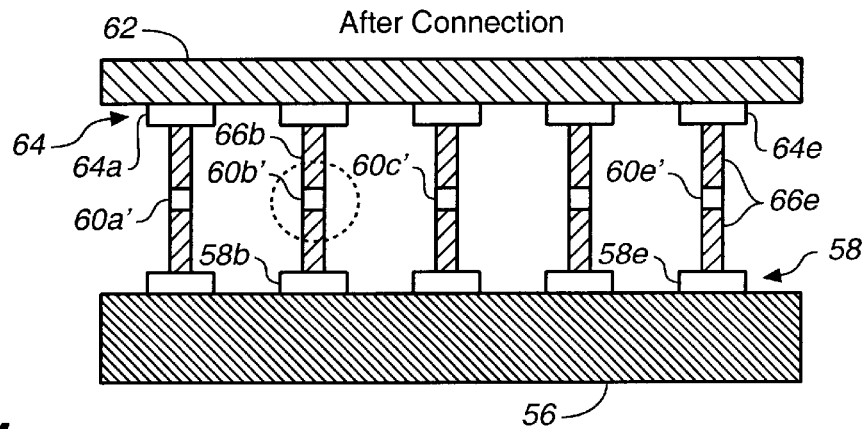
FIG._31
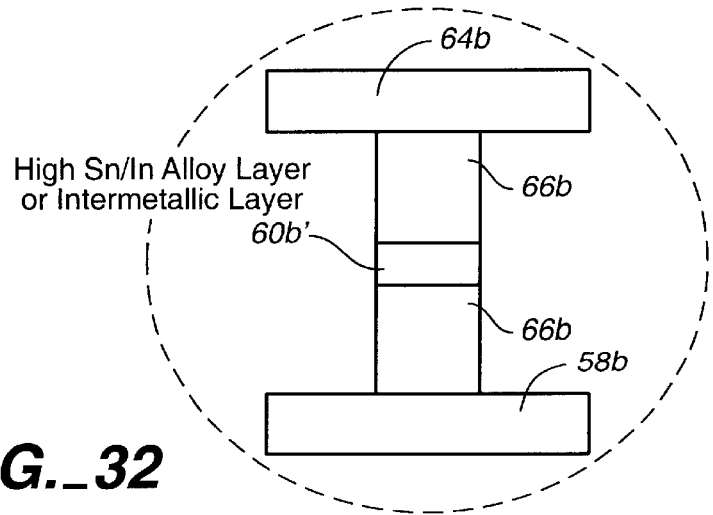
FIG._32

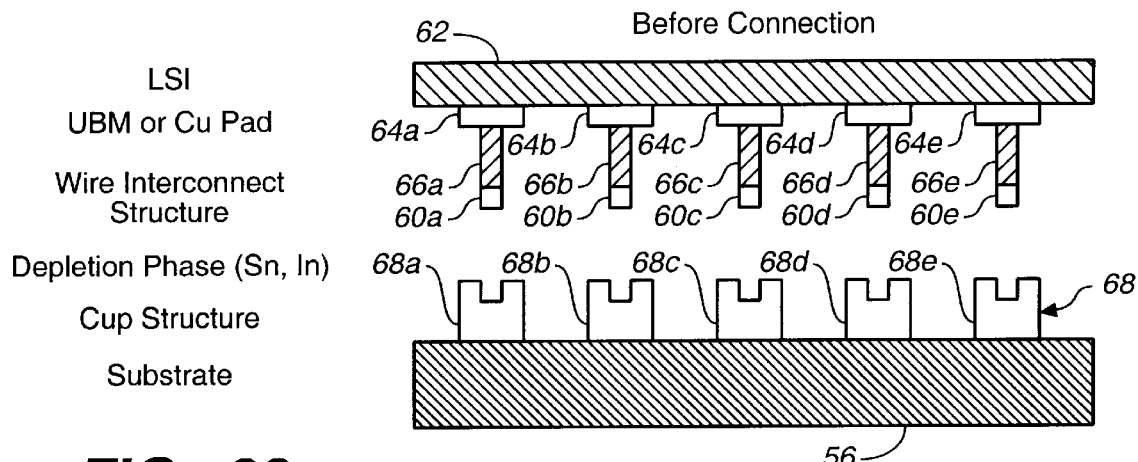
FIG._33
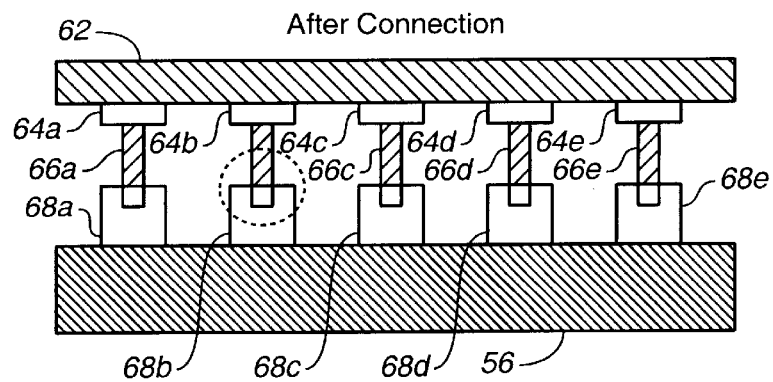
FIG._34
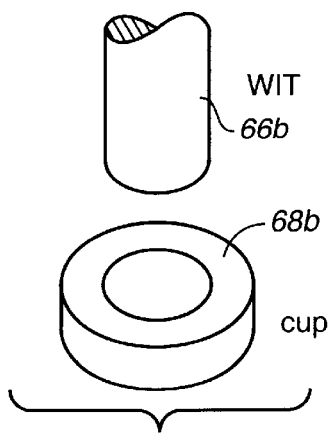
FIG._35
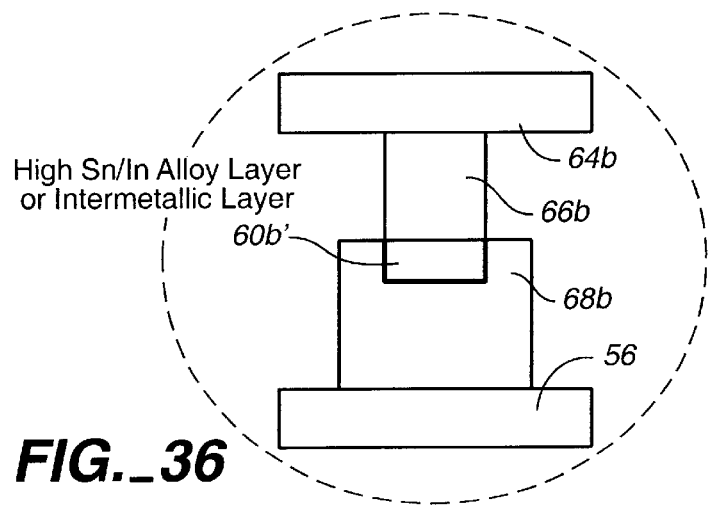
FIG._36

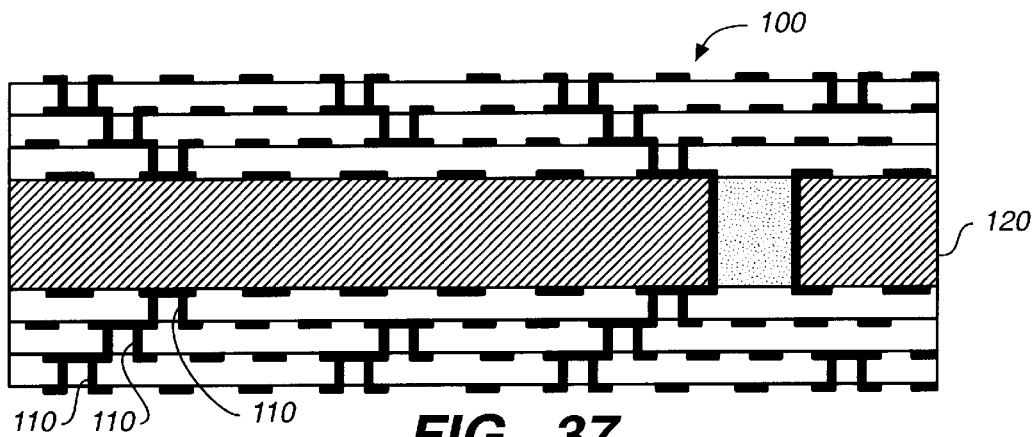
FIG._37
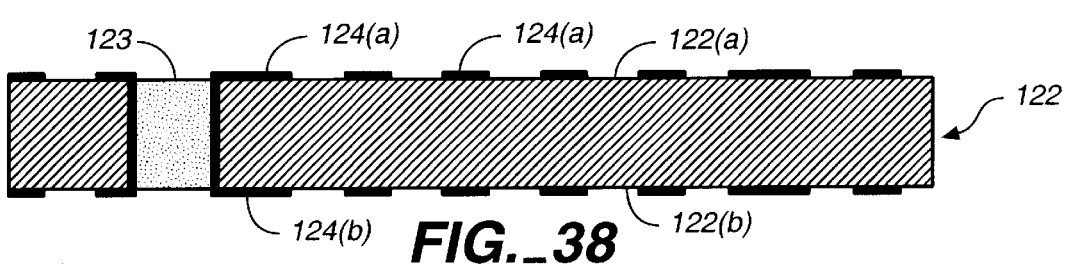
FIG._38
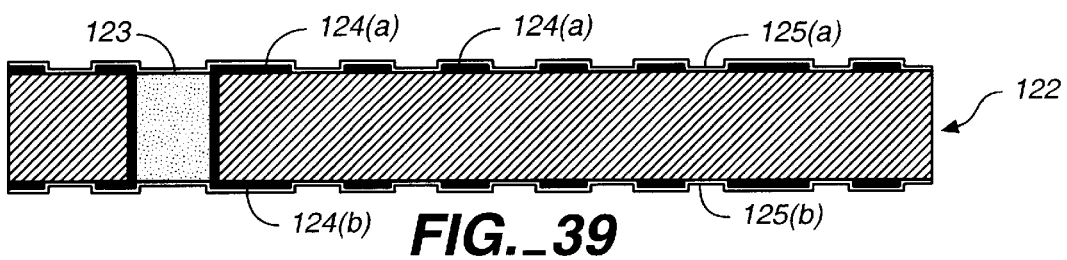
FIG._39
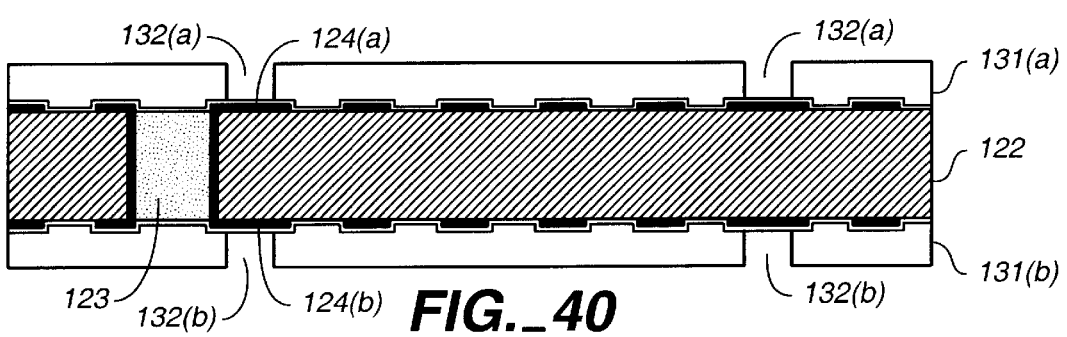
FIG._40
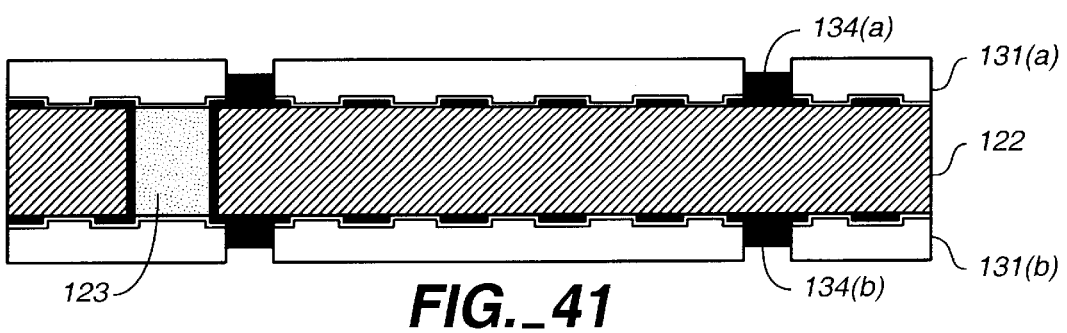
FIG._41

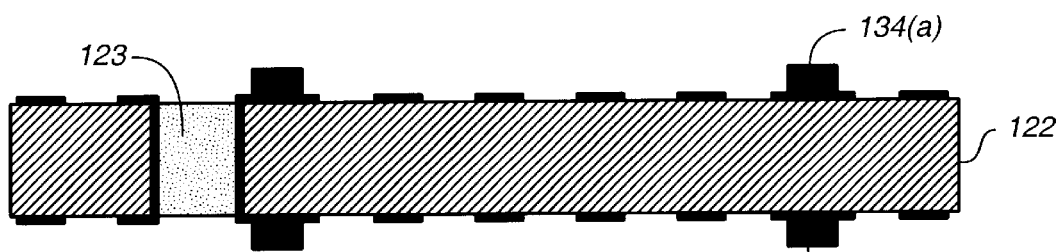
*FIG._42*
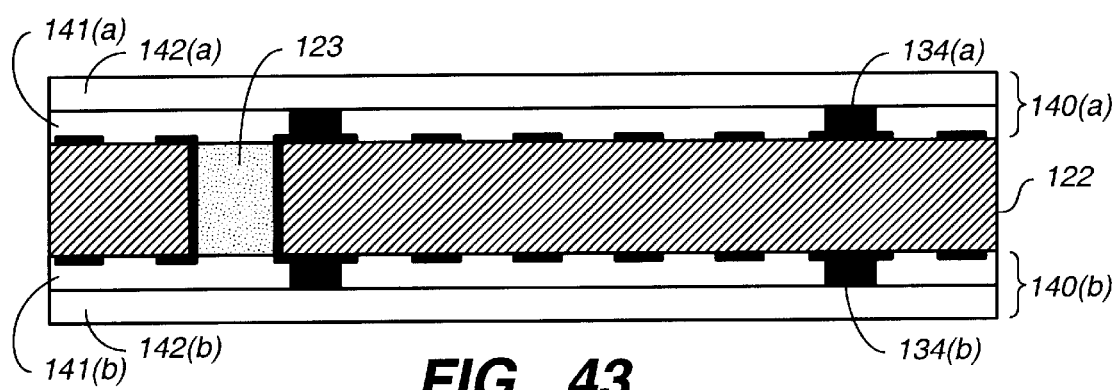
*FIG._43*
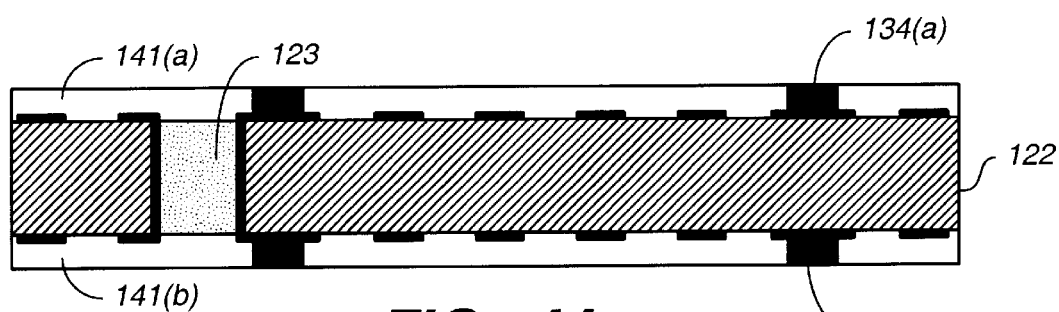
*FIG._44*
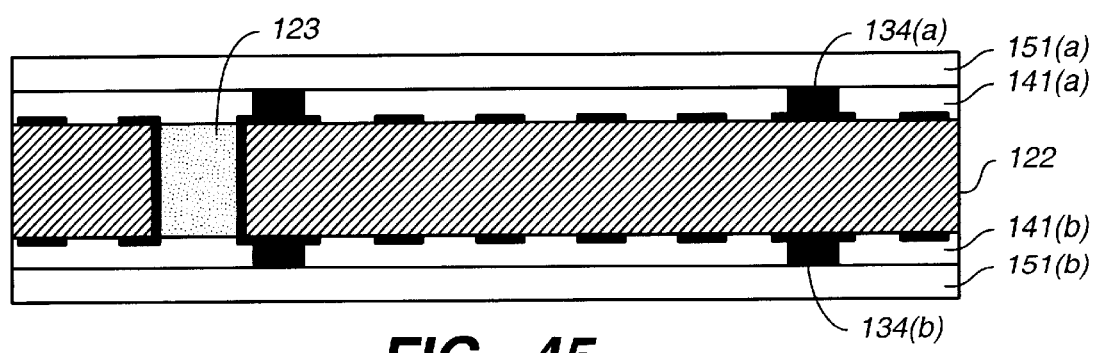
*FIG._45*

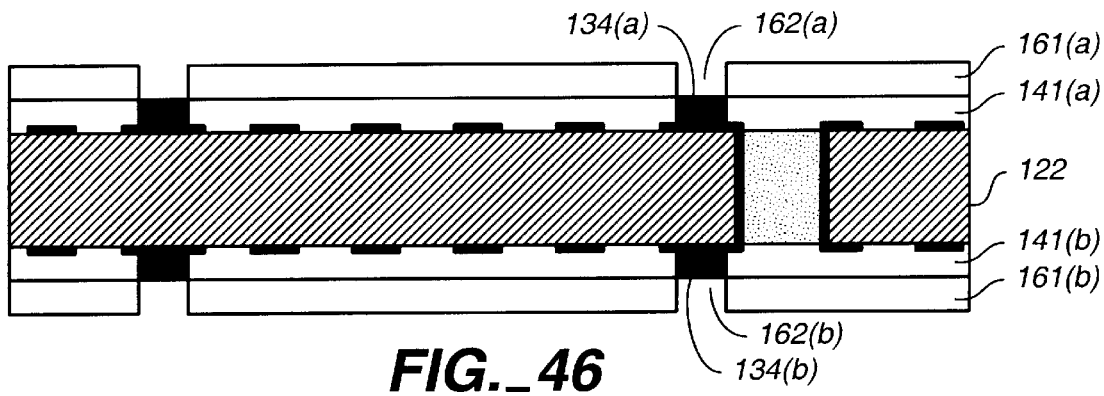
FIG._46
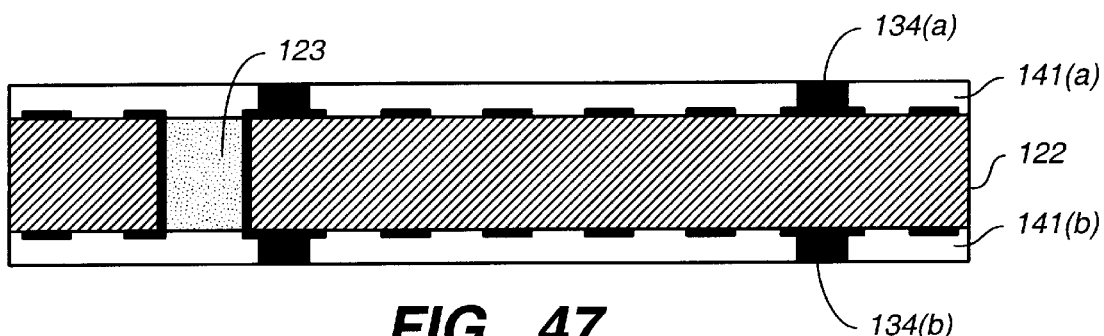
FIG._47
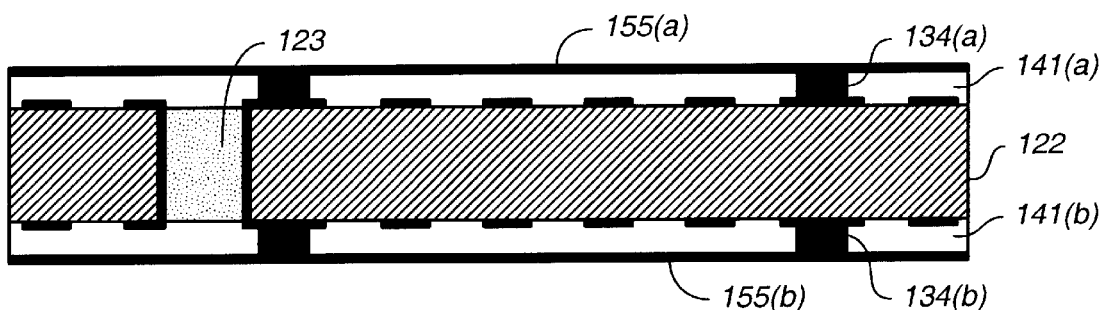
FIG._48
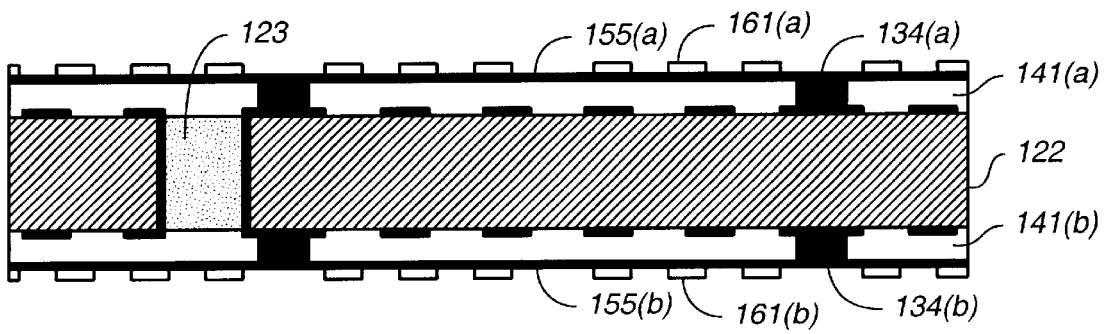
FIG._49

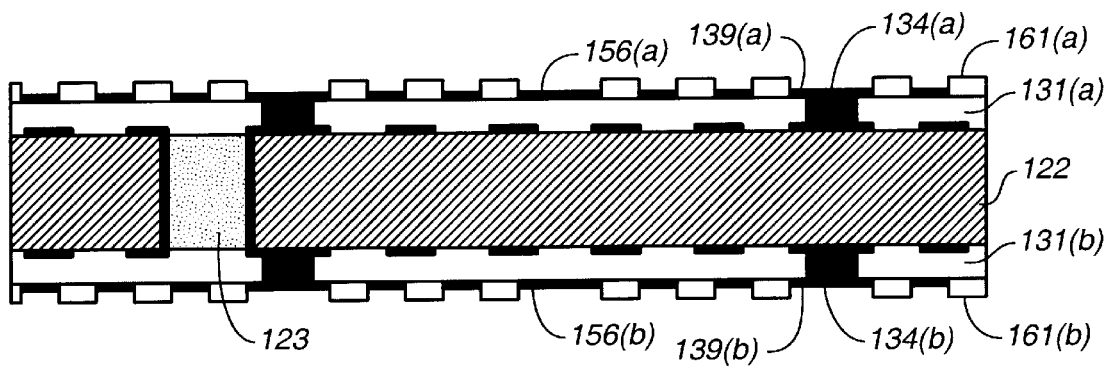
FIG._50
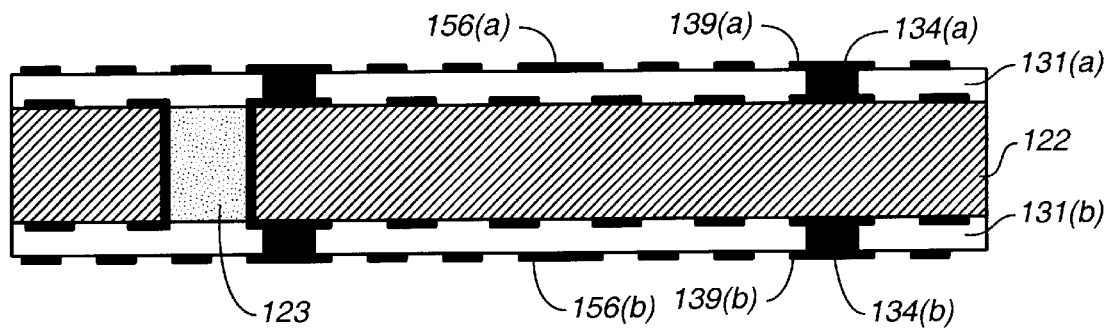
FIG._51
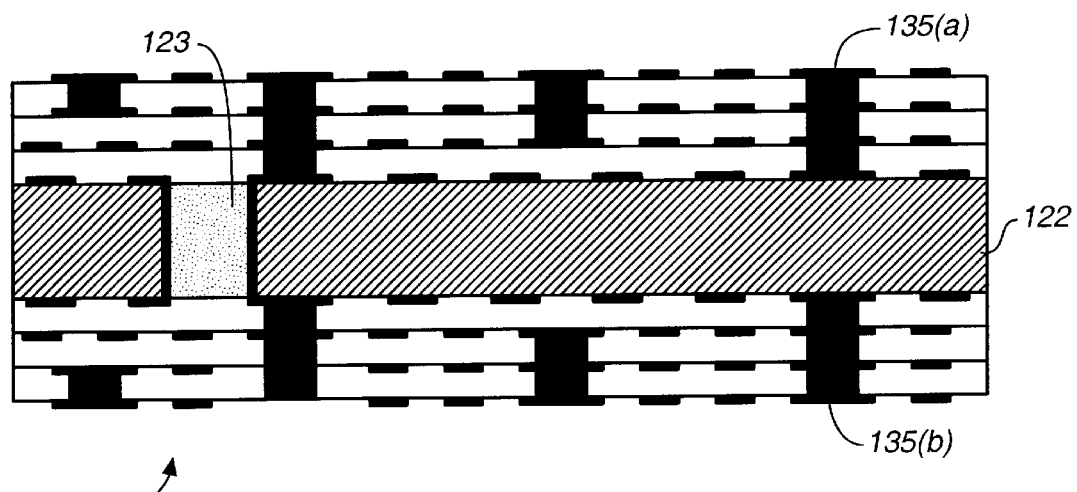
FIG._52

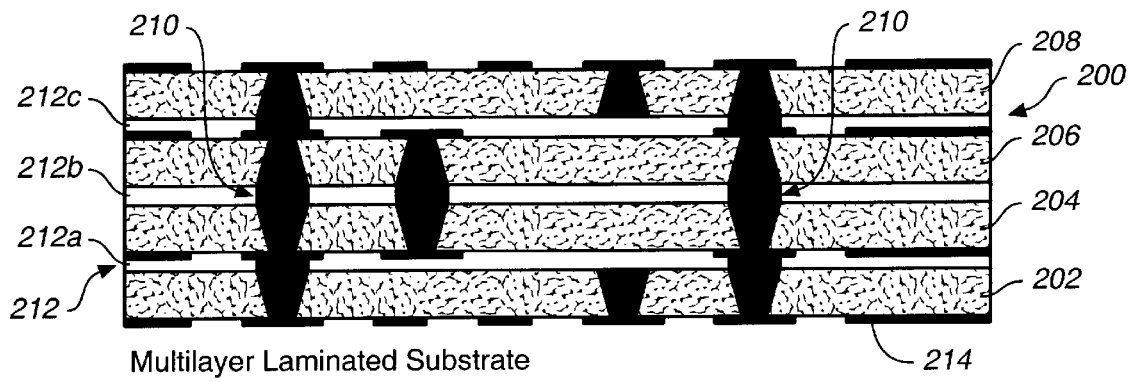
Multilayer Laminated Substrate
FIG._53
Fabrication Flow-Substractive
Start from single side laminate
FIG._54
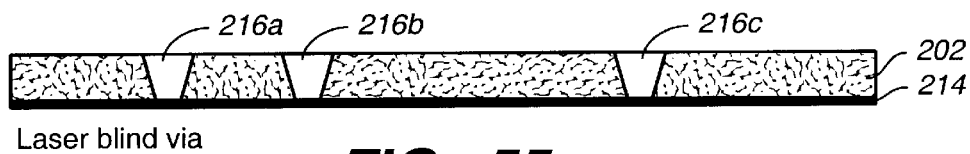
Laser blind via
FIG._55
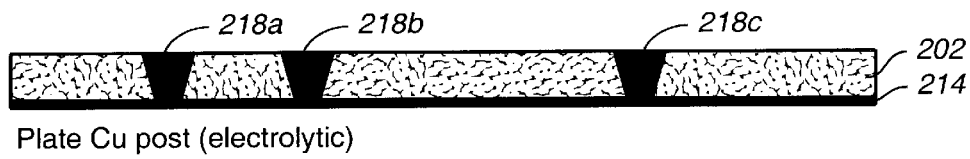
Plate Cu post (electrolytic)
FIG._56
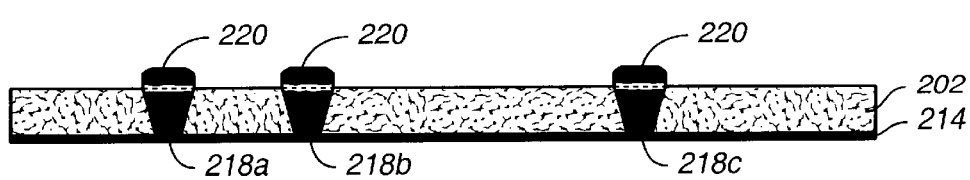
Plate solder sandwich
FIG._57A

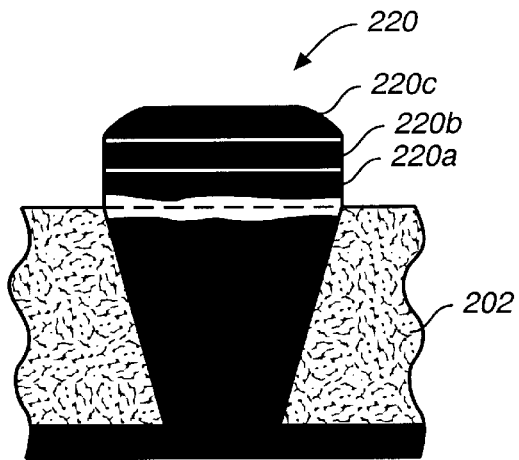
FIG._57B
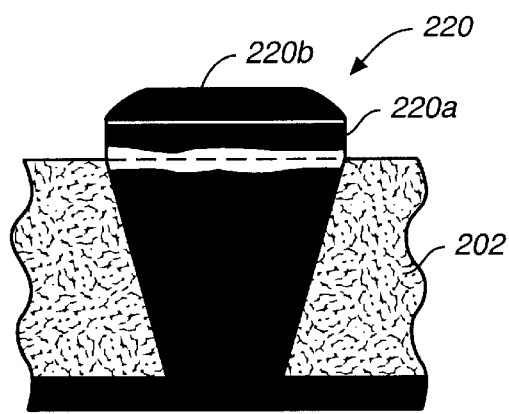
FIG._57C
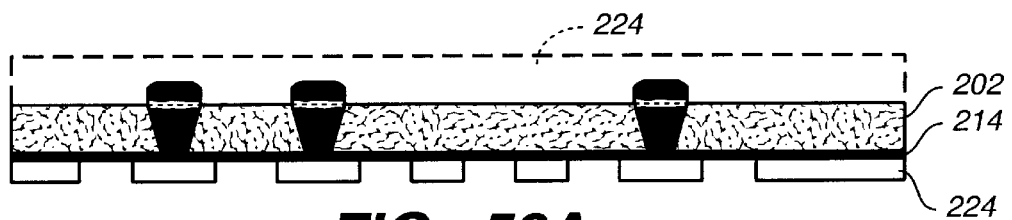
FIG._58A
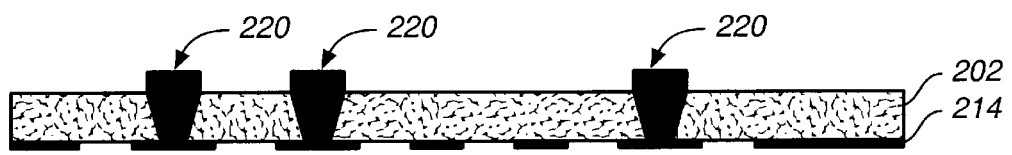
FIG._59A

Option B:
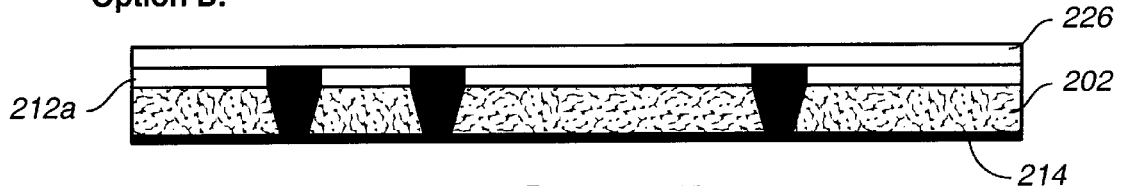
FIG._58B
FIG._59B
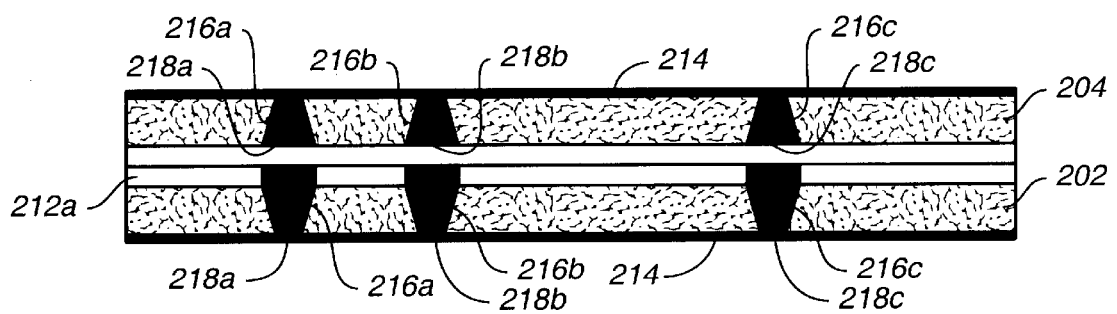
FIG._60B
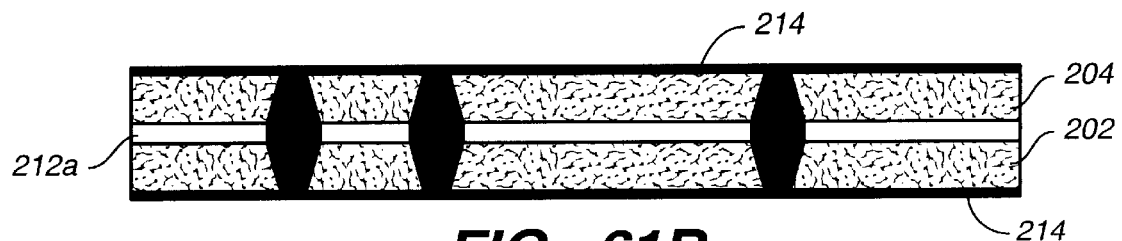
FIG._61B

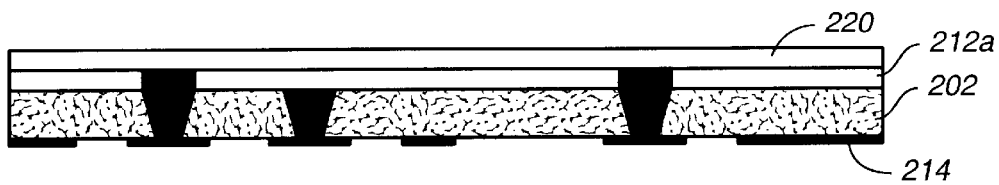
FIG._60A
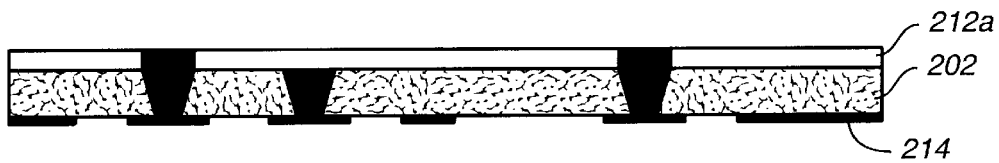
FIG._61A
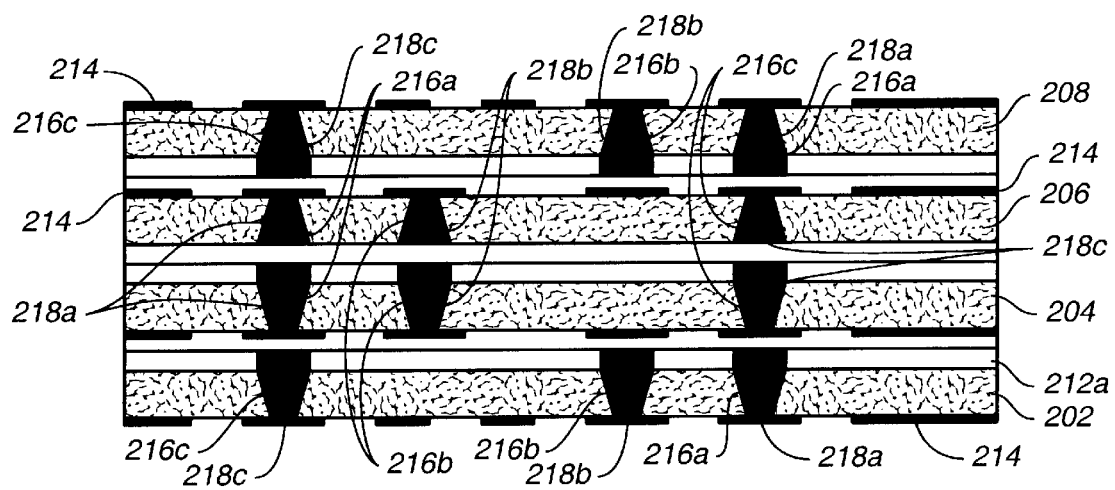
FIG._62A
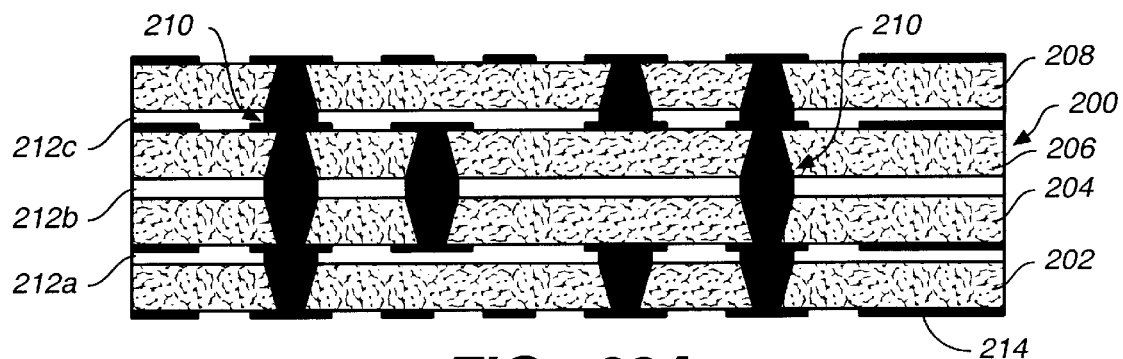
FIG._63A

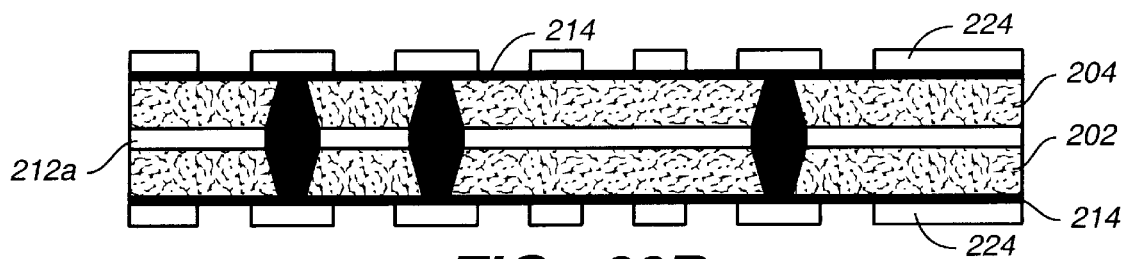
FIG._62B
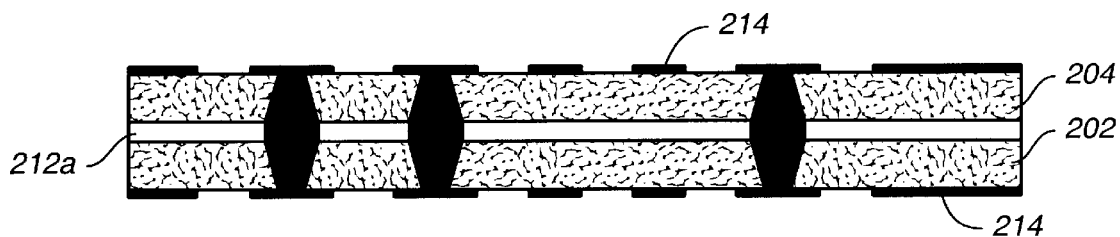
FIG._63B
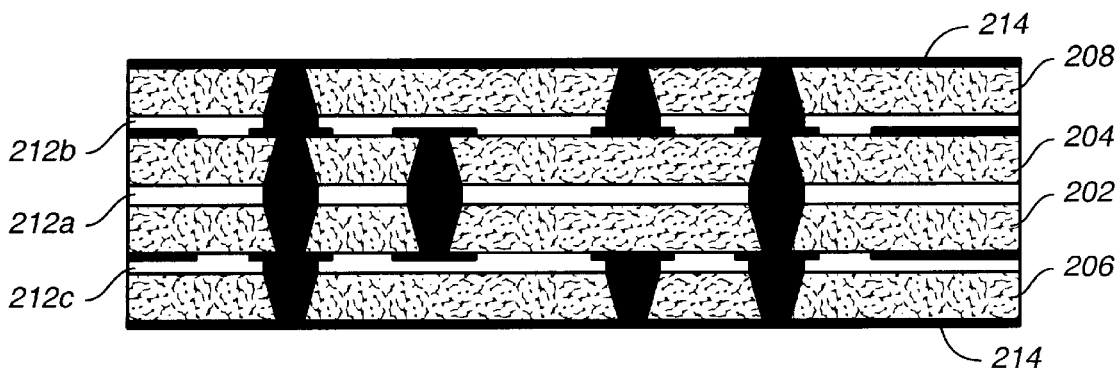
FIG._64B
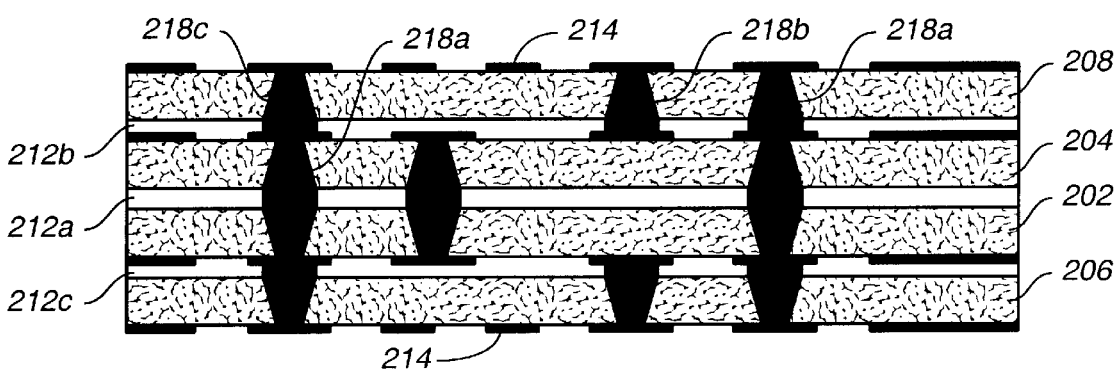
FIG._65B

Fabrication method Proposed in this invention
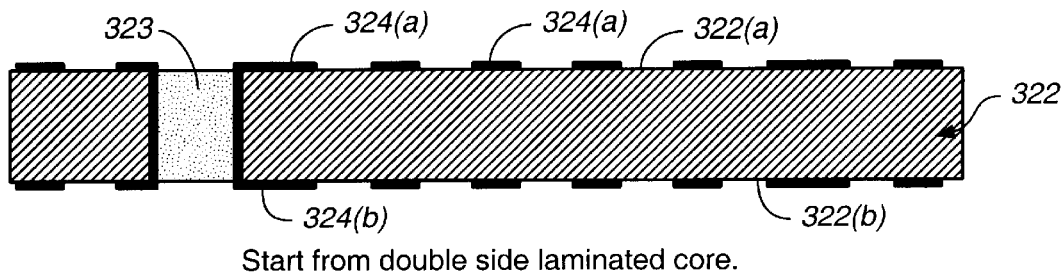
Start from double side laminated core.
FIG._66
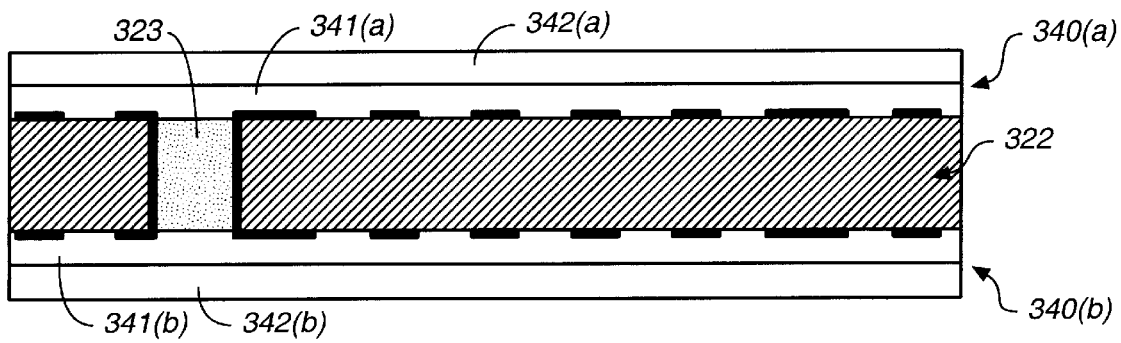
Tack dielectric sheet with its carrier film on top.
FIG._67
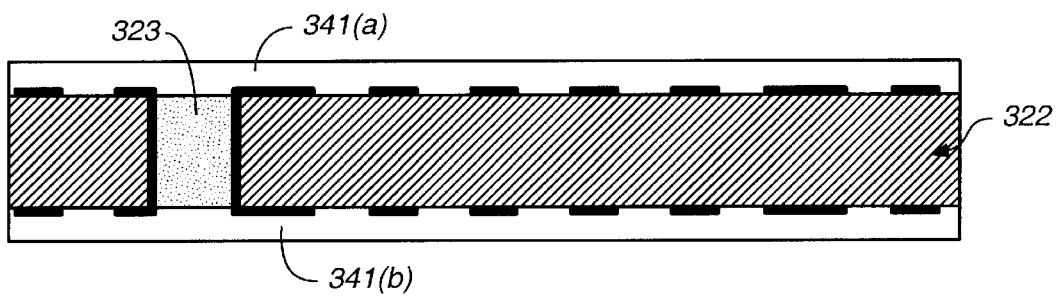
Remove carrier film, bake to cure dielectric sheet.
FIG._68

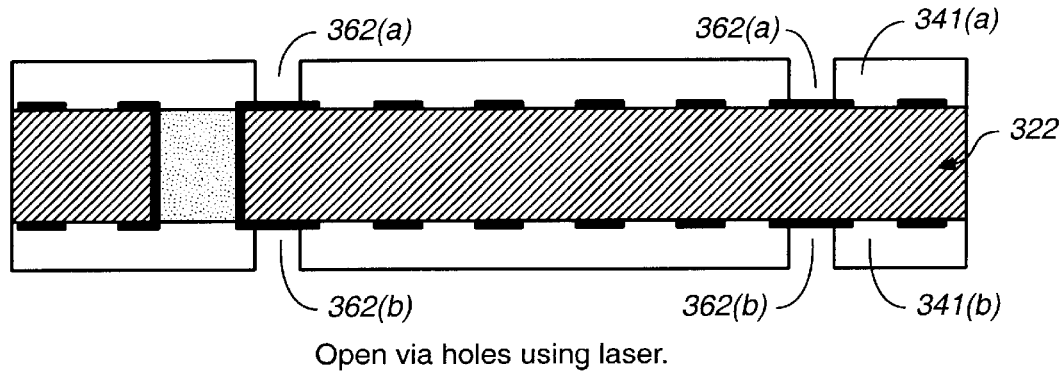
Open via holes using laser.
FIG._69
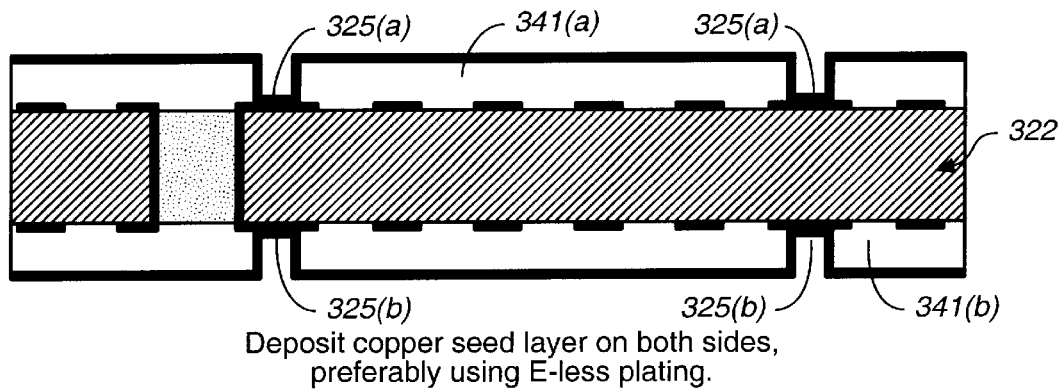
Deposit copper seed layer on both sides, preferably using E-less plating.
FIG._70
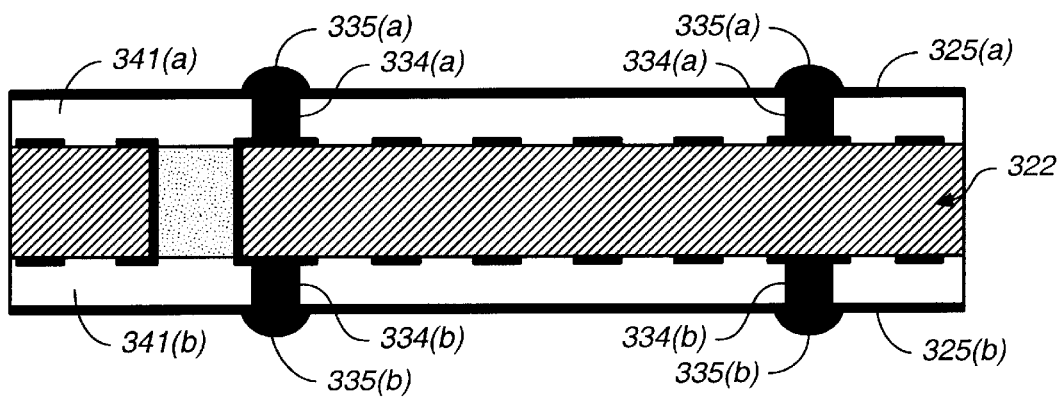
Electrolytic plate to fill the vias.
Usually "mushrooms" of a few micrometers in height are formed.
Note that the top surface is not plated.
FIG._71

Plated via thickness can be higher than the dielectric thickness and form "mushrooms", or lower than the dielectric thickness. In practice, two states might co-exist due to non-uniform plating. Since buffing will remove upper part of dielectric material and planarize the vias, all three scenarios are acceptable.

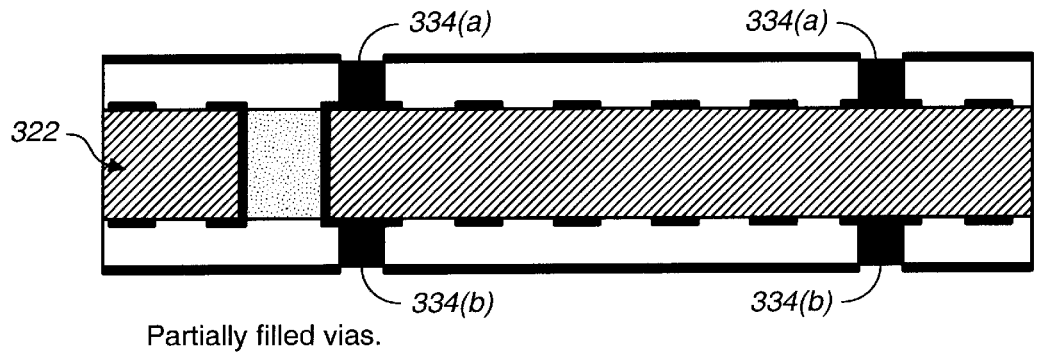

Partially filled vias.

FIG._72

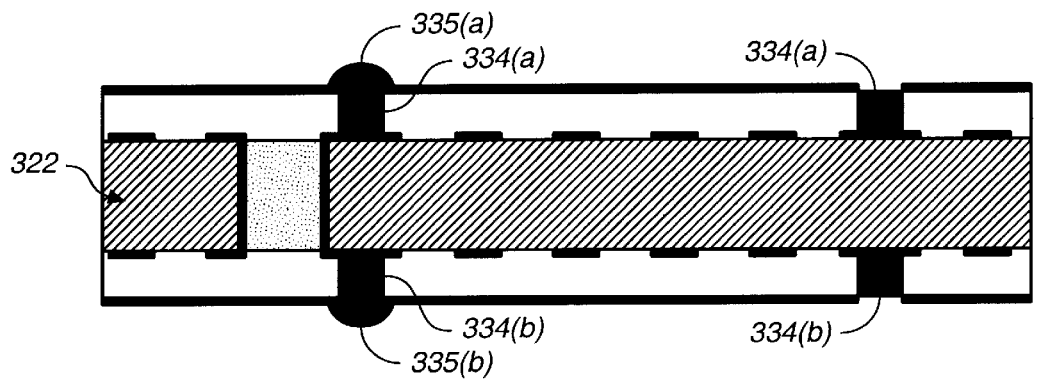

Co-existence of over filled vias (mushrooms) and partially filled vias.

FIG._73

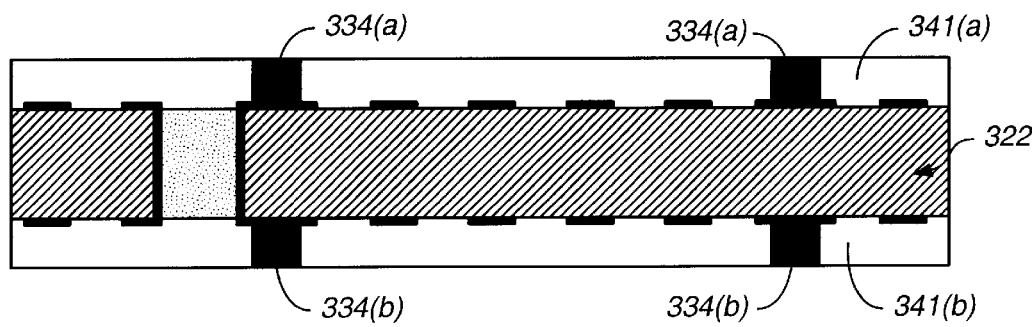

Planarize the top surface using buffing machine.
The copper seed on top surface is also removed.

FIG._74

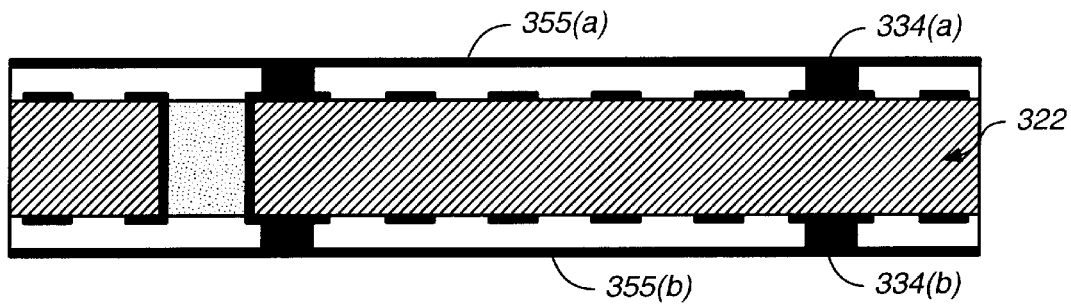
Deposit copper seed layer, preferably using E-less plating.
FIG._75
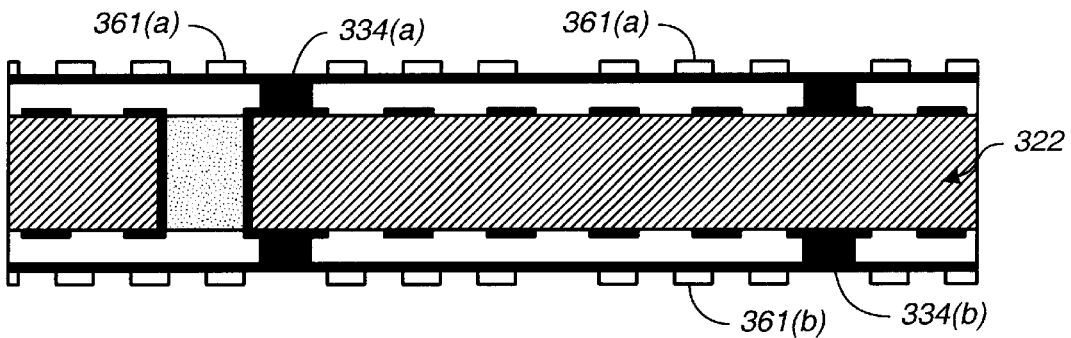
Coat/laminate photoresist and open trace and pad.
FIG._76
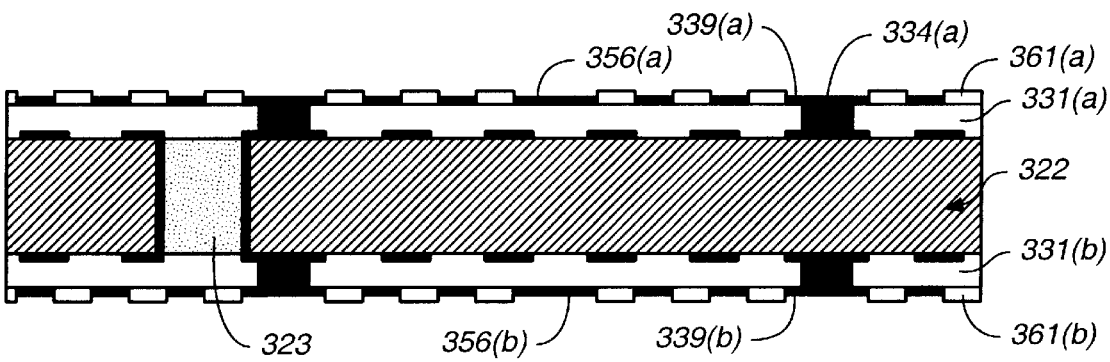
Electrolytic plate Cu trace and pad.
FIG._77

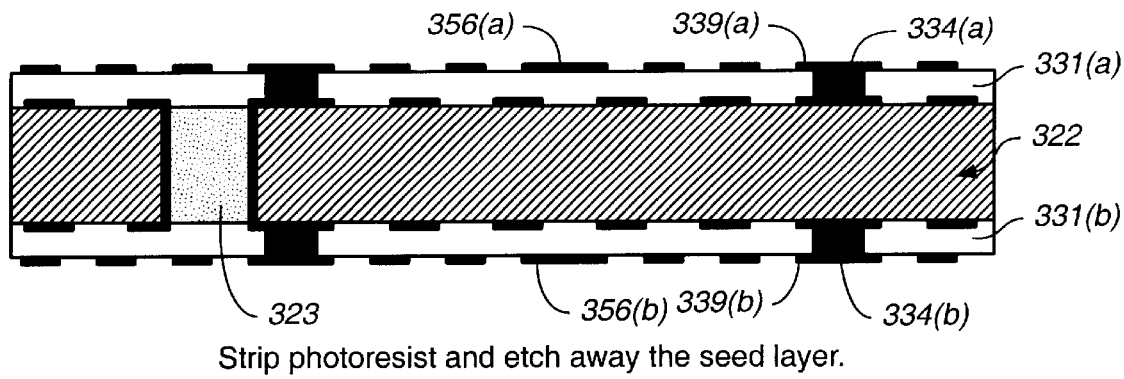
Strip photoresist and etch away the seed layer.
FIG._78
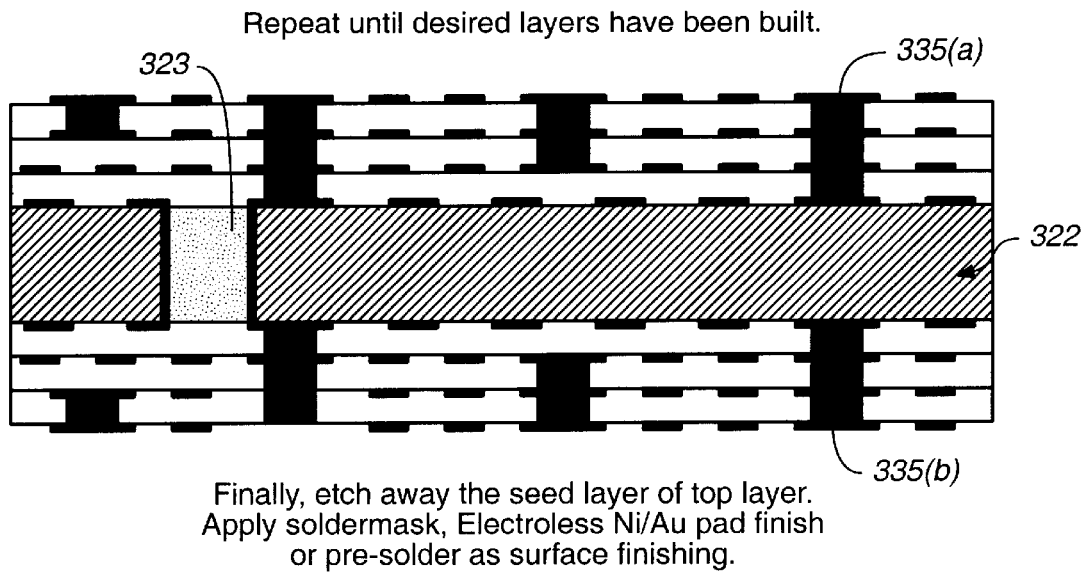
Finally, etch away the seed layer of top layer.
Apply soldermask, Electroless Ni/Au pad finish
or pre-solder as surface finishing.
FIG._79

Drilled/lased laminate board with copper surface layers.
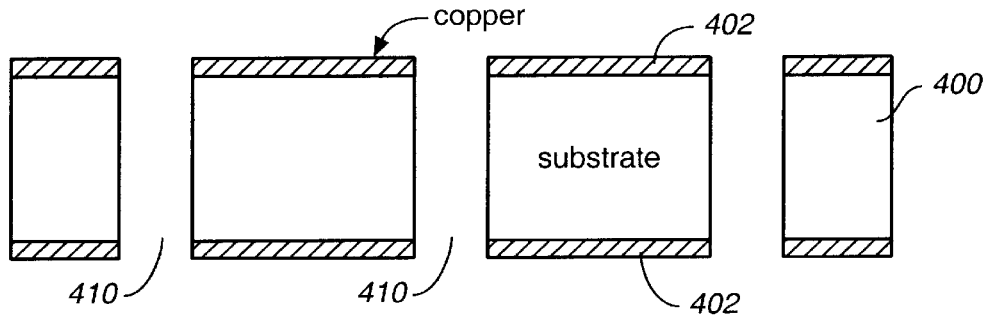
FIG._80
Plating in through holes
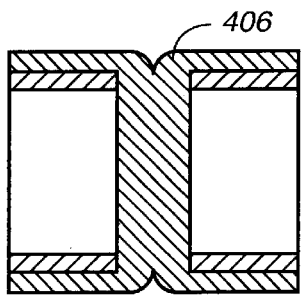
FIG._81A
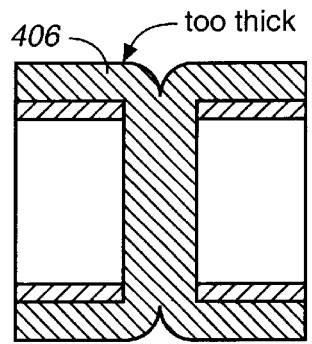
FIG._81B
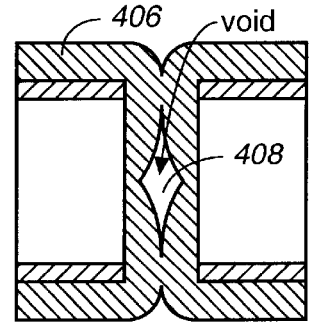
FIG._81C
Substrate in contact with solid coating material.
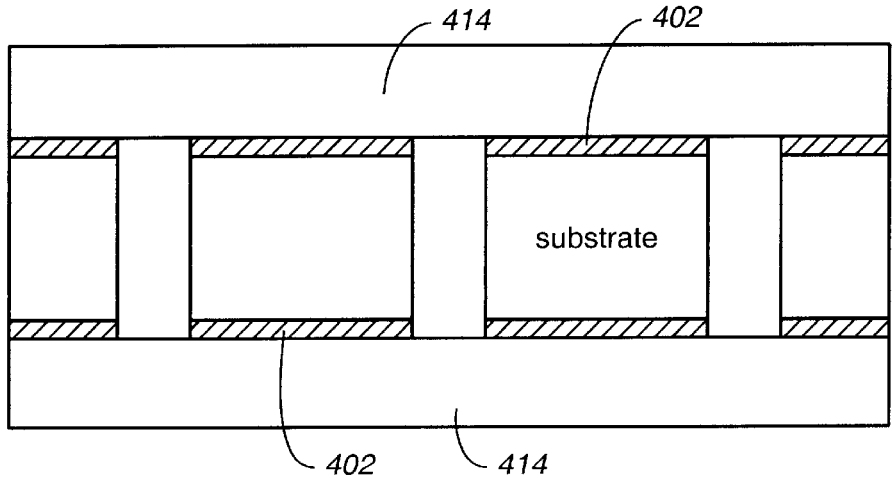
FIG._82

Thin layer of coating material on substrate surface.
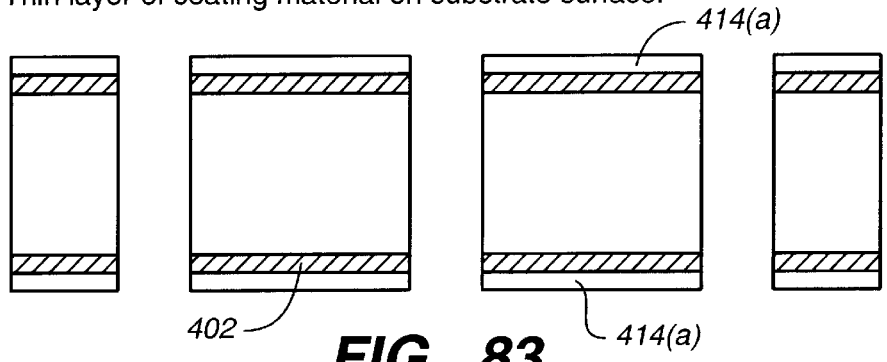
FIG._83
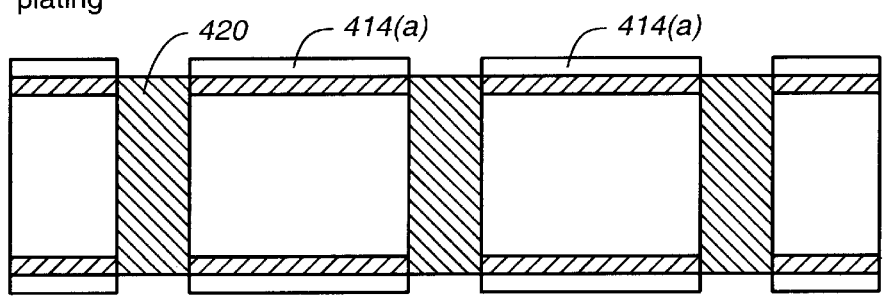
FIG._84
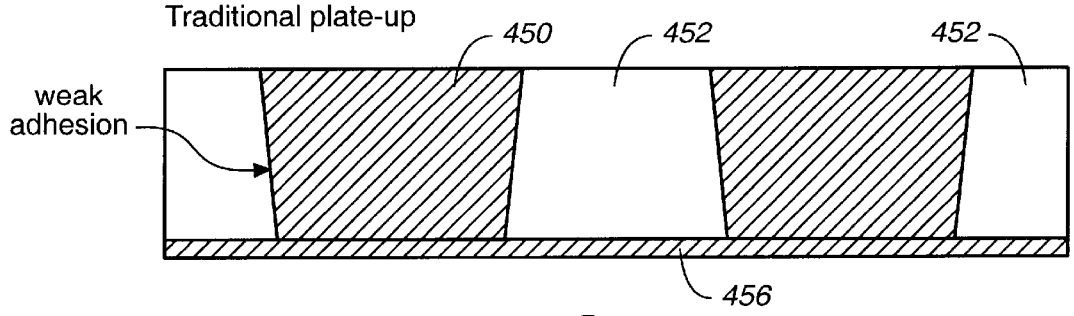
FIG._85
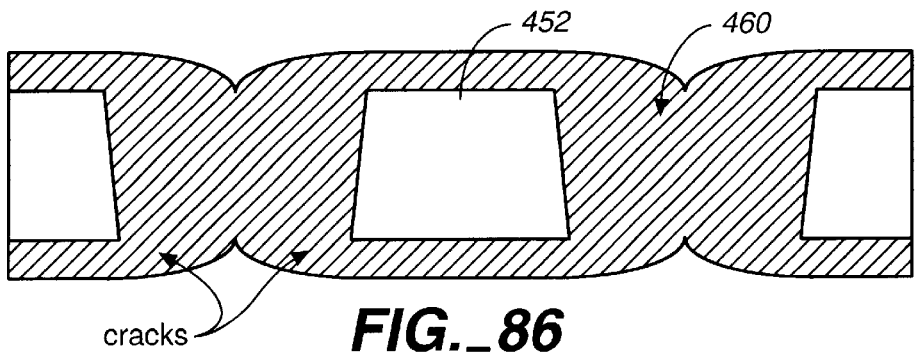
FIG._86

Step 1: plate-up
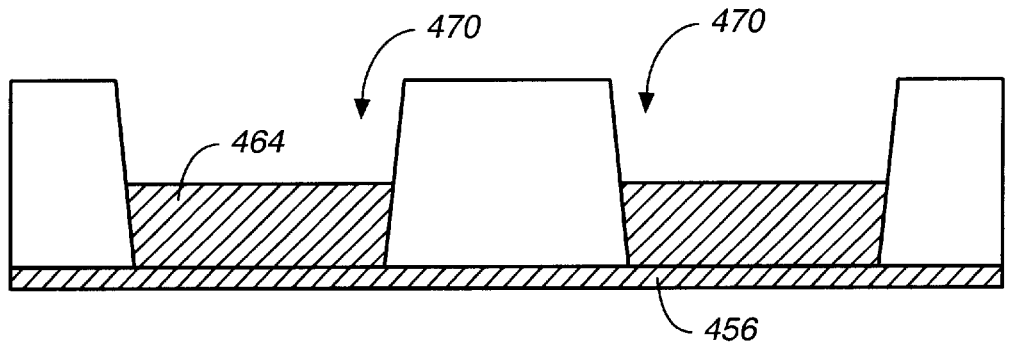
FIG._87
Step 2: Conformal plating (i.e., plate-in)
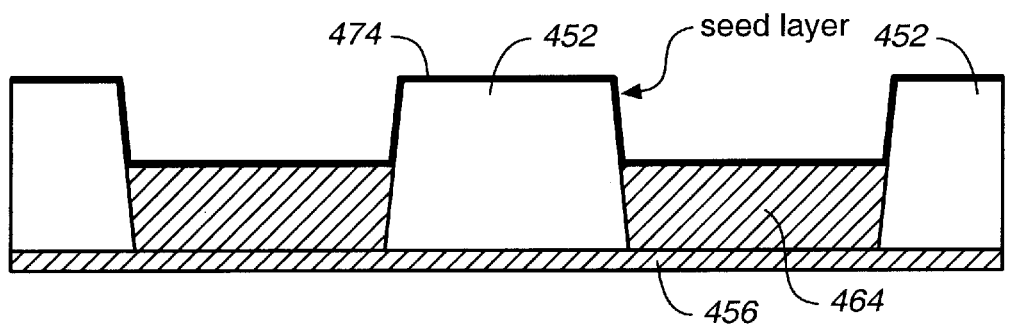
FIG._88
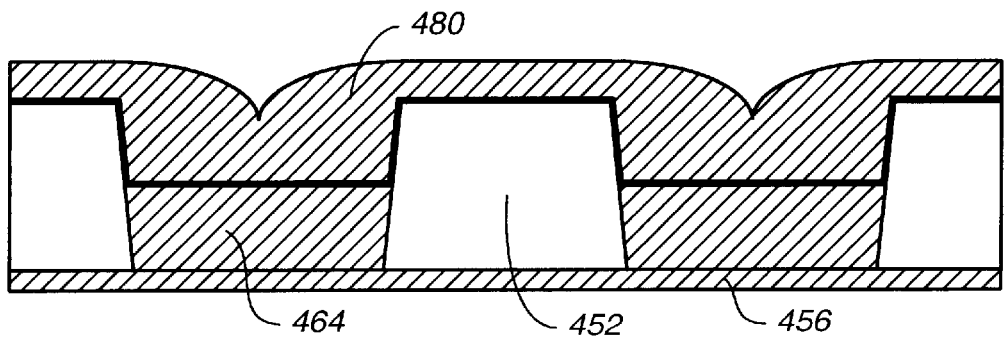
FIG._89

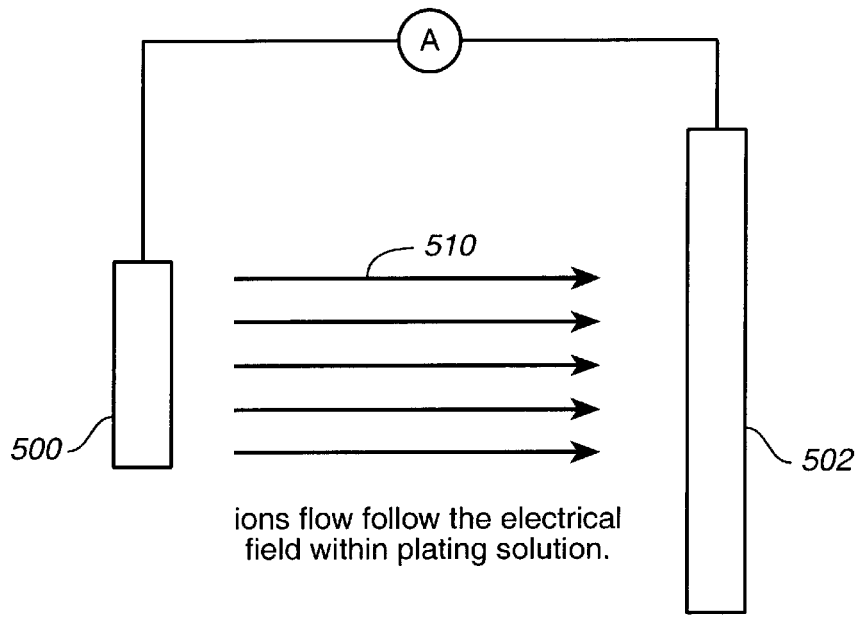
An illustration of a typical plating set-up.
FIG._90
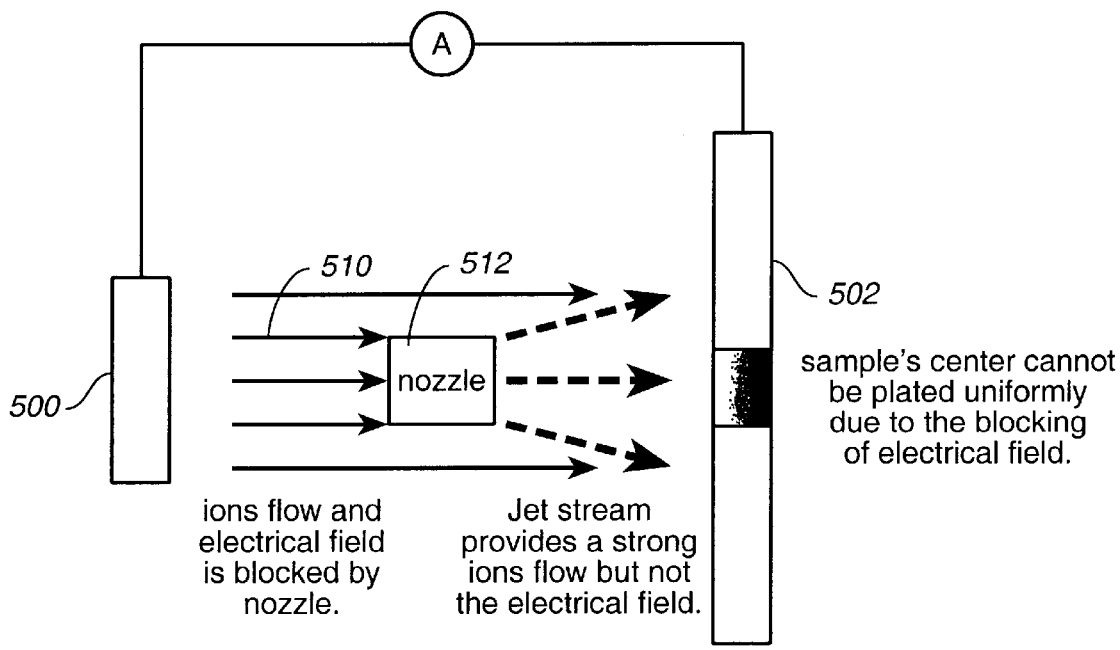
An illustration of center-positioned nozzle head in Jet Impingement Plating.
The nozzle head block the electrical field and create
a plating non-uniform region at the center of the sample.
FIG._91

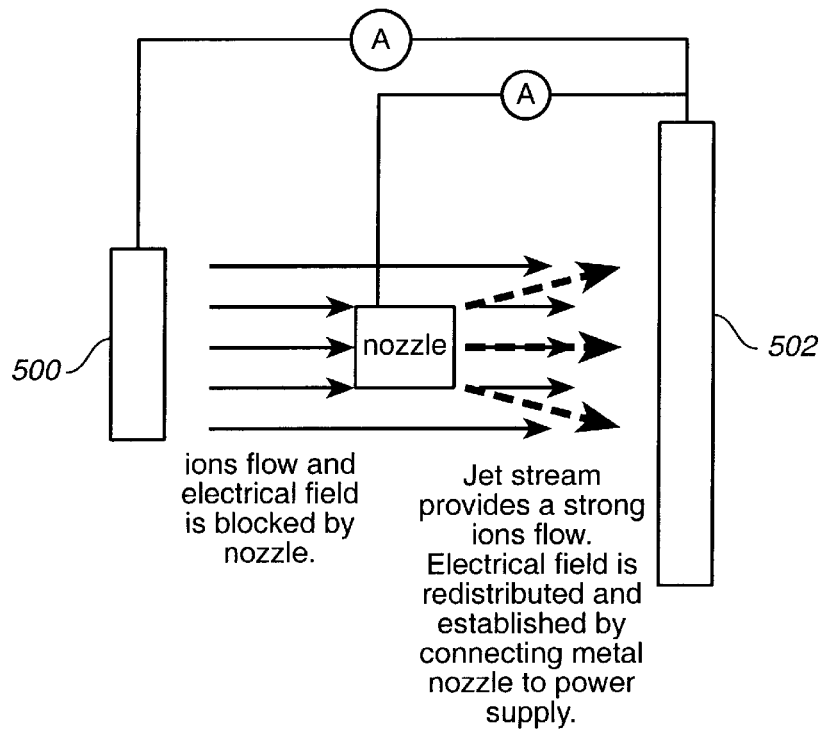
An illustration of the modified center-positioned nozzle head. The electrical field is redistributed and re-established by connecting metal nozzle head to a small power supply.
FIG._92
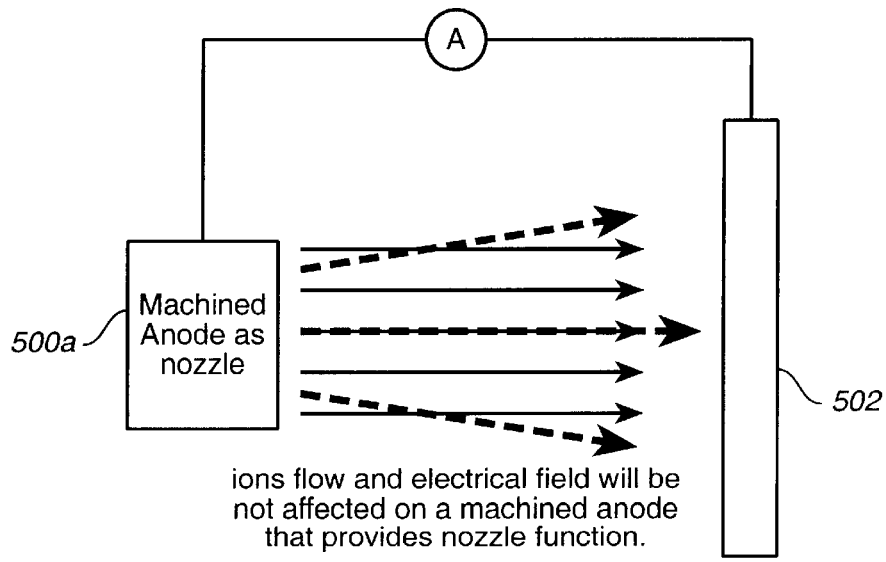
An illustration of the function of machined anode-nozzle. By combining the anode with nozzle, the electrical field will not be effected by the blockage.
FIG._93

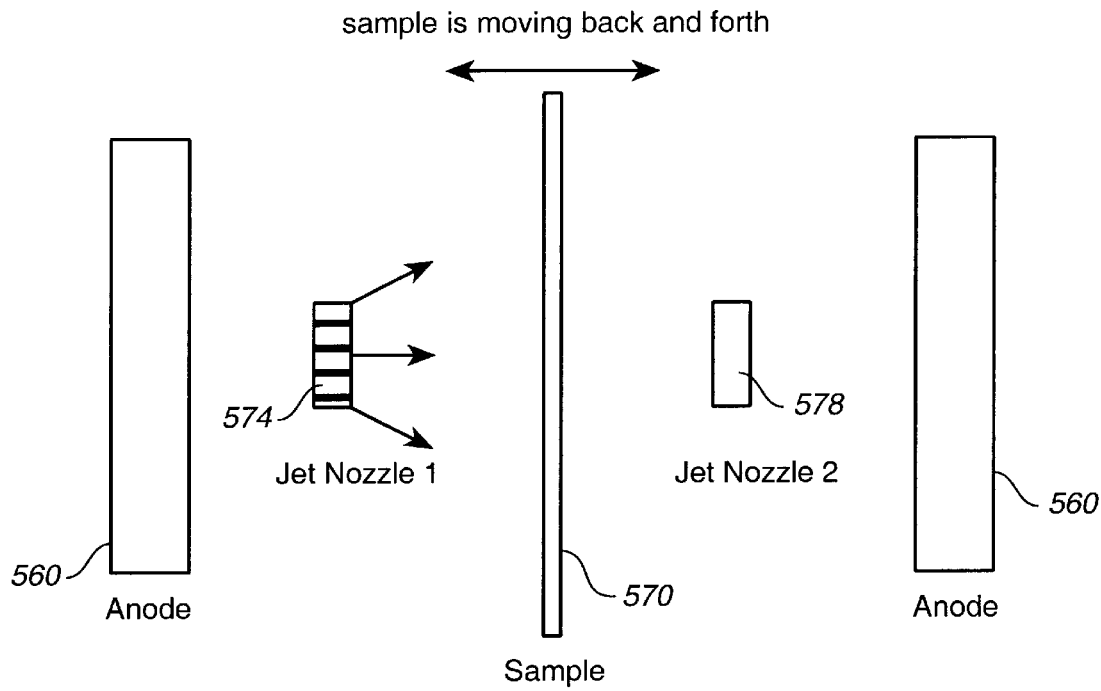
FIG._94
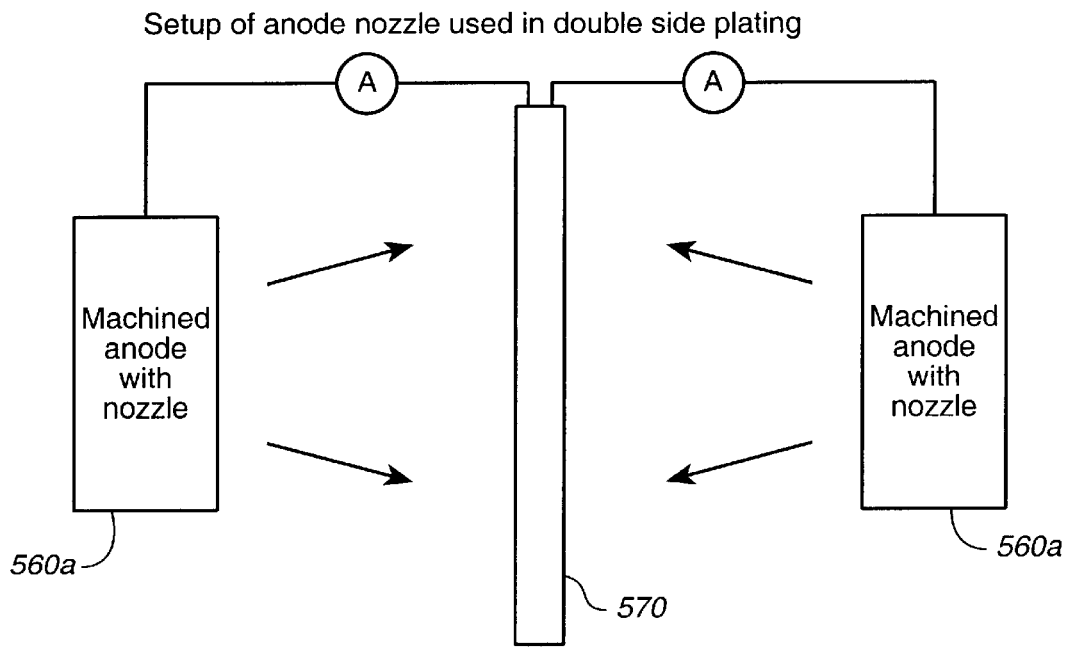
FIG._95

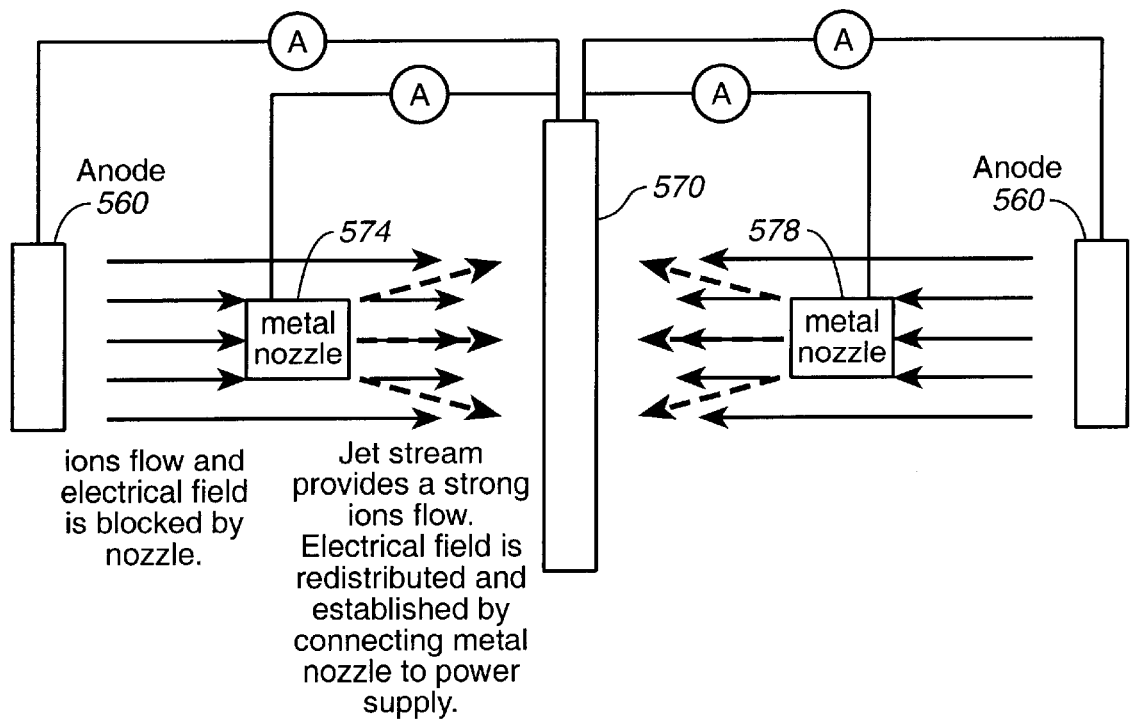
An illustration of the modified center-positioned nozzle head used in double side plating. The electrical field is redistributed and re-established by connecting metal nozzle head to a small power supply.
FIG._96

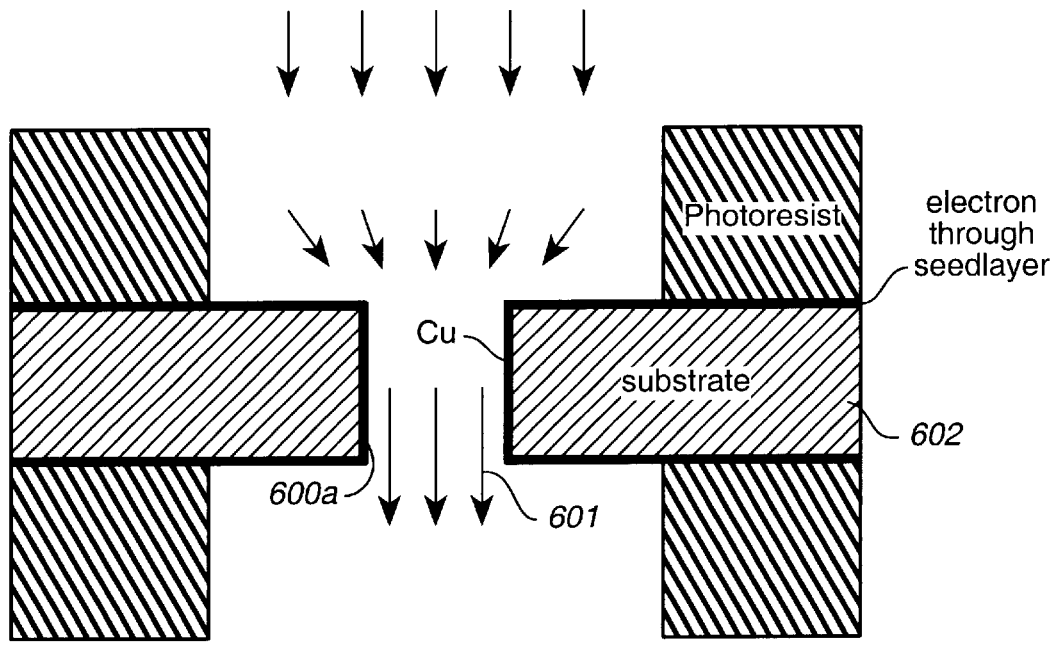
FIG._97
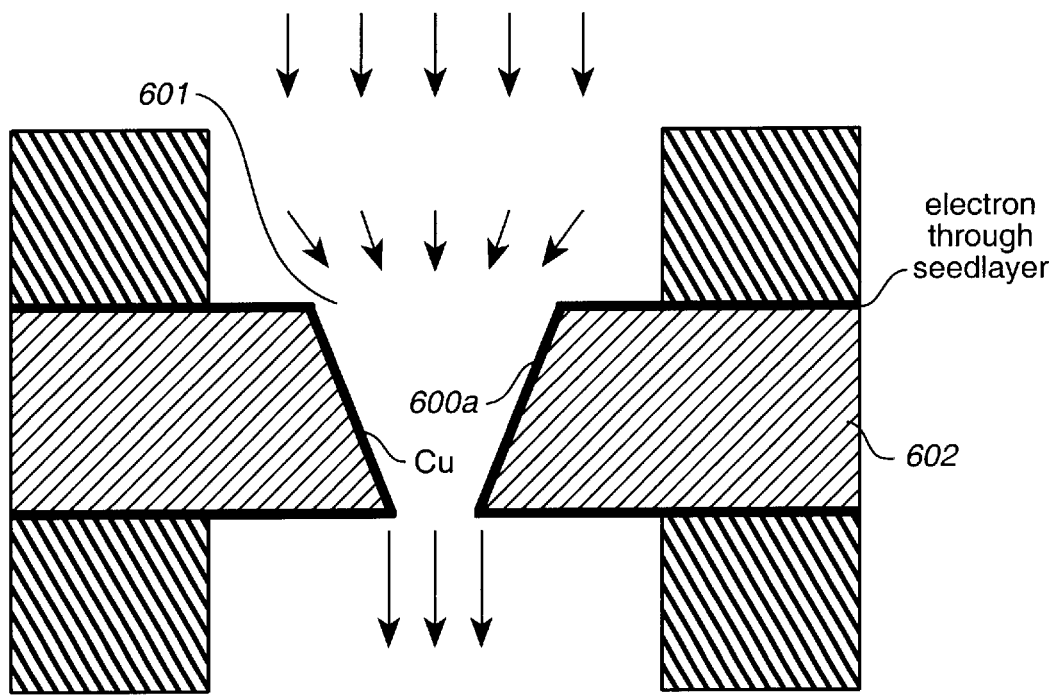
Forced convection of plating solution inside fine through-hole can be achieved by Jet Impingment Plating.
FIG._98

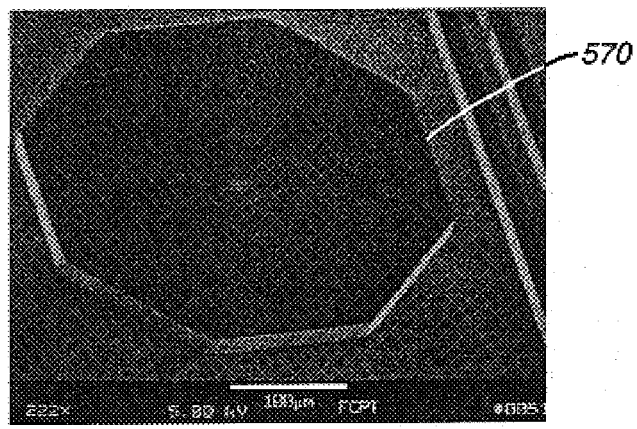
FIG._99
An angled surface SEM picture of a sample plated with JIP with 400 μm pad diameter.
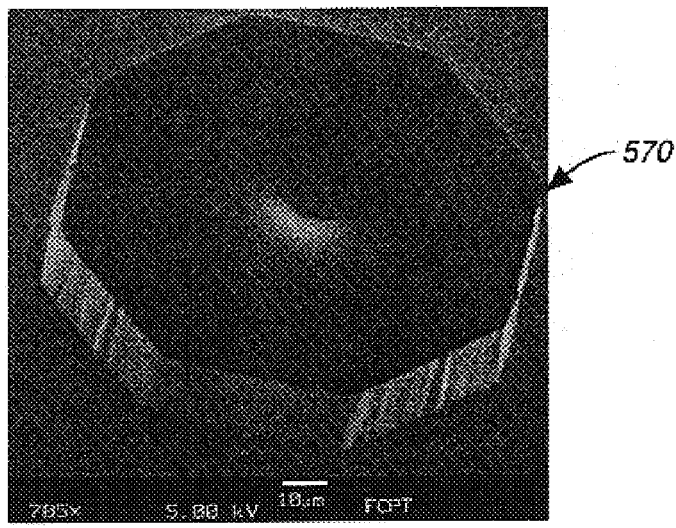
FIG._100
An angled surface SEM picture shows a small dimple on 100 μm pad at the other side of the sample.
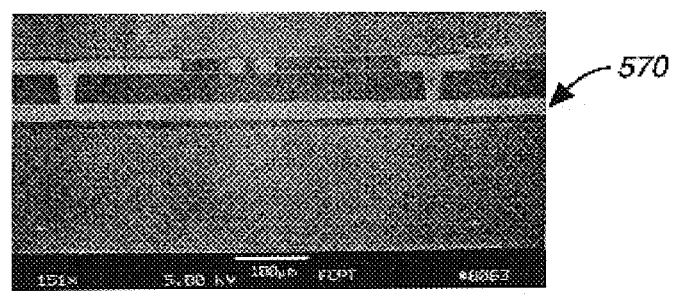
FIG._101
An cross-sectional SEM picture shows the fine line thickness and filled via holes.

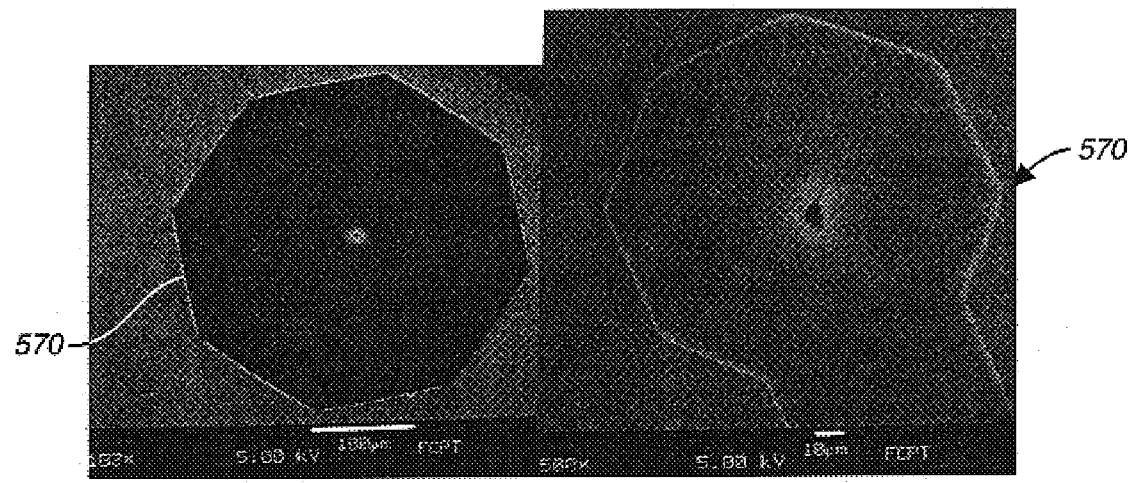
Surface of the big and small pad from a sampled plated without jet impingement.
The through hole via is not closed.
The diameter of the hole at small pad is around 8 μm.
*FIG.—102*
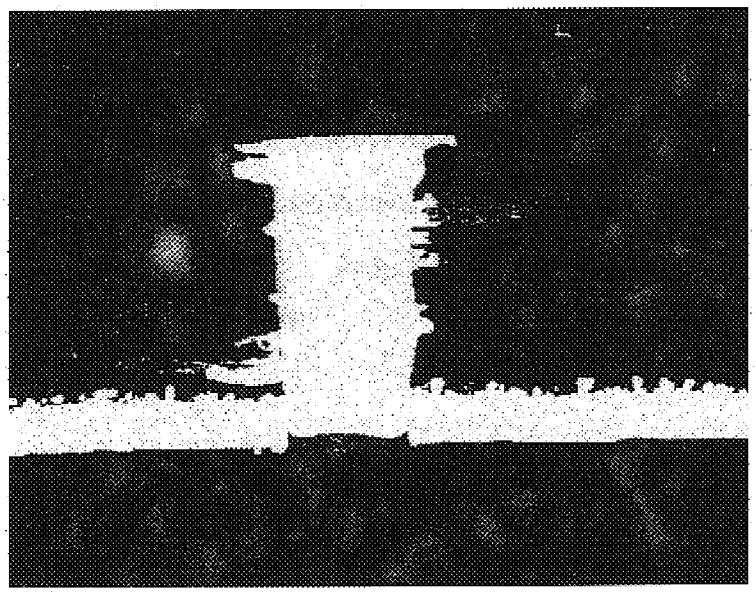
Cross section of the via.
*FIG.—103*

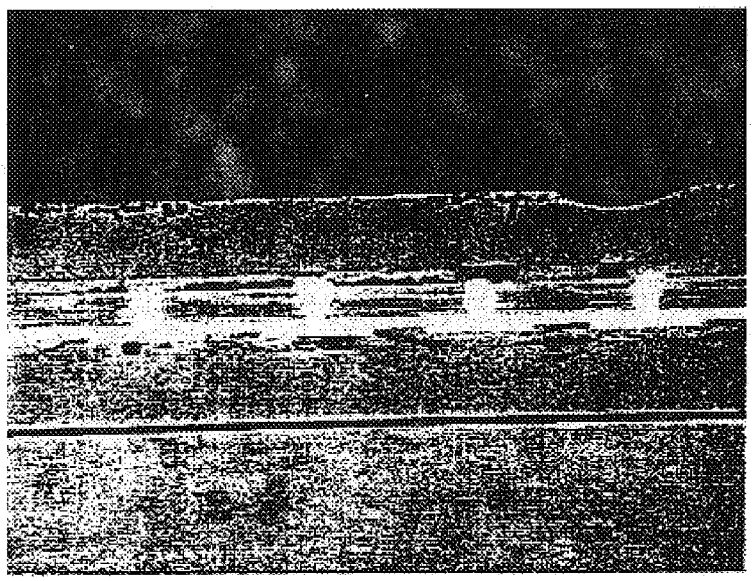

Cross section of filled microvia, produced by the 2nd version. The substrate is a fiber-glass reinforced FR-4. The substrate thickness is about 100 μm and has one side Cu clad.

FIG._104

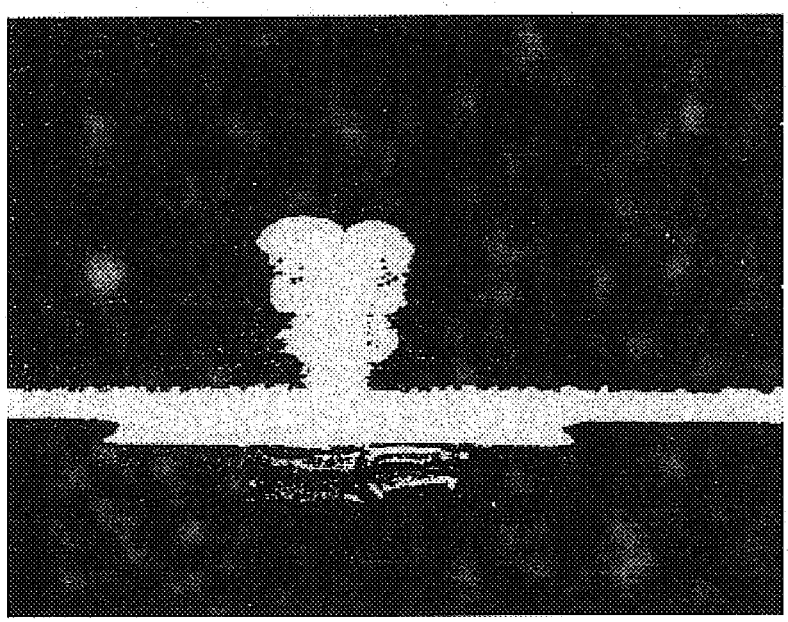

Cross section of the #2 via counting from the left to right produced by the 2nd version. Compared with the 1st version, there is extra Cu added on the bottom of the via, instead of a hole on the bottom of the via. The substrate thickness is about 100 μm and has one side Cu clad. The thin part of the via is about 30 μm in diameter.
The resin around the glass fibers were etched off during the permanganese etching. The plated Cu filled these resin depleted areas.

FIG._105

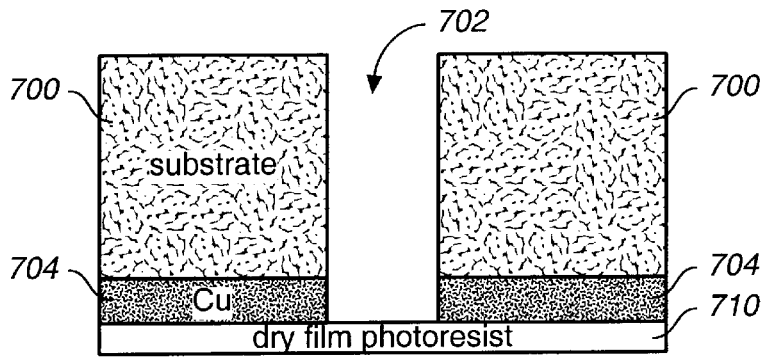
Attach dry film or adhesive tape on the Cu side of substrate contained through-hole.
FIG._106
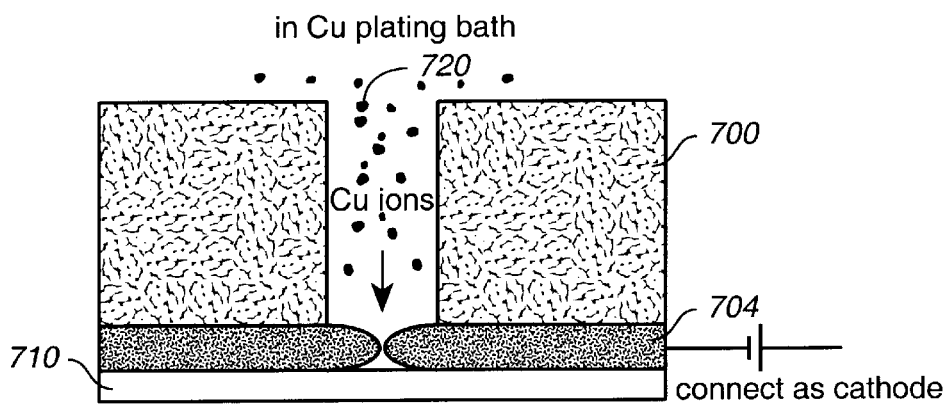
Cu plating closes the hole in Cu layer.
FIG._107
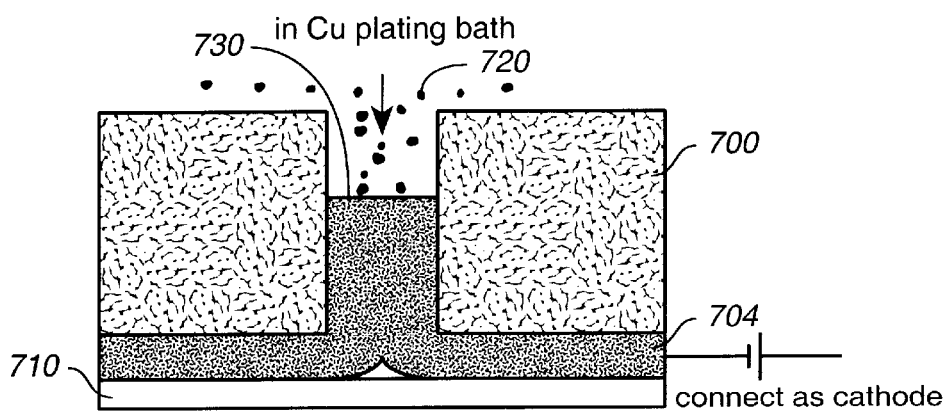
Continued Cu plating fills the hole.
FIG._108

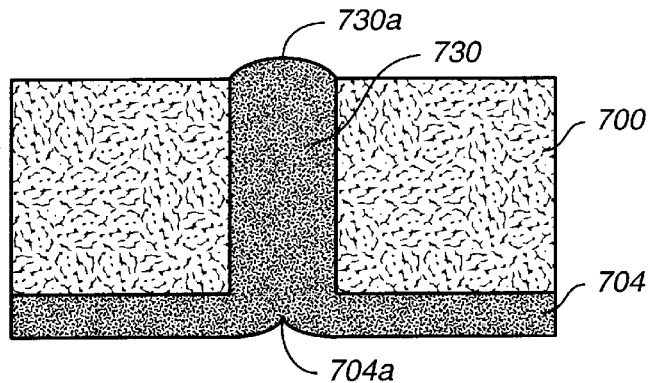
Peel off the dry film or adhesive tape.
FIG._109
The 2nd version
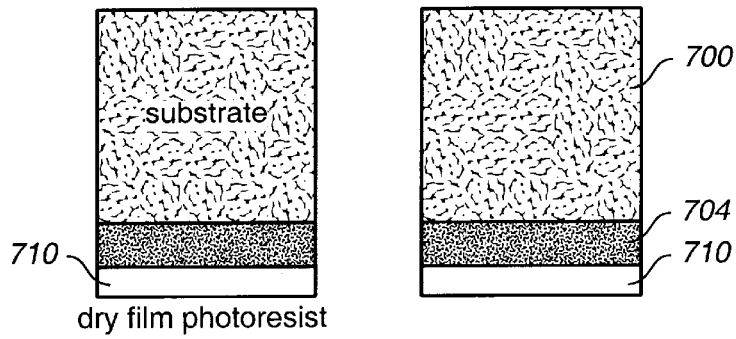
dry film photoresist
The dry film is patterned by photolithography.
Holes are formed in the dry film.
FIG._110
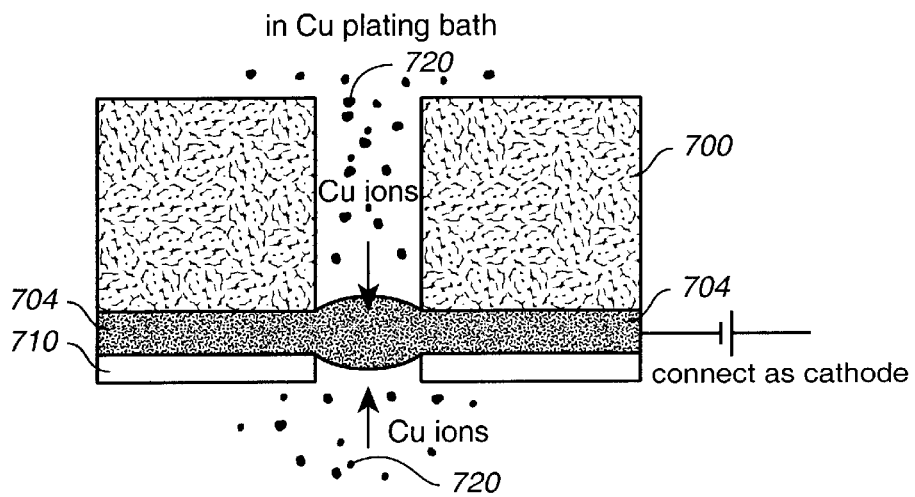
Cu plating closes the hole in Cu layer from both sides.
FIG._111

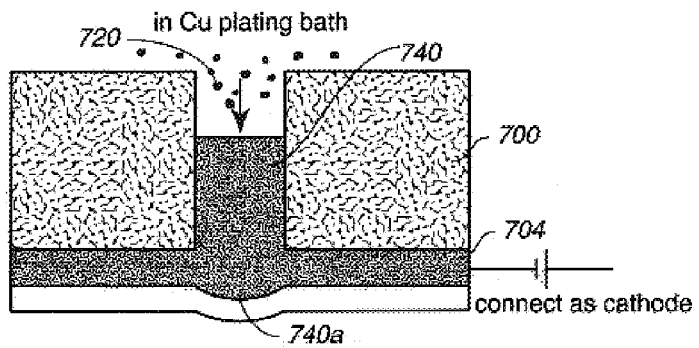

FIG._112

Once the hole is closed, strip off the dry film, and cover with a new dry film closing the hole. Continued Cu plating fills the hole on one side.

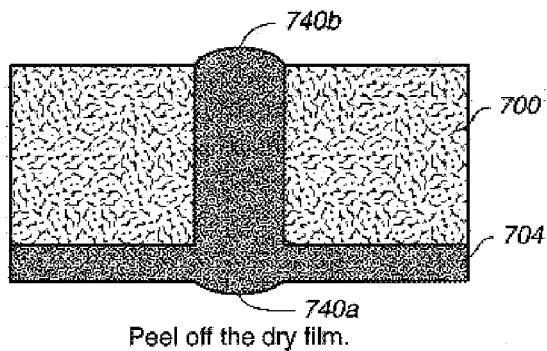

FIG._113

Peel off the dry film.

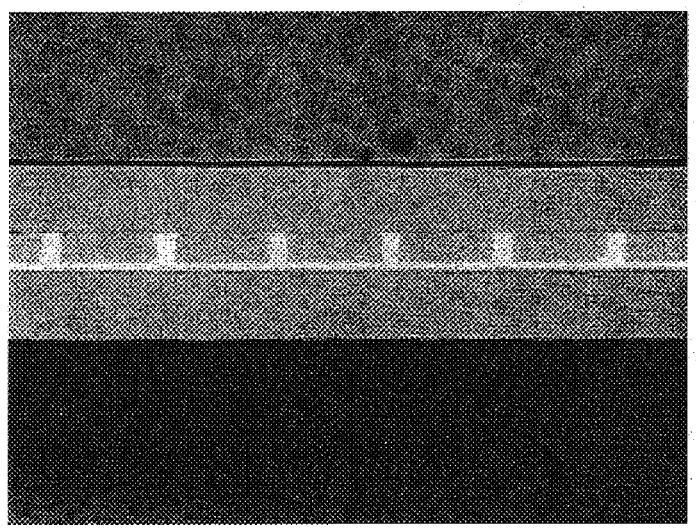

FIG._114 Cross section of filled microvia, produced by the 1st version. The via diameter is about 50 μm, the substrate thickness is about 100 μm and has one side Cu clad. The substrate is FR-4 with non-woven aramid reinforcement.

STRUCTURE AND METHOD FOR FORMING A MULTILAYERED STRUCTURE

This is a continuation-in-part patent application of patent applications having Ser. No. 09/429,854, now U.S. Pat. No. 6,428,942 filed Oct. 28, 1999, and Ser. No. 09/956,605, filed Sep. 18, 2001. Benefit of the earlier filing dates is claimed for all common subject matter.

BACKGROUND OF THE INVENTION

1. Field of the Invention

The present invention is related to multilayered circuit structure. More specifically, the present invention provides a structure and method for producing or forming a multilayered circuit structure.

2. Description of the Prior Art

Multilayer circuit structures can be used to electrically communicate two or more electrical devices such as two or more computer chips. Multilayer circuit structures typically contain multiple conductive layers separated by one or more dielectric layers. Via structures disposed in apertures in the dielectric layers provide conductive paths so that electrical signals can pass from one conductive layer to another conductive layer. Multiple via structures in successive dielectric layers can be used to form a conductive path from an inner region to an outer region of a multilayer circuit structure.

The via structures in successive dielectric layers can be staggered in a multilayer circuit structure. For example, as shown in FIG. 37, a plurality of staggered via structures 110 are in electrical communication with each other. The staggered conductive path formed by the via structures 110 can provide communication between a core structure 120 and an outer surface of the multilayer circuit structure 100. Each of the via structures 110 shown in FIG. 37 is in the form of a conductive coating on an aperture wall in a dielectric layer. Unfortunately, staggering the via structures can consume valuable area in a multilayer circuit structure and can increase the signal run length. This can decrease the density of the circuitry in a multilayer circuit structure. Moreover, the metal coating of via structures of the type shown in FIG. 37 is thin. Open circuits can form if the coating is not thick enough or is not uniform.

A patentability investigation was conducted and the following U.S. Patents were discovered: U.S. Pat. No. 4,824,802, to Brown et al.; U.S. Pat. No. 5,188,702, to Takayama et al.; U.S. Pat. No. 5,454,928, to Rogers et al.; U.S. Pat. No. 5,495,665, to Carpenter et al.; U.S. Pat. No. 5,5291,504, to Greenstein et al.; U.S. Pat. No. 5,707,893, to Bhatt et al.; U.S. Pat. No. 5,763,324, to Nogami; U.S. Pat. No. 5,817,574, to Gardner; U.S. Pat. No. 5,819,406, to Yoshizawa et al.; U.S. Pat. No. 5,851,910, to Hsu et al.; U.S. Pat. No. 5,879,568, to Urasaki et al.; U.S. Pat. No. 5,891,606, to Brown; U.S. Pat. No. 5,925,206, to Boyko et al.; U.S. Pat. No. 5,939,789, to Kawai et al.; U.S. Pat. No. 5,998,291, to Bakhit et al.; and U.S. Pat. No. 6,071,814, to Jang.

U.S. Pat. No. 4,824,802 discloses a method to provide an electrical connection between conductive layers separated by an insulative layer in integrated circuit devices. An intermediary metal, such as molybdenum or tungsten, is deposited by one or more methods so as to fill an opening in the insulative layer. A planarization resist may be applied on the substrate and the resulting configuration is planarizingly etched down to the insulative layer so as to provide a metal plug conductive layer. Deposition is by sputtering, evaporation, or by either selective or non-selective chemical vapor deposition.

U.S. Pat. No. 5,188,702 discloses an anisotropic conductive film comprising an insulating film having the fine through-holes independently piercing the film in the thickness direction, each of the through-holes being filled with a metallic substance in such a manner that at least one end of each through-hole has a bump-like projection of the metallic substance having a bottom area larger than the opening of the through-hole. The metallic substance serves as a conducting path which is prevented from falling off.

U.S. Pat. No. 5,454,928 discloses a method of forming solid metal vias extending between the top and bottom surfaces of a substrate with the ends of the vias being substantially coplanar with the top and bottom surfaces. The method includes the steps of forming holes through the substrate, plating the interior of the holes with excess metal to fill the holes and extend beyond the ends of the holes, heating the substrate to cause the metal to melt and consolidate to form solid vias with domed ends, and lapping the top and bottom surfaces of the substrate to remove the domes. Conductive layers may then be formed over the vias. These layers may have windows over a portion of each via to provide an escape route for expanding fluids during further processing of the substrate.

U.S. Pat. No. 5,495,665 discloses a process for connecting at least two electrically conductive patterns through a dielectric material by a landless electrical connection. The process includes providing a composite containing a dielectric substrate having a conductive plane on at least one of its major surfaces and a temporary support layer covering the conductive plane. Blind vias are provided in the dielectric substrate and are plated with an electrically conductive material. The temporary support layer is removed thereby providing a landless electrical connection through the dielectric material.

U.S. Pat. No. 5,529,504 discloses a microconnection device and a method of forming such a device include providing an array of electrically interconnected conductors within through holes of an insulative flexible film. Each conductor has a microbump. Since the conductors are interconnected, the microbumps define a cluster for contact with a single contact, such as an input/output pad of a semiconductor device. The flexible film includes a cavity at the central region of the cluster, thereby enhancing the flexibility of the film. By applying a load force within the central region of the cluster, the flexible film is caused to bend in a manner to achieve load compliance and a lateral scrub for removing contaminants, oxides and the like at the interface of the microbumps and the contact. A top bump that is misaligned with the microbumps may be formed to ensure proper localization of the load force within the central region.

U.S. Pat. No. 5,707,893 discloses a process for making a circuitized substrate which is treated with an additive and a subtractive metallization process. The disclosed process produces substrates including conductive features, e.g., high density circuit lines and chip heat-sinking pads, of two different degrees of resolution.

U.S. Pat. No. 5,763,324 discloses conductors in contact holes. A first resist is coated on a conductor provided selectively in a contact hole formed in an insulating film provided on a semiconductor substrate, as well as on the insulating film, and a resultant structure is flattened. The first resist and the conductor are removed with their portions being left. A second resist is coated on the conductor and insulating film and a resultant structure is flattened. The second resist and the conductor are removed until the insulating film is exposed.

U.S. Pat. No. 5,817,574 discloses a high reliability interconnection structure for an integrated circuit. The interconnection structure of the present invention is formed on a first insulating layer which in turn is formed on a silicon substrate. A first multilayer interconnection comprises a first aluminum layer, a first refractory metal layer, and a second aluminum layer is formed on the first insulating layer. A second insulating layer is formed over the first multilayer interconnection. A conductive via is formed through the second insulating layer and recessed into the first multilayer interconnection wherein a portion of the via extends above the second insulating layer. A second interconnection is formed on the second insulating layer and on and around the portion of the via extending above the second insulating layer.

U.S. Pat. No. 5,819,406 discloses a method for producing an electrical circuit member by the steps of: positioning and arranging first and second electrical circuit parts having plural electrical connecting portions to be spaced and oppose each other, preparing an electrical connecting member having a plurality of electrical conductive members, and applying an adhesive to at least one side of the electrical connecting member including the electrical conductive members. The electrical connecting member with the adhesive is inserted between the first and second electrical circuit parts, and a pressing force is applied so that the first and second electrical parts contact the ends of the electrical conductive members.

U.S. Pat. No. 5,851,910 discloses a method of fabricating a bonding pad window by the steps of: providing a substrate with a metal layer, forming a dielectric layer over the metal layer, defining the dielectric layer with a first mask to form a via, forming a plug in the via, and forming a second metal layer over the plug and the dielectric layer. The second metal layer is patterned to expose the dielectric layer, and a passivation layer is formed over the second metal layer. The passivation layer is then defined with the first mask to form the bonding pad window.

U.S. Pat. No. 5,879,568 discloses a multilayer printed circuit board produced by a process comprising the steps of coating a thermosetting resin varnish compounded with electrically insulating whiskers on a roughened side of a copper foil, semi-curing the resin by heating to form a thermosetting resin layer, integrally laminating it on an interlayer board in which plated through-holes and conductor circuits have been formed, and roughening the cured thermosetting resin layer on the via hole wall surfaces with a roughening agent.

U.S. Pat. No. 5,891,606 discloses a process for forming a multilayered circuit structure entailing the use of a fill material that forms a conductive connection between the layers of the circuit structure and photodefinable resins that form permanent dielectric layers and plateable surfaces of the circuit structure. The method includes forming a through-hole in a substrate, and then filling the through-hole with the fill material containing a metal that is catalytic to electroless copper. The fill material forms an electrical connection having oppositely-disposed connection surfaces that are coextensive with opposite surfaces of the substrate. A first photodefinable dielectric layer is then formed on each surface of the substrate, including the connection surfaces, and openings are photoimaged and developed in the dielectric layers to expose a portion of each connection surface. A second dielectric layer is then formed over each of the first dielectric layers and the exposed portions of the connection surfaces, with an opening being formed in each of the second dielectric layers to re-expose the portions of the connection surfaces and contiguous surface portions of the first dielectric layers. The exposed surface portions of the first dielectric layers and the exposed portions of the connection surfaces are then electrolessly plated with copper to form conductor traces on each side of the substrate. As a result, the traces electrically contact the connection surfaces, such that traces on opposite sides of the circuit structure are interconnected with the connection formed by the fill material in the through-hole.

U.S. Pat. No. 5,925,206 discloses a method of preparing blind vias in printed circuit boards. The method allows for the drilling of holes for connection in insulating layers prior to laminating insulating layers together. Each insulative layer is prepared with patterned conductive wiring and holes are drilled through the layer at points where wiring is to connect to another level of wiring. Layers are aligned, using mechanical, optical, or other alignment mechanisms, and subsequently laminated together. The holes are plated with conductor after lamination to form an electrical connection.

U.S. Pat. No. 5,939,789 discloses a multilayer substrate which is fabricated by laminating a plurality of substrates. Each substrate comprises an insulation film, a plurality of via holes which pass through the upper surface to the lower surface of the insulation film, a wiring which is provided on the upper surface of the insulation film and the via holes. A bonding member is provided on the lower surfaces of the via holes and is electrically connected with the via holes. A bonding layer is provided on the upper surface of the insulation film where the wiring is formed.

U.S. Pat. No. 5,998,291 discloses a method of fabricating high density multilayer interconnect structures by the steps of securing a top surface of an HDMI decal fabricated on a rigid substrate to a protective film layer which is in turn adhesively secured to a flat carrier. This structure is then demounted or delaminated from the rigid substrate. The bottom of the HDMI decal, with the protective film layer and flat carrier attached thereto, is secured to a mounting substrate using a relatively thick adhesive layer. After the HDMI decal is adhesively secured to the mounting substrate, the carrier and protective film layer are removed. The top surface of the HDMI decal remains flat after it is secured to the mounting substrate, and therefore connection of integrated circuit chips to contact pads on the top surface of the decal is ensured because this surface is flat.

U.S. Pat. No. 6,071,814 discloses a method of removing a seed layer 30 from areas over an insulting layer 20 where metal lines and pads will not be formed so that electroplated metal 50 can be chemical-mechanical polished without metal residue problems 151 and dishing problems. The seed layer 30 is patterned to remove areas 40 of seed layer 30 that are not near the trenches 24.

It would be desirable to provide a method for efficiently producing a reliable high-density multilayer circuit structure in a cost effective manner.

SUMMARY OF THE INVENTION

Embodiments of the invention are directed to methods for forming multilayer circuit structures, particularly high density multilayer circuit structures, having stacked via structures. The via structures are preferably stacked conductive posts.

One embodiment of the invention can be directed to a method for forming a multilayer circuit structure. The method comprises: forming a first plurality of conductive posts on first and second sides of a circuitized core structure, each conductive post having an end proximate to the core structure and an end distal to the core structure; depositing a first dielectric layer on the first side of the core structure; depositing a second dielectric layer on the second side of the core structure; removing dielectric layer material from the distal ends of the first plurality of conductive posts; and forming a second plurality of conductive posts on the distal ends of the first plurality of conductive posts.

Another embodiment is directed a method comprising: forming a first plurality of conductive posts on a side of a circuitized core structure, each conductive post having an end proximate to the core structure and an end distal to the core structure; laminating a dielectric layer on the core structure; depositing a protective layer on the dielectric layer; removing dielectric layer material from the distal ends of the first plurality of conductive posts through the protective layer; and forming a second plurality of conductive posts on the distal ends of the first plurality of conductive posts.

The present invention also provides a method for forming a solder bump on a metal comprising providing a metallic support; depositing a first solder layer on the metallic support; and depositing a second solder layer on the first solder layer. A third solder layer may be disposed on the second solder layer. The first solder layer comprises a first solder composition and the second layer comprises a second solder composition which is generally different than the first solder composition. The third solder layer comprises a third solder composition, which may be generally different than the second solder composition. In one preferred embodiment of the invention, the third solder composition is generally equal to the first solder composition. In another preferred embodiment of the invention the first solder composition and the third solder composition each comprise a major proportion of tin and a minor proportion of lead, and the second solder composition comprises a major proportion of lead and a minor proportion of tin. The metallic support may be a metal-filled via in a laminated substrate. Preferably, the metal-filled via comprises a blind via having a generally frusto-conical shape in vertical cross section. In another embodiment of the invention, a bonding sheet may be disposed on the substrate and the solder layers may be disposed in an opening in the bonding sheet.

The present invention further provides a method for forming a multilayered packaging assembly comprising forming a first metallic support on a first substrate; forming a second metallic support on a second substrate; depositing a first solder layer on the first metallic support; depositing a second solder layer on the first solder layer; and coupling the second solder layer to the second metallic support on the second substrate. The method additionally comprises rotating the second substrate 180 degrees prior to the coupling of the second solder layer to the second metallic support on the second substrate. The method further additionally comprises heating the first solder layer to a temperature higher than its melting point temperature but below a melting point temperature of the second solder layer. A third solder layer may be deposited on the second solder layer. In an alternative preferred embodiment of the invention, the method additionally comprises heating the first substrate to a temperature higher than a melting temperature of the first and third solder layers but below a melting point temperature of the second solder layer. A bonding sheet is preferably supported by the first substrate. An opening may be formed in the bonding sheet and one or more of the solder layers may be positioned in the opening. In another embodiment of the invention, the first substrate is subsequently heated to a temperature greater than the melting point temperature of the second solder layer, and the first substrate is then preferably cooled to a temperature which approximates a curing temperature of the bonding sheet.

The present invention also provides a substrate assembly and a multilayered packaging assembly. The substrate assembly comprises a substrate having a metallic member, a first solder layer disposed on the metallic member, and a second solder layer disposed on the first solder layer. The multilayered packaging assembly comprises a first substrate having a first metallic support, a first solder layer disposed on the first metallic support, a second solder layer disposed on the first solder layer, a third solder layer disposed on the second solder layer, and a second substrate having a second metallic support and coupled to the first substrate.

These provisions together with the various ancillary provisions and features which will become apparent to those skilled in the art as the following description proceeds, are attained by the methods and multilayered circuit structures of the present invention, preferred embodiments thereof being shown with reference to the accompanying drawings, by way of example only, wherein:

BRIEF DESCRIPTION OF THE DRAWINGS

FIG. 1 is a side elevational view of conformal polymer layer(s) disposed on a substrate assembly and over conductor pads;

FIG. 2 is a side elevational view of the substrate assembly of FIG. 1 after deposition of gap-filling polymer;

FIG. 3 is a side elevational view of an alternative substrate assembly with impedance control and ground planes deposited over polymeric CVD layers;

FIG. 4 is a side elevational view of the substrate assembly of FIG. 3 after deposition of gap-filling polymer;

FIG. 5 is a side elevational view of a substrate assembly with conformal polymer layer(s) on a substrate assembly and over conductor(s) and previously deposited layers;

FIG. 6 is a side elevational view of the substrate assembly of FIG. 1 after deposition of an organic or inorganic gap-filling layer;

FIG. 7 is a side elevational view of the substrate assembly of FIG. 6 after depositing a planarizing layer(s) to provide a compliant sealant layer, to facilitate chemical mechanical polishing and farther build-up;

FIG. 8 is a side elevational view of the substrate assembly of FIG. 7 after subsequent build-up;

FIG. 9 is a side elevational view of part of the substrate assembly of FIG. 5;

FIG. 10 is a side elevational view another part of the substrate assembly of FIG. 5;

FIG. 11 is a side elevational view of the substrate assembly of FIG. 1 after low dielectric constant thermoplastic particulates were deposited;

FIG. 12 is a side elevational view of the substrate assembly of FIG. 11 after thermal treatment;

FIG. 13 is a side elevational view of the substrate assembly of FIG. 12 after build-up with another substrate assembly;

FIG. 14 is a side elevational view of part of the substrate assembly of FIG. 5;

FIG. 15 is a side elevational view of another part of the substrate assembly of FIG. 5;

FIG. 16 is a side elevational view of the substrate assembly of FIG. 14 after depositing a composite of low dielectric constant polymer particulates within another planarizing low dielectric constant polymer;

FIG. 17 is a side elevational view of the substrate assembly of FIG. 16 after build-up with another substrate assembly;

FIG. 18 is a side elevational view of part of the substrate assembly of FIG. 5;

FIG. 19 is a side elevational view of another part of the substrate assembly of FIG. 5;

FIG. 20 is a side elevational view of the substrate assembly of FIG. 18 after disposing a thermoplastic low dielectric constant polymer film on top thereof;

FIG. 21 is a side elevational view of the substrate assembly of FIG. 20 after thermal treatment;

FIG. 22 is a side elevational view of the substrate assembly of FIG. 20 after disposing an optional planarizing layer and subsequent build-up of successive layers;

FIG. 23 is a side elevational view of an LSI substrate assembly separated from a substrate supporting metal pads;

FIG. 24 is a side elevational view of the LSI substrate assembly after being coupled to the pad-supporting substrate;

FIG. 25 is a partial enlarged sectional view of one embodiment of a post in FIG. 24 coupled to a metal pad;

FIG. 26 is a partial enlarged sectional view of another embodiment of a post in FIG. 24 coupled to a metal pad;

FIG. 27 is a side elevational view of another embodiment of the two assemblies of FIG. 23;

FIG. 28 is a side elevational view of the two assemblies of FIG. 27 coupled together;

FIG. 29 is a partial enlarged elevational view of one embodiment of a post in FIG. 28 coupled to a metal pad;

FIG. 30 is a side elevational view of another embodiment of the two assemblies of FIG. 23;

FIG. 31 is a side elevational view of the two assemblies of FIG. 30 coupled together;

FIG. 32 is an enlarged elevational view of two posts in FIG. 31 coupled together;

FIG. 33 is a side elevational view of another embodiment of the two assemblies of FIG. 23;

FIG. 34 is a side elevational view of the two assemblies of FIG. 33 coupled together;

FIG. 35 is an enlarged elevational view of a post in FIG. 34 coupled to a cup member;

FIG. 36 is a partial perspective view of a wire interconnect structure (e.g., a WIT) spaced from a cup member;

FIG. 37 shows a cross section of a multilayer circuit structure with staggered via structures;

FIGS. 38–51 show cross sections of multilayer circuit structure precursors used to form a multilayer circuit structure with stacked conductive posts;

FIG. 52 shows a cross section of a multilayer circuit structure with stacked conductive posts;

FIG. 53 shows a cross section of another embodiment of a multilayer circuit structure assembly;

FIGS. 54–57A illustrates the fabrication process for forming a substrate having a plurality of metal-filled vias with each via supporting an embodiment of the solder bump(s) of the present invention;

FIG. 57B is an enlarged sectional view of one embodiment of the solder bump;

FIG. 57C is an enlarged sectional view of another embodiment of the solder bump;

FIGS. 58A–63A illustrate one embodiment of process flow steps for forming the multilayer circuit structure assembly of FIG. 53;

FIGS. 58B–65B illustrate another embodiment of process flow steps for forming the multilayer circuit structure assembly of FIG. 53; and FIGS. 66–79 discloses improved process steps over the embodiment of the invention illustrated in FIGS. 37–65B;

FIGS. 80–84 illustrate an improved plating method;

FIGS. 85–94 illustrate an embodiment of jet impingement plating;

FIGS. 95–105 illustrate another embodiment of jet impingement plating; and

FIGS. 106–114 illustrate a copper plating method.

DETAILED DESCRIPTION OF PREFERRED EMBODIMENTS OF THE INVENTION

Referring in detail now to the drawings, there is seen in FIGS. 1–22 various embodiments of a structure and method for making a low dielectric constant MCM. Structures and methods of the type illustrated in FIGS. 1–22 are of priority of future generation MCM's as they will enable gigahertz speed products without huge losses, noise, and delays. The advantages of a low dielectric constant MCM of the various embodiments of the present invention are: (1) higher performance MCMs may be made with lower dielectric constants; (2) reduces amount of chemical mechanical polishing (CMP) required by using only conformal dielectric coatings in the MCMs; (3) enables better dielectric-layer adhesion than possible with only one type of dielectric polymer because of using two or more dielectric polymers; and (4) enables controlled impedance structures. A dielectric constant is a value serving as an index of the ability of the dielectric material(s) (e.g., polymers) to resist the transmission of an electrostatic force from one charged body to another. The dielectric materials utilized in various embodiments of the present invention for producing low dielectric constant MCMs have a low dielectric constant, such as a dielectric constant less than about 3.8 at 20° C. In a preferred embodiment of the invention, the dielectric constant at 20° C. for the dielectric materials ranges from about 1.2 to about 3.4; preferably from about 1.4 to about 3.0; more preferably from about 1.6 to about 2.8; most preferably from about 1.8 to about 2.7; such as from about 2.0 to about 2.6 including from about 2.1 to about 2.5.

Suitable dielectric material(s) include B-stage polymeric compounds, such as polyimides, epoxy resins, polyurethanes or silicons, provided that these compounds are produced with a low dielectric constant at 20° C. Additional suitable materials could include thermosetting materials, such as high glass transition anhydride-cured epoxy composition possessing a low dielectric constant at 20° C. More particular suitable thermoset materials include, but are not limited to, one or more compounds produced with a low dielectric constant at 20° C. and selected from group consisting of epoxies and modified epoxies, melamine-formaldehydes, urea formaldehydes, phelonic resins, poly (bis-maleimides), acetylene-terminated BPA resins, IPN polymers, triazine resins, and mixtures thereof. Further additional suitable materials include high temperature thermoplastic materials, such as liquid crystal polyesters (e.g., Xydar™ or Vectra™), poly-(ether ether ketones), or the poly(aryl ether ketones), provided that these thermoplastic materials are produced such as to possess the low dielectric constant at 20° C. Additional suitable thermoplastic materials include, by way of example only, ABS-containing resinous materials (ABS/PC, ABS/polysulfone, ABS/PVC), acetals acrylics, alkyds, allylic ethers, benzocyclobutenes, cellulosic esters, chlorinated polyalkylene ethers, cyanate, cyanamides, furans, parylene amorphous fluoropolymers, polyalkylene ethers, polyamides (Nylons), polyarylene ethers, perfluoroalkoxy polymeric resins, fluoroethylenepropylene polymers, polybutadienes, polycarbonates, polyesters, polyfluorocarbons, polyimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, and the like, and mixtures of any of the foregoing, provided that the materials are manufactured to have a low dielectric constant at 20° C.

In another preferred embodiment of the invention the low dielectric constant material comprises a polymer having the repeat structure $(-CH_2C_6H_4CH_2-)_n$ wherein n is an integer having a value ranging from about 2,000 to about 8,000; more preferably from about 3,000 to about 7,000; most preferably from about 4,000 to about 6,000, such as from about 4,500 to about 5,500 including from about 4,800 to about 5,200. In a further embodiment of the invention the low dielectric constant material comprises the repeat structure $(-CF_2-CF_2-)_n$ wherein n is an integer having a value ranging from about 3,000 to about 16,000; more preferably from about 4,000 to about 14,000; most preferably from about 8,000 to about 12,000.

Referring now to FIGS. 1–3, a thin conformal coating of one low dielectric constant layer of material 16 is first deposited over the conductor traces 14 (i.e., Cu) supported by substrate 10. A conformal coating is a coating which has sufficient viscosity to generally conform to an underneath supporting surface as shown in FIG. 1. A conformal coating is also a coating which deposits in a generally uniform thickness as shown in FIG. 1. A conformal coating is furthermore a coating which does not have to be polished (e.g., such as by CMP) after deposition. Conductor traces 14 (or pads or regions) may be plated and/or sputtered onto substrate 10. This layer of material 16 provides good adhesion to the conductor traces 14, and may be deposited by any suitable manner, such as chemical vapor deposition (CVD), sprayed on, or spun on. Optionally, a second low dielectric constant layer of material 18, preferably a conformal layer of material 18, may subsequently be deposited on and/or over layer of material 16. The layer of material 18 may be manufactured from a material having less adhesion to the conductor traces 14 but good adhesion to the layer of material 16. Thus, by way of example only, the material 16 may comprise the repeat structure $(-CH_2C_6H_4CH_2-)_n$ where n ranges from about 4,500 to about 5,500; and material 18 may comprise a fluorinated parylene, such as, by way of example only, one having the repeat structure $(-CHFC_6H_2F_2CHF-)_n$ wherein n is an integer having a value ranging from about 2,000 to about 8,000; more preferably from about 3,000 to about 7,000; and most preferably from about 4,000 to about 6,000. The low dielectric constant for material 16 may have a value which is less than, or more than, the value of the low dielectric constant for the material 18. More specifically, the dielectric constant for material 16 may be less than about 2.3 (or less than about 1.8) whereas the dielectric constant for material 18 may be greater than about 2.3 (or greater than about 1.8), i.e., a value ranging from greater than about 1.8, or from about 2.3 to about 3.8, and vice versa, i.e., dielectric constant for material 18 is less than about 2.3, or less than about 1.8, and the dielectric constant for material 16 is greater than about 1.8, or greater than about 2.3 up to and including about 3.8.

A gap-filling material 20 is subsequently deposited (e.g., spun on) in voids 24 between spaced material 16 (see FIG. 2A and FIG. 4). In FIGS. 1 and 2B, the gap-filling material 20 is disposed (e.g., spun on) in voids 26 between spaced material 18 which is supported by material 16. Any excess gap-filling material 20 extending about material 16 and/or material 18 may be polished or planarized down until a planar surface 20 a registers with planar surfaces 16a16a of material 16 or with planar surfaces 20a-20a of material 20 (see FIG. 2A). The material 20 is one or more of the previously mentioned low dielectric constant materials. The low dielectric constant for material 20 may be the same as, less than, or greater than the dielectric constant for material 16 and/or material 18.

Fluorinated parylene $AF_4$ has a dielectric constant of approximately 2.3 with a very low dissipation constant (approaching that of Teflon). Future $AF_4$ variants will have even lower values of dielectric constant and dissipation factor. It has been surprisingly discovered that heat treatments in a specific temperature range result in highly desirable improvements in the mechanical properties of parylene $AF_4$ films. Without this inventive heat treatment, the thermal expansion coefficient of films are in excess of 100 ppm. Following the heat treatment, the films exhibit thermal expansion coefficients of ~35 ppm. Even more importantly, the total elongation to plastic instability of the films is changed >100% from undesirable values of 5–10% to much more desirable values in excess of 15–20%. Without a property enhancement such as this, it is very unlikely that multilayer electrical circuits could be manufacturable or made reliable.

Free standing parylene $AF_4$ films of ~50–100 micron thickness were deposited by the Gorham process at platen temperatures of both −15° C. and −25° C. The lower temperature deposition temperature is believed to result in higher molecular weights of the polymer film. From these films dogbone specimens with gauge widths of 4 mm and gauge lengths of 1 cm were cut using a YAG laser. The specimens were then pulled to failure in an Instron at strain rates of $10^{-2}$/sec. The lower molecular weight film became plastically unstable and fractured at essentially the same lower strain values of ~6–9%. The higher molecular weight films became plastically unstable at essentially the same strains as the higher molecular weight film. The toughness of these films is unacceptable for multilayer film build-up (strains in excess of 10% prior to plastic instability are required). The films exhibit young's moduli of approximately 1 Gpa and sustain stresses of roughly 50 Mpa to the point of plastic instability. The following vacuum (<1 mbar) heat treatments of the films as set forth in the following Table 1 were performed prior to cutting the tensile specimens:

TABLE I

| Heat Treatment (HT) Temperature (° C.) | Time @ HT Temperature | Elongation prior to plastic instability |
|---|---|---|
| As-Received |  | <5–8% |
| 280 | 1 hr | ~10% |
| 300 | 1 hr | ~10% |
| 300 | 4 hr | ~10% |
| 330 | Ramp and cool | ~20% |
| 330 | 1 hr | ~20% |
| 330 | 16 hr | ~20% |
| 400 | 1 hr | ~20% |
| 450 | 1 hr | ~10% |

In another embodiment of the invention and as best shown in FIG. 3, a ground layer 30 may be disposed over material 20; or alternatively, over material 18 which is used to fill the voids 24 instead of material 20. Subsequently, a second material 16s is deposited as indicated with second conductor traces 14s disposed as shown in FIG. 3. The ground layer 30 may serve to both control impedance and provide mechanical stability to the structure.

Referring now to FIGS. 4–8 for another embodiment of the invention, masking may be used on the layer of material 16 to remove or discontinue material 16 from one conductor trace 14 to a contiguous conductor trace 14, as best shown in FIG. 5. Subsequently, a low dielectric constant material 34, such as xerogel, sesquisilones, etc., is deposited over the material 16. The layer of material 34 may be thermally cured and may contain or develop voids and cracks, especially as deposited layers exceed about one micron in thickness. Subsequently chemical mechanical polishing (CMP) and structural stability are facilitated with a deposit of a low dielectric constant layer 36 (see FIG. 7), such as Teflon AF, parylene, PAE, BCB or low molecular weight reactive oligimers with low dielectric constants. CMP may then be performed and a next layer may be constructed. An additional or alternative layer (not shown in the drawings) of parylene, PAE, BCB or low molecular weight reactive oligimers with low dielectric constants may be deposited after CMP of the layer of material 34 to better enable a subsequent layer (not shown) of conductor to adhere. As was seen for the embodiment of the invention in FIG. 3, the conformal coating of material 36 may be thicker than the layer of material 34, and subsequently the conducting ground layer 30 may be deposited on material 36 as shown in FIG. 8. This ground layer 30 may serve to both control impedance and provide mechanical stability to the structure. These "sidewalls" of the impedance controlling ground layer 30 may alternatively be deposited to a thickness for which adjoining sidewalls bridge one another.

Referring now to FIGS. 9–22 for additional embodiments of the present invention, there is seen in FIG. 11 a plurality of low dielectric constant particulate material 40. The particulate material 40 may comprise or consist of material 16 and/or material 18 and/or material 34, or any of the previously mentioned low dielectric constant material(s). The particulate material 40 may be applied to the surface of material 16 and/or material 18 by any suitable manner, such as by spreading, spray, transfer, etc. The particulate material 40 is then thermally processed to flow material 40 and enable it to substantially fill the gaps to produce material 40a (see FIG. 12). The temperature (e.g., a temperature ranging from about 85° C. to about 200° C.) to cause particulate material 40 to flow would depend on the composition of low dielectric constant material 40. Voids may be retained in this layer if desired. Material 36 may be disposed on material 40a, and ground layer 30 may be deposited on material 36, followed by disposing on ground layer 30 another assembly of traces 14, material 16 and material 40a.

Referring now to FIGS. 14–17, a thin, essentially conformal coating of one low dielectric constant material 16 (i.e., parylene, PAE, BCB or low molecular weight reactive oligimers with low dielectric constants) is first deposited over the conductor traces 14 (i.e., Cu). The conductor traces 14 may be plated and/or sputtered onto substrate 10. Layer of material 16 possesses good adhesion for the conductor traces 14. Material 16, as previously indicated, is preferably deposited from the vapor phase, but may be spun or sprayed on. An optional separate or phased-in (gradient composition or co-deposited) thin conformal layer 18 with less adhesion to the conductor traces 14 but good adhesion to the first layer 16 (e.g., inorganic containing dielectrics, fluorinated parylene, fluorinated PAE, fluorinated BCB or low molecular weight reactive oligimers with low dielectric constants) may then be deposited, as shown in FIG. 2B. This layer 18 should also have good adhesion to successive additions and layers. Masking can be used to make such polymer layers discontinuous from conductor to conductor. Such layers may serve as a diffusion or electromigration barriers as well as an adhesion promoter.

Next, and as shown in FIG. 16, a composite layer of polymer 42 (e.g., Teflon AF, liquid crystal polymer, etc.) and/or inorganic containing dielectrics is deposited together within another planarizing low dielectric constant material (e.g., inorganic containing dielectrics, fluorinated BCB or low molecular weight reactive oligimers with low dielectric constants). Particulates 44 may be pressed into fluid or fluid spun on lightly compressed (and/or partially sintered) particulates. Also, they can be co-deposited by spray or spin-on processes. Alternatively, the particulates 44 may be precipitated out of solution (chemically or via solvent removal). The structure may alter its spatial geometry during curing as the thermoplastics may flow somewhat at elevated temperatures. Voids may be retained in this layer. Subsequent CMP and structural stability may be facilitated with a planarizing deposit of inorganic dielectric, BCB or low molecular weight reactive oligimers with low dielectric constants deposition on top of the thermoplastic. CMP may then be performed and a next layer can be constructed. An additional layer of inorganic containing dielectric, parylene, PAE, BCB or low molecular weight reactive oligimers with low dielectric constants may be deposited after CMP to better enable the next layer of conductor to adhere.

As best shown in FIG. 17, another conformal polymer layer 42 and conductor traces 14 may be formed for further circuit buildup. The optional ground layer 30 may be deposited prior to this second layer buildup for dimensional stability and/or electrical performance.

Referring now to FIGS. 18–22, after the low dielectric constant assembly is formed (see FIGS. 18–19), as the same low dielectric assembly of FIGS. 4–5, 9–10 and 14–15 was formed, a thermoplastic film 50 (e.g., Teflon AF, PFTE, PFA, FEP, liquid crystal polymer, etc.) with low dielectric constant is placed over the appropriately coated circuitry. The film 50 may be thermally laminated or autoclaved onto the circuitry, as best shown in FIG. 21. Subsequent CMP and structural stability may be facilitated with a planarizing deposit of inorganic dielectric, BCB or low molecular weight reactive oligimers with low dielectric constants deposition on top of the thermoplastic. As previously indicated, CMP may then be performed and a next layer may be formed. An additional layer of inorganic containing dielectric material 54, such as parylene, PAE, BCB or low molecular weight reactive oligimers with low dielectric constants may be deposited on film 50, followed preferably by CMP to better enable the next layer of conductor to adhere. FIG. 22 discloses a second layer build-up, similar to the second layer build-ups of FIGS. 8, 13, 17 and 22.

Referring now to FIGS. 23–36 for describing a method and structure which utilizes the "Wire Interconnect Structure" (WIT) and "Transient Liquid Alloy Bonding" (TLAB) on ultra-fine-pitch flip chip technology. WIT structure provides an ultra-fine-pitch interconnection method between LSI and a substrate. TLAB provides a reliable lead-free bonding method. The depletion layer of the TLAB can be located at the bottom pad (substrate side), on the wire structure, or at the middle of the wire structure.

As respectively illustrated in FIGS. 23–26, FIGS. 27–29, FIGS. 30–32, and FIGS. 33–36, embodiments of the invention include four types of structures. The first structure of FIGS. 23–26 illustrates the WIT on an LSI side and a depletion phase (Sn, In or Sn/In alloy) on a substrate side. The second structure of FIGS. 27–29 illustrates the depletion phase on the WIT structure, which may be done by sequential electroplating. The third structure of FIGS. 30–32 illustrates the depletion phase located at the middle of the final WIT structure, which is accomplished by electroplating of depletion phase on one side of WIT or both sides (i.e., half-WIT is built on both sides first). The fourth structure of FIGS. 33–36 illustrates a cup structure combined with the WIT structure. The cup structure provides an anchoring function to hold the WIT tip. It supports the structure with a good laterally mechanical strength and can transfer the shearing stain/stress directly to the WIT structure but not the joint interface. In the fourth structure, the Sn can be within the cup structure or on the tip of WIT. Also, the cup height can be low, which will be functioned to compensate the stress concentration directly, or be high to avoid the high stress point.

Referring more specifically now to FIGS. 23–36, there is seen a substrate 56 supporting a plurality of metal pads 58 (i.e., pads 58a, 58b, 58c, 58d and 58e) which in turn support depletion layers 60 (i.e., depletion layers 60a, 60b, 60c, 60d and 60e such as Sn and/or In deposited by electroplating). There is also seen an LSI substrate 62 supporting a plurality of conductive pads 64 (i.e., conductive pads 64a, 64b, 64c, 64d and 64e), having connected thereto wire interconnect structures (WISs) 66 (i.e., WTIs 66a, 66b, 66c, 66d and 66e) which may be fabricated by electroplating with a thick photoresist and preferably may be copper and/or gold. The advantage of gold is that it can provide better elasticity when employed at a high CTE mismatch circumstance. In FIGS. 27, 30 and 33, the depletion layers 60a, 60b, 60c, 60d and 60e are respectively deposited on the terminal ends of the WTIs 66a, 66b, 66c, 66d and 66e. In FIG. 30, WTIs 66 are divided such that part of the respective WTIs 66 is coupled to and supported by LSI substrate 62 and part is coupled to and supported by substrate 56. Furthermore with respect to the embodiment of the invention in FIG. 30, depletion layers 60 are divided between the two sets of WTIs 66–66 and disposed on terminal ends of the respective WTIs 66–66. In FIG. 33 substrate 56 supports a plurality of conductive cups 68 (i.e., cups 68a, 68b, 68c, 68d and 68e) for receiving terminal ends of WTIs 66 including the respective depletion layers 60 associated with the terminal ends of WTIs 66. The conductive (e.g., copper) cups 68 are preferably fabricated by electroplating. A donut shape ring is exposed for depositing the conductive cups 68. The depletion layers 60 may be deposited on the terminal ends of the WITs 66 or inside the respective conductive cups 68 either by electroplating, immersion or evaporation.

The LSI substrate 62 and substrate 56 are aligned by a suitable aligner, e.g., a flip-chip bonder by Karl Suess. The aligned pair is subsequently pressed and heated by a flip-chip bonder in air or nitrogen environment. The temperature needs to be higher than the melting point of the depletion layers 60 and held for a certain period of time. The melting temperature is around 232° C. for Sn, 157° C. for In and between 120° C. to 232° C. for Sn—In temperature alloy (depending on the alloy composition). The time should be long enough to convert the molten phase of depletion layers 60 completely into an alloy or intermetallic compounds 60a', 60b', 60c', 60d' and 60e' with the base metal (e.g., copper or gold). More desirably, the depletion layers 60 are to be converted completely into a strong and reliable metal phase which depends on the metallurgical system used. Lastly, the underfill is applied between the interconnects to form a reliable chip packaging. Another alternative way to put in underfill material is during the bonding process by using a liquid-type underfill that can be cured during the bonding process.

Referring in detail now to FIGS. 37–52, embodiments of the invention are directed to methods for forming multilayer circuit structures. In preferred embodiments, the methods comprise forming a first plurality of conductive posts on first and second sides of a circuitized core structure. Each conductive post has an end proximate to the core structure and an end distal to the core structure. After the conductive posts are formed, a first dielectric layer is deposited on the first side of the core structure and a second dielectric layer is deposited on the second side of the core structure. Dielectric layer material deposited on the distal ends of the first plurality of conductive posts is then removed. After removing the dielectric layer material from the ends of the posts, circuit patterns are formed on the dielectric layers. The formed circuit patterns can include conductive pads disposed over the cleaned distal ends of the posts. A second plurality of conductive posts can then be formed on the conductive pads on the distal ends. The second plurality of conductive posts can be stacked on the first plurality of conductive posts. Additional sets of subsequently formed conductive posts (e.g., third, fourth pluralities) and pads can be stacked on the second plurality of conductive posts to form a plurality of generally vertical conductive pathways (e.g., generally perpendicular to the orientation of the core structure) through the dielectric layers. The generally vertical conductive pathways can result in a multilayer circuit structure which occupies less space than a similar multilayer circuit structure having staggered via structures.

In embodiments of the invention, multilayer circuit structures can be formed quickly and efficiently. For example, in preferred embodiments, the dielectric layers, conductive posts, and conductive patterns including conductive pads can be simultaneously formed or deposited on opposite sides of multilayer circuit structure precursors (e.g., a core structure). For example, in embodiments of the invention, conductive posts can be simultaneously electroplated on conductive regions on opposite sides of a core structure. Furthermore, in preferred embodiments, the multilayer circuit structures having stacked conductive posts can be formed using less expensive processes such as photolithography and electroplating. More expensive techniques such as laser drilling are not needed in preferred embodiments of the invention. Consequently, high density multilayer circuit structures having high circuit densities can be formed efficiently and cost-effectively.

The conductive posts and conductive patterns in the multilayer circuit structures are preferably formed by additive processes. Additive processes have advantages over subtractive processes. For example, subtractive processes use etchants to remove metal from continuous metal layers to form conductive patterns. The uniformity of the lines in the etched patterns can be difficult to control, because etchants can undercut the lines. Consequently, it can be difficult to form fine line patterns using subtractive processes. In an additive process, however, the conductive pattern resolution is limited only by the resolution of the photoresist used to form the conductive patterns. Consequently, fine line and high density circuit patterns can be produced using additive processes. For instance, the circuit lines can have widths of 25 microns or less, and can be at a pitch of about 50 microns or less. In addition, in subtractive processes, metal layers are etched and then rinsed. The etching and rinsing processes consume large amounts of wet chemicals and water and can generate large amounts of waste (e.g., wasted metal). However, because of the reduced number of etching steps used in a typical additive process, the waste generated from a typical additive process is less than a typical subtractive process.

Embodiments of the invention can be described with reference to the Figures. FIG. 38 shows a circuitized core structure 122 upon which a plurality of conductive posts are formed. The core structure 122 includes a first side 122(a) and a second side 122(b), and can be flexible or rigid. The first and second sides 122(a), 122(b) can have, respectively, a first plurality of conductive regions 124(a) and a second plurality of conductive regions 124(b). The first and second conductive regions 124(a), 124(b) can include, e.g., lines, pads, or the ends of via structures. Moreover, the first and second conductive regions 124(a), 124(b) can be made of any suitable conductive material including copper, and can have any suitable thickness including a thickness of less than about 50 microns, and preferably between about 18 to about 36 microns. In addition to having conductive regions 124(a), 124(b) on the outer surfaces of the core structure 122, the core structure 122 may also include two or more dielectric layers and one or more conductive layers (not shown) embedded within the core structure 122.

The core structure 122 can also include one or more via structures 123. The via structures can communicate the conductive regions 124(a), 124(b) on the first and second sides 122(a), 122(b) of the core structure 122. The via structures can be solid conductive posts, or can be plated through holes (PTH) which have been filled with a conductive or a non-conductive material. For example, the PTH can be filled with a polymeric material such as an epoxy-based polymer, with or without an embedded conductive material. In another example, the PTH can be filled with a conductive paste such as a silver filled conductive paste. Filling the PTH with a material displaces any air which might otherwise reside in the PTH. It is preferable to remove any air pockets which might reside in the resulting multilayer circuit structure, because trapped air may cause reliability problems in some instances.

In a typical PTH filling process, an aperture can be formed in a rigid insulating board. Metal can be electroplated onto the wall of the aperture to form a PTH. After forming the PTH, a conductive or non-conductive filler material can be deposited within the PTH by, e.g., stenciling. If the filler material is curable, the filler material can be cured within the PTH. Before or after curing, any excess filler material on the first and second sides of the core structure can be removed.

In preferred embodiments, after the core structure is formed, a first plurality of conductive posts are formed on both the first and second sides of the circuitized core structure. Each conductive post can have an end proximate to the core structure and an end distal to the core structure. The conductive posts are preferably solid and/or substantially homogeneous in composition (e.g., all metal). The posts may also include any suitable conductive material. Suitable conductive materials include metal or metal alloys including copper, silver, gold, nickel, palladium, and aluminum. The conductive material is preferably copper.

The conductive posts may include any suitable dimensions. For example, the conductive posts can have a height of at least about 10 microns, preferably between about 15 to about 75 microns, and more preferably between about 25 to about 50 microns. The conductive posts can have any suitable diameter including a diameter between about 10 to about 150 microns, preferably between about 25 to about 75 microns. In addition, each of the posts may have a generally round radial cross-section.

The conductive posts (e.g., the first plurality of conductive posts) can be formed using any suitable process. For example, plating processes such as electroless or electroplating processes can be used to form the conductive posts.

The conductive posts are preferably formed by electroplating. With reference to FIG. 39, seed layers 125(a), 125(b) can be deposited on the first and second sides 122(a), 122(b) of the core structure 122. The seed layers 125(a), 125(b) can be used to help initiate the plating of the subsequently formed conductive posts. Preferably, the seed layers 125(a), 125(b) are deposited simultaneously, but they can be deposited sequentially in some instances. Any suitable process including sputtering and electroless plating can be used to deposit the seed layers. Electroless plating is preferred as it is generally less expensive than sputtering. Regardless of how they are deposited, the seed layers 125(a), 125(b) may have a thickness of about 3 microns or less. Preferably, the thickness of each seed layer is between about 0.1 to about 1.0 micron, and is more preferably between about 0.3 to about 0.6 micron.

Prior to depositing the seed layers, the first and second sides of the core structure may be conditioned. For example, to increase the adhesion of seed layers to the sides of the core structure, the surfaces of the core structure can be roughened. Roughening can be performed using any suitable process including an etch process such as a permanganate etch process. By roughening the surfaces of the core structure prior to depositing the seed layers, the seed layers are more likely to adhere to the surfaces of the core structure.

After depositing the seed layers, photoresist layers can be deposited on the seed layers. The photoresist layers can be in the form of a film or a liquid prior to being deposited on the first and second sides of the core structure. An example of a suitable dry film photoresist is Riston☐ 9000, commercially available from E.I. du Pont de Nemours, Inc. An example of a suitable liquid photoresist is AZ4620 liquid photoresist commercially available from Clariant, Inc. The photoresist layers may be positive or negative, and can be deposited on the first and second sides of the core structure simultaneously or sequentially.

The photoresist layers may be deposited by any suitable process including roller coating, spin coating, curtain coating, screen printing, slot coating, spray coating, and doctor blade coating. These processes are suitable for depositing liquid photoresist layers. Preformed photoresist layers may be deposited by laminating. Preferably, the photoresist layers are deposited by laminating. For example, in some embodiments, a double-sided hot roll laminator may be used to laminate preformed layers of photoresist on both sides of the core structure simultaneously.

After depositing the photoresist layers, photoresist patterns can be formed using conventional photolithographic techniques. For example, the deposited photoresist layers can be irradiated with a pattern of radiation. The irradiated photoresist layers can then be developed to form patterned photoresist layers. For example, with reference to FIG. 40, after the photoresist layers on both sides of the core structure 122 are developed, the developed photoresist layers 131(a), 131(b) can have a plurality of apertures 132(a), 132(b) disposed over one or more conductive regions 124(a), 124(b) on opposite sides of the core structure 122. The patterned photoresist layers can be used as masks to selectively deposit conductive material in predetermined areas. Deposition processes such as electroplating or electroless plating can be used to deposit the conductive material on regions not covered by the patterned photoresist layers.

With reference to FIGS. 40 and 41, a first plurality of conductive posts 134(a), 134(b) are formed within the apertures 132(a), 132(b) of the photoresist layers 131(a), 131(b), and on the conductive regions 124(a), 124(b) exposed through the photoresist layers 131(a), 131(b). In this example, the first plurality of conductive posts includes conductive posts 134(a) on the first side of the core structure 122 and conductive posts 134(b) on the second side of the core structure 122. The first plurality of conductive posts 134(a), 134(b) are preferably formed on both sides of the core structure simultaneously. For example, the structure shown in FIG. 40 can be placed in an electroplating bath. In the electroplating bath, conductive material can plate from the conductive regions 124(a), 124(b) to the open ends of the apertures 132(a), 132(b) to form a first plurality of conductive posts 134(a), 134(b).

Although the use of seed layers are described in detail with respect to the illustrated embodiments, seed layers need not be used in other embodiments. For example, the conductive regions 124(a), 124(b) exposed through the photoresist layers 131(a), 131(b) may be suitable to initiate the direct plating of posts within the apertures 132(a), 132(b) of the photoresist layers 131(a), 131(b), without the need to deposit seed layers.

After the first plurality of conductive posts 134(a), 134(b) are formed, the photoresist layers 131(a), 131(b) which were used to form the conductive posts 134(a), 134(b) can be removed (e.g., stripped) from the core structure 122. As shown in FIG. 42, after the photoresist layers 131(a), 131(b) are removed, the first plurality of conductive posts 134(a), 134(b) are disposed on the core structure 122 and protrude from the surfaces of the core structure 122.

After the photoresist layers 131(a), 131(b) are removed, the seed layers 125(a), 125(b), if present, can also be removed. Preferably, the seed layers are etched in a flash etching process. In a typical flash etching process, the seed layers can be etched for a short period of time. After flash etching, the seed layers are completely removed from the dielectric layer surfaces, and an insubstantial portion of the formed conductive posts 134(a), 134(b) may also be removed.

After the first plurality of conductive posts are formed on the core structure, dielectric layers may be deposited on the first and second sides of the core structure. The dielectric layers may include any suitable material including any suitable polymeric material. Exemplary dielectric layer materials include polyimide, epoxy-functional materials, and BT resins. Moreover, the dielectric layers may optionally include a filler. Preferable fillers can include particles such as silica or alumina particles, but may include chopped, woven, or nonwoven fibers. Preferably, the dielectric layers are in the form of a preformed layer. Examples of preformed dielectric layers include ABF-SH9 film commercially available from Ajinomoto, Inc., and BT346 film commercially available from Mitsubishi Gas and Chemical, Inc. In addition, the dielectric layers are preferably non-photoimageable. Non-photoimageable dielectric materials typically have a higher glass transition temperature (Tg) and a lower moisture absorption rate than photoimageable dielectric layers. Consequently, multilayer circuit structures having non-photoimageable dielectric layers are generally more reliable than photoimageable dielectric layers.

The deposited dielectric layers may have any suitable thickness including a thickness of about 75 microns or less, preferably between about 25 to about 50 microns. The individual dielectric layers on the core structure may have the same or different thickness. Preferably, an individual dielectric layer can have a thickness which is less than or equal to the combined height of a post and pad upon which the post is disposed. For example, the thickness of a dielectric layer may be about 2 to about 8% less (e.g., 5% or less) than the combined height of a conductive post and a conductive pad upon which the conductive post is disposed.

The dielectric layers may be sequentially or simultaneously deposited onto opposite sides of the core structure. For example, a first dielectric layer can be deposited on a first side of a core structure by depositing a liquid dielectric material on the first side. The deposited liquid can then be softbaked to solidify the deposited layer, and can then be optionally cured. After the first dielectric layer is deposited, a second dielectric layer can be deposited on the second side of the core structure in the same or different manner as the first dielectric layer.

The dielectric layers may be deposited using any suitable process including spin coating, screen printing, slot coating, doctor blade coating, curtain coating, etc. These processes can be used to deposit liquid dielectric layers. Laminating can be used to deposit preformed dielectric layers. The dielectric layers may even be deposited by a gas-phase deposition process such as a chemical vapor deposition (CVD).

Preferably, the first and second dielectric layers are respectively laminated to the first and second sides of the core structure. In these embodiments, the dielectric layers may be preformed prior to being deposited on the core structure. By depositing a preformed dielectric layer onto the core structure, the thickness of the dielectric layer is substantially uniform when present on the core structure. In addition, by laminating preformed dielectric layers onto a core structure, dielectric layers on opposite sides of the core structure can be deposited simultaneously, thus providing for more efficient processing.

Preferably, a preformed dielectric layer is disposed on a carrier layer prior to being laminated to the core structure. The carrier layer may include any suitable polymeric material including polyethylene terephthalate. The preformed dielectric layer and the carrier layer may form a composite. Suitable composites are commercially available from Ajinomoto, Inc. (e.g., ABF-SH9). With reference to FIG. 43, composites 140(a), 140(b) including a carrier layer 142(a), 142(b) and a dielectric layer 141(a), 141(b) are laminated to the first and second sides of the core structure 122. The composites 140(a), 140(b) are laminated to the core structure 122 so that the carrier layers 142(a), 142(b) are disposed on the outer surfaces of the dielectric layers 141(a), 141(b). The composites 140(a), 140(b) are preferably flexible and can be laminated to the core structure 122 simultaneously or sequentially.

The composites can be laminated to the core structure using any suitable apparatus. Heat and pressure can be applied to the dielectric layers to soften them so that they can conform to the surfaces to which they are laminated. The heating temperature and/or pressure can chosen in accordance with the particular material used for the dielectric layer. For example, a hot roll laminator can be used to laminate composites of this type onto opposing sides of the core structure simultaneously or sequentially. In some embodiments, the rolls of the hot roll laminator can be between about 60° C. to about 120° C. (preferably 80° C. to about 90° C.), and the rollers can run at a speed of about 1 to about 2 meters per minute. A vacuum laminator can also be used to laminate the dielectric layers or composites to the core structure. For example, using heat, the vacuum laminator can operate near vacuum (e.g., less than 1 atm) for a few minutes (e.g., 5 minutes or more). Alternatively, composites can be laid on opposite sides of a core structure, placed in a lamination press (e.g., a hydraulic press), and then laminated together. The lamination press can operate at a temperature of about 80° C. to about 90° C., and at a pressure of about 1 to about 3 kg/cm2 for a few minutes, (e.g., about 5 minutes or more). Regardless of the specific lamination apparatus used, after lamination, the dielectric layers may be disposed on opposite sides of the core structure and can be sandwiched between carrier layers.

After depositing the dielectric layers 141(*a*), 141(*b*), the dielectric layers 141(*a*) may be optionally cured. The dielectric layers can be cured in any suitable manner. For example, an electron-beam, heat, and/or U-V radiation can be used to cure the dielectric layers. The dielectric layers are cured in a lamination press, or preferably an oven, using heat.

Release layers may be optionally disposed on the uncured dielectric layers prior to and/or during curing (e.g., in a lamination press). The release layers preferably include a heat resistant material. Exemplary release layer materials include Teddler™ paper (commercially available from du Pont), fluoropolymeric materials such as polytetrafluoroethylene (Teflon™), or metal (e.g., aluminum, copper). If the release layer is a copper foil, a shiny side of the foil is preferably in contact with the dielectric layer. In these embodiments, the previously described carrier layer (if used) may be optionally replaced with a release layer which has a higher melting temperature than the carrier layer. For example, the carrier layer can have a melting temperature less than 150° C. while the release layer can have a melting temperature greater than about 150° C.

With reference to FIGS. 43 to 45, carrier layers 142(*a*), 142(*b*) can be separated (e.g., peeled) from the first and second dielectric layers 141(*a*), 141(*b*) after they are laminated to the core structure 122. Then, release layers 151(*a*), 151(*b*) can be deposited on the uncured first and second dielectric layers 141(*a*), 141(*b*). Preferably, the release layers 151(*a*), 151(*b*) are laminated to the first and second dielectric layers 141(*a*), 141(*b*). Heat, and optionally pressure, are applied to the structure to cure the dielectric layers 141(*a*), 141(*b*). For example, the first and second dielectric layers 141(*a*), 141(*b*) can be heated to a temperature of about 170° C. or more and can be subjected to a pressure of about 3.5 to about 20 kg/cm2 for about 60 minutes or more. The heat and pressure may be applied with a lamination press. After curing, the release layers 151(*a*), 151(*b*) can then be separated (e.g., by peeling) from the cured dielectric layers 141(*a*), 141(*b*).

In preferred embodiments, (with reference to FIGS. 43 and 44) an uncured dielectric layer on the core structure may be cured without the use of a release layer. For example, after laminating a carrier layer/dielectric layer composite to a core structure, the carrier layer can be removed from the dielectric layer. Then, the dielectric layer on the core structure can be cured.

In other embodiments, the dielectric layers can be partially cured and then conditioned (e.g., roughened) prior to complete curing. For instance, a precursor structure including a core structure and dielectric layers may be placed in an oven and baked for about 150° C. or more for about 30 minutes or less to partially cure the dielectric layers. Then, the outer surfaces of the dielectric layers may be roughened.

For example, an etch process such as a permanganate etch process can be used to roughen the surfaces of a dielectric layer. After roughening, circuit patterns can be formed on the dielectric layer. The circuit patterns can include conductive pads disposed on the distal ends of the first plurality of conductive posts. The dielectric layers may then be baked again to fully cure them. For example, to fully cure the dielectric layers, the dielectric layers can be additionally heated at about 170° C. or more for about 60 to about 90 minutes, or more. Then, a second plurality of conductive posts can be formed on the conductive pads. Advantageously, by roughening the outer surfaces of the dielectric layers, any subsequently deposited seed layers or conductive layers can tightly adhere to the surfaces of the dielectric layers.

After the dielectric layers 141(*a*), 141(*b*) are deposited on the core structure 122, dielectric layer material present on the distal ends of the first plurality of conductive posts 134(*a*), 134(*b*) can be removed to clean the post ends. In some embodiments, residual dielectric layer material can be present on the distal ends of the conductive posts after one or more dielectric layers are deposited on the core structure. For example, after laminating and curing, a dielectric layer on the conductive posts on the core structure, residual dielectric layer material can remain on the post ends. The residual dielectric material is typically 10 microns or less, and is often is about 2 to about 5 microns thick. After the post ends are cleaned, additional conductive posts can be subsequently formed on the first plurality of conductive pads and posts 134(*a*), 134(*b*). The formed conductive posts can be stacked and are electrically coupled together to form a generally vertical electrical pathway through one or more dielectric layers.

Any suitable process can be used to remove dielectric material from the distal ends of the conductive posts. Exemplary removal processes include etching processes such as a permanganate etch process, plasma etch process, or an abrading process such as mechanical polishing. In preferred embodiments, mechanical polishing can be used to remove the dielectric layer material. Mechanical polishing can be performed by using a polishing apparatus such as an oscillation deburrer. Oscillation deburrers are commercially available from Ishii Hyoki. The polishing apparatus can include buffing elements such as SiC and $Al_2O_3$ buffing wheels. In a typical operation, the revolution speed of the wheels can be about 2000 revolutions per minute (rpm) or more, and the oscillation cycle of the wheels is about 470 (cycles per minute) or more, and the oscillation stroke of the wheels is about 5 mm or more. The wheel pressure can be controlled automatically by preset pressure at a range of 0.25 to about 20 $kg/cm^2$. In other embodiments, the dielectric material on the distal ends of the conductive posts may be ablated. For example, a laser can be used to ablate the dielectric layer material from the ends of the conductive posts.

Optionally, protective layers may be used during the dielectric material removal process to protect the dielectric layer regions not disposed on the conductive posts. With reference to FIG. 46, protective layers 161(*a*), 161(*b*) can be disposed on the dielectric layers 141(*a*), 141(*b*). The apertures 162(*a*), 162(*b*) of the protective layers 161(*a*), 161(*b*) can be disposed over the distal ends of the conductive posts 134(*a*), 134(*b*). Dielectric layer material on the distal ends of the conductive posts are exposed through the protective layer apertures. By using a protective layer during the dielectric material removal process, the deposited dielectric layers are protected in the regions not disposed on the ends of the posts. Consequently, in these embodiments, unwanted dielectric layer material can be selectively removed. For example, a wide area laser can scan the outer surface of a protective layer disposed on a dielectric layer. The laser can ablate dielectric layer material exposed through apertures in the protective layer. Regardless of the particular removal process used, after removing the dielectric material from the ends of the conductive posts, the protective layers can be removed from the dielectric layers. For instance, the protective layers may be removed by etching or peeling.

The protective layers may deposited onto or formed on the previously deposited dielectric layers in any suitable manner. For example, in one embodiment, a layer of photoresist can be deposited, irradiated, and developed on a deposited dielectric layer to form a protective layer. In another embodiment, a protective layer with apertures is preformed, and is then laminated to a dielectric layer so that the distal ends of the posts (and any dielectric layer material thereon) are accessible through the apertures. The apertured protective layer may be the same as, derived from, or different from the previously described release or carrier layers.

In another example, apertures in the protective layers 161(a), 161(b) can be formed when the dielectric layer material is removed from the distal ends of the conductive posts. For example, a continuous protective layer can be laminated to a dielectric layer on a core structure. The dielectric layer material on the distal ends of the conductive posts may be ablated along with portions of the protective layer disposed on the distal ends. In this case, additional cleaning of the distal ends of the posts may not be needed after ablation and the formed apertured protective layer can simply be removed from the dielectric layers. Any residual material from the ablation process can remain on the outer surface of the formed protective layers and can be removed along with the protective layers. For example, any ash generated by the ablation process can be removed along with the protective layers when the protective layers are peeled off of the dielectric layers.

After the dielectric layers are deposited, conductive patterns can be formed on the dielectric layers. This can be done before the second plurality of conductive posts are formed. The conductive patterns are preferably formed by an additive process such as electroplating. For example, with reference to FIGS. 47 and 48, after any carrier layers, release layers, or protective layers are removed (if used), seed layers 155(a), 155(b) may be deposited on the outer surfaces of the first and second dielectric layers 131(a), 131(b) and over the distal ends of the first plurality of conductive posts 134(a), 134(b). Prior to depositing the seed layers, the dielectric layer surfaces can be conditioned (e.g., roughened) in the same or different manner as described above for the core structure 122. Then, photoresist layers may be deposited over the seed layers 155(a), 155(b), irradiated, and then developed to form patterned photoresist layers 161(a), 161(b). The photoresist layers 161(a), 161(b) may have the same or different characteristics as the previously described photoresist layers 131(a), 131(b). As shown in FIG. 49, the patterned photoresist layers 161(a), 161(b) can be disposed on the seed layers 155(a), 155(b).

With reference to FIG. 50, conductive patterns 156(a), 156(b) are then formed (e.g., by electroplating) on the portions of the seed layers not covered by the developed photoresist layers 161(a), 161(b). The conductive patterns are preferably made of the same material as the conductive posts. The thickness of the formed conductive patterns 156(a), 156(b) can be between about 5 to about 35 microns, preferably between about 10 and about 20 microns. After the conductive patterns 156(a), 156(b) are formed, the photoresist layers 161(a), 161(b) can be removed (e.g., by stripping) from the surfaces of the dielectric layers 131(a), 131(b).

The conductive patterns may include a number of pads 139(a), 139(b) which are disposed on the distal ends of the first plurality of conductive posts. The pads generally have a larger surface area than the diameter of the conductive posts upon which they are disposed. Typically, a pad is disposed between respectively stacked conductive posts and is in direct contact with the stacked conductive posts.

Then, a second plurality and any subsequent plurality of conductive posts, dielectric layers, and conductive patterns can be formed on the structure shown in FIG. 51, or any subsequent multilayer circuit structure precursor, by repeating one or more of the previously described steps. For example, the process used to form the second plurality of conductive posts can be the same or different process used to form the first plurality of conductive posts. Preferably, the first, second, and any subsequent plurality of posts are formed by electroplating. Once the conductive patterns 156(a), 156(b) and conductive posts are formed, any seed layers 155(a), 155(b) can be etched (e.g., by flash etching).

Any number of conductive patterns, conductive posts, and dielectric layers can be included in the formed multilayer circuit structure. For example, the multilayer circuit structure 170 shown in FIG. 52 includes a circuitized core structure 122, and three dielectric layers and three conductive layers on each side of the core structure 122. The multilayer circuit structure 170 also includes generally vertical conductive pathways, each pathway including stacked conductive posts, with a pad between each adjacent pair of stacked posts. The generally vertical conductive pathways permit the size of the formed multilayer circuit structure to be reduced in comparison with a similar multilayer circuit structure with staggered via structures. Consequently, embodiments of the invention can be used to produce reliable, high density multilayer circuit structures efficiently and in a cost efficient manner.

After the multilayer circuit structure is formed, surface finishes or solder masks can be applied to the outer surfaces of the multilayer circuit structure. For example, a Ni/Au pad finish and/or a solder mask can be formed on the outer surfaces of a formed multilayer circuit structure. Accordingly, the multilayer circuit structures can be used in, for example, single chip modules, multichip modules and/or as mother or daughter boards in an electrical assembly.

Referring in detail now to FIGS. 53–65B, there is seen in FIG. 53 a multilayer laminated substrate, generally illustrated as 200. The multilayer laminated substrate 200 includes conventional laminated substrates 202, 204, 206 and 208 which are electrically coupled together by aligned metal-filled interconnected vias, each generally illustrated as 210. Any two contiguous laminated substrates are separated by a bonding sheet 212, such as bonding sheets 212a, 212b and 212c.

Referring now to FIGS. 54–57, there is seen in FIG. 54 a conventional laminated substrate 202 e.g., fiberglass reinforced laminate) having a copper layer 214 disposed on an underside thereof. Subsequently, blind vias 216a, 216b and 216c are laser drilled down to copper layer 214 by any conventional means, such as by $CO_2$, UV-Yag or eximer laser. The $CO_2$ laser is preferred since it is easy to drill through a fiber glass reinforced laminate and the drilling speed is much faster than others. Subsequently, and as shown in FIG. 56, the blind vias 216a, 216b and 216c are respectively filled with copper 218a, 218b and 218c, by any conventional manner. Due to plating non-uniformity (typically 10%), slightly over plating is necessary to make sure that every blind via 216a, 216b and 216c is filled up or above the top surface of laminated substrate 202. After plating, buff polishing of surface is applied to remove excess plating and flatten copper-filled blind vias by a deburr machine, such as Ishii Hyoki's oscillation deburrer. After the blind vias 216a, 216b and 216c have been copper-filled, and preferably subsequently buffed, a solder bump 220 is deposited on each of the copper-filled blind vias 216a, 216b and 216c.

In one embodiment of the invention and as best shown in FIG. 57B, one or more solder bumps 220 may comprise three (3) separate superimposed solder layers 220a, 220b and 220c. In another embodiment of the invention and as best shown in FIG. 57C, one or more solder bumps 220 may comprise two (2) separate superimposed solder layers (e.g., solder layers 220a and 220b on one substrate and a single solder layer (e.g., solder layer 220c) on a second substrate. Thus, two superimposed solder layers may be disposed on one substrate (e.g., substrate 220a), while a single layer may be disposed on another substrate (e.g., substrate 220b).

The material for the solder layer(s) 220 comprises a conductive composition which may include pure metals, metal alloys, metal alloy precursors, metallic compositions, metallic compounds, and combinations thereof. For example, the conductive composition can include one or more materials selected from the group consisting of In, Sn, Bi, Sb, Pb, Ni, Zn, Cu, Cd, Pt, Pd, Au and Ag.

Preferably, the conductive composition includes soft solder materials which can readily deform when pressed, thus providing for good areal contact between conducting surfaces. For instance, deforming the conductive compositions against conductive surface can increase the contact area with the support area. Suitable examples of solder compositions can include metals, or single or multi-phase alloys. The alloys may be binary, ternary, or other higher order compositions. Examples include alloys comprising In—Sn, Bi—Sn, In—Ag, Sn—Sb, Au—Sn, and Pb—Sn. More specific examples of solder material combinations include 52In/48Sn, 58Bi/42Sn, 97In/3Ag, In, 37Pb/63Sn, 96.5Sn/3.5Ag, 95Sn/5Sb, 80Au/20Sn, and 90Pb/10Sn (described in terms of weight percentages). More specifically and in a preferred embodiment of the invention, when the solder layer(s) 220 comprises three (3) superimposed layers (e.g., solder layers 220a, 220b and 220c), the conductive composition comprises the following elements of Table II (numbers representing weight percentages):

TABLE II

|  | Approach I | Approach II |
|---|---|---|
| Solder Layer 220a | 2–5 um of eutectic solder: 37 Pb/63 Sn or 40 Pb/60 Sn | 2–5 um of Sn |
| Solder Layer 220b | 10–20 um of high lead solder: 90–97 Pb/3–10 Sn | 10–20 um of Ag |
| Solder Layer 220c | 2–5 um of eutectic solder: 37 Pb/63 Sn or 40 Pb/60 Sn | 2–5 um of Sn |

In the embodiment of the invention illustrated in FIG. 57C, solder layers 220a and 220b may respectively include the conductive composition set forth in Table II above for solder layers 220a and 220b. If a single solder layer, such as solder layer 220c, is to be employed on a separate first substrate (e.g., substrate 202) while another or second substrate (e.g., substrate 204) supports two (2) superimposed solder layers (such as solder layers 220a and 220b), the single solder layer (i.e., solder layer 220c) may comprise the conductive composition set forth in Table II above for solder layer 220c.

Referring now to FIGS. 58A–63A, photoresist 224 is disposed on at least one side, more preferably photoresist 224 is disposed on two opposing sides and is patterned over copper layer 214 which is subsequently etched. Either dry film or liquid photoresist may be used. Photoresist 224 is stripped, and then a dielectric polymer bonding film (e.g., bonding sheet 212a), and a release layer 226 coupled or attached thereto, is secured or tacked in any conventional manner to the exposed top side of the laminated substrate 202, as best shown in FIG. 60A. Tacking may be accomplished by lamination. During the lamination, the bonding film or sheet (such as Ajinomoto bonding film) is heated to its maximum flow rate temperature (e.g., 80–90° C.) without curing it so that the solder bumps 220 can easily pierce or pass through it. Alternatively, a liquid polymer may be substituted for the bonding film. The liquid polymer may be coated on by screen printing, curtain coating or spray coating. The release layer 226 is then removed or stripped from the bonding film (i.e., bonding sheet 212a in FIG. 61A).

A plurality of the formed substrate assembly of FIG. 61A may be produced with laminated substrates 202, 204, 206 and 208, then aligned as shown in FIG. 62A, and subsequently laminated together by any conventional means to make intermetallic joints and the multilayer laminated substrate 200 (see FIGS. 53 and 63A). More specifically, a plurality of the formed substrate assembly of FIG. 61A may be interconnected by lamination to make the intermetallic joint and to cure bonding film, such as bonding film 212a. First, the substrate, such as substrate 202, will be heated slightly higher than the solder layers (i.e., solder layers 220a and 220c) melting temperature (e.g., 185–230° C. for the eutectic solder of Approach I in Table II above and 235–250° C. for the Sn of Approach II in Table II above). It is well known that the melting temperature of lead (e.g., 300° C. to 325° C.) is higher than the melting temperature of tin (e.g., about 260° C.), and the melting temperature of gold (e.g., about 900° C.) is higher than that of lead. Thus, preferably the melting temperature for solder layers 220a and 220c is lower than the melting temperature for solder layer 220b. The solder compositions(s) of the solder layers will melt and fuse together to make the intermetallic joint. At the same time, the solder layers 220a and 220c and solder layer 220b will comingle and/or diffuse into each other and raise the melting temperature of the whole intermetallic joint. Finally, the joint will be "frizzed" at much higher temperature than the melting temperature of solder layers 220a and 220c (i.e., a "frizze" temperature of about 260–300° C. for Approach I in Table II and >300° C., such as 310–500° C., for Approach II in Table II) and higher than the melting temperature of solder layer 220b to further comingle and diffuse the solder layers into each other. Then, the temperature is reduced to the curing temperature (e.g., 95–140° C.) of the bonding film (e.g., bonding film 212a) to cure the bonding film, such as bonding film 212a. It should be readily apparent that the two opposed substrates 202 and 208 of the alignment of FIG. 62A are rotated 180 degrees to align copper 218c in via 216c of one substrate (e.g., substrate 208) with copper 218a in via 216a of a contiguous substrate (e.g. substrate 206).

Referring now to FIGS. 58B–65B, there is seen a sequential process by which an initially pair of substrates (e.g., substrates 202 and 204 in FIGS. 60B and 61B) are laminated together as previously indicated to produce the substrate assembly of FIG. 61B. Subsequently, the exposed copper layers 214–214 are patterned with photoresist 224–224. Bonding sheets 212c and 212b are then disposed on the patterned copper layers 214–214 in accordance with the previously indicated procedure. Substrates 206 and 208 with associated copper fillings (i.e., copper fillings 218a, 218b, and 218c) and copper layers 214–214 are produced in accordance with the previously mentioned procedure, and subsequently coupled to the substrate assembly of FIG. 63B through lamination on the bonding sheets 212b and 212c, as previously indicated. The exposed copper layers 214–214 are then patterned with the assistance of photoresist 224–224. By performing the foregoing procedure the solder layers 220 will not be exposed to lithographic patterning process.

The embodiments of the invention of FIGS. 53–65B has many advantages over conventional plated through hole (PTH) vias. For example, embodiments of the present invention enable the production of much smaller (50–150 um vs. >200 um in diameter) vias so that the density is much higher. For L/D (laminated core+build-up deposited layer) package substrate application, the via of laminated core has to be filled before any deposited layer can be build up on top. Embodiments of the present invention has automatically filled vias so that no extra process steps are needed. For conventional plated through hole vias, the center hole of the plated vias have to be filled after via plating (forming). The typical filling material is a suitable liquid polymer (e.g., epoxy). Since the coefficient of thermal expansion (CTE) of typical polymer filler is much higher, it will generate reliability problem. For solving this problem, a copper capping layer is plated usually after via filling to "cap" the filler inside the via, but this way increases total thickness of copper before patterning so that the subtractive patterning resolution decreases. Embodiments of the present invention provide stack via structures to save the space. As previously mentioned embodiments of the present invention can make "frizzed" solder joints so that the solder joints can easily survive from further chip assembly processing, such as solder reflow to mount chips on a substrate.

Referring now to FIGS. 66–79 for another embodiment of the invention, there is illustrated various embodiments for making a high density, cost-effective multilayer build-up substrates as IC package substrate and high density mother board. The embodiments of the invention illustrated in FIGS. 66–79 are an improvement over the embodiments of FIGS. 37–65B. More specifically, the vias in FIGS. 66–79 are stacked via structures instead of staggered via structures. The improved approach illustrated in FIGS. 66–79 fabricates a stacked via structure. The major advantage of this improved approach is that only one photo lithography step is needed for each build-up layer, instead of two steps in previous embodiments of the invention (e.g., that of FIGS. 37–65B). All features and parameters previously stated for the embodiments of the invention illustrated in FIGS. 37–65B are applicable for embodiments of the invention of FIGS. 66–79, unless otherwise indicated.

FIG. 66 shows a circuitized core structure 322 upon which a plurality of conductive posts are formed. The core structure 322 includes a first side 322(a) and a second side 322(b), and can be flexible or rigid. The first and second sides 322(a), 322(b) can have, respectively, a first plurality of conductive regions 324(a) and a second plurality of conductive regions 324(b). The first and second conductive regions 324(a), 324(b) can include, e.g., lines, pads, or the ends of via structures. Moreover, the first and second conductive regions 324(a), 324(b) can be made of any suitable conductive material including copper, and can have any suitable thickness including a thickness of less than about 50 microns, and preferably between about 18 to about 36 microns. In addition to having conductive regions 324(a), 324(b) on the outer surfaces of the core structure 322, the core structure 322 may also include two or more dielectric layers and one or more conductive layers (not shown) embedded within the core structure 322.

The core structure 322 can also include one or more via structures 323. The via structures can communicate the conductive regions 324(a), 324(b) on the first and second sides 322(a), 322(b) of the core structure 322. The via structures can be solid conductive posts, or can be plated through holes (PTH) which have been filled with a conductive or a non-conductive material. For example, the PTH can be filled with a polymeric material such as an epoxy-based polymer, with or without an embedded conductive material. In another example, the PTH can be filled with a conductive paste such as a silver filled conductive paste. Filling the PTH with a material displaces any air which might otherwise reside in the PTH. It is preferable to remove any air pockets which might reside in the resulting multilayer circuit structure, because trapped air may cause reliability problems in some instances.

In a typical PTH filling process, an aperture can be formed in a rigid insulating board. Metal can be electroplated onto the wall of the aperture to form a PTH. After forming the PTH, a conductive or non-conductive filler material can be deposited within the PTH by, e.g., stenciling. If the filler material is curable, the filler material can be cured within the PTH. Before or after curing, any excess filler material on the first and second sides of the core structure can be removed.

With reference to FIG. 67, composites 340(a), 340(b) including a carrier layer 342(a), 342(b) and a dielectric layer 341(a), 341(b) are laminated to the first and second sides of the core structure 322. The composites 340(a), 340(b) are laminated to the core structure 322 so that the carrier layers 342(a), 342(b) are disposed on the outer surfaces of the dielectric layers 341(a), 341(b). The composites 340(a), 340(b) are preferably flexible and can be laminated to the core structure 322 simultaneously or sequentially.

The composites can be laminated to the core structure using any suitable apparatus. Heat and pressure can be applied to the dielectric layers to soften them so that they can conform to the surfaces to which they are laminated. The heating temperature and/or pressure can chosen in accordance with the particular material used for the dielectric layer. For example, a hot roll laminator can be used to laminate composites of this type onto opposing sides of the core structure simultaneously or sequentially. In some embodiments, the rolls of the hot roll laminator can be between about 60° C. to about 120° C. (preferably 80° C. to about 90° C.), and the rollers can run at a speed of about 1 to about 2 meters per minute. A vacuum laminator can also be used to laminate the dielectric layers or composites to the core structure. For example, using heat, the vacuum laminator can operate near vacuum (e.g., less than 1 atm) for a few minutes (e.g., 5 minutes or more). Alternatively, composites can be laid on opposite sides of a core structure, placed in a lamination press (e.g., a hydraulic press), and then laminated together. The lamination press can operate at a temperature of about 80° C. to about 90° C., and at a pressure of about 1 to about 3 kg/cm2 for a few minutes, (e.g., about 5 minutes or more). Regardless of the specific lamination apparatus used, after lamination, the dielectric layers may be disposed on opposite sides of the core structure and can be sandwiched between carrier layers.

After depositing the dielectric layers 341(a), 341(b), the dielectric layers 341(a) may be optionally cured. The dielectric layers can be cured in any suitable manner. For example, an electron-beam, heat, and/or U-V radiation can be used to cure the dielectric layers. The dielectric layers are cured in a lamination press, or preferably an oven, using heat.

Release layers may be optionally disposed on the uncured dielectric layers prior to and/or during curing (e.g., in a lamination press). The release layers preferably include a heat resistant material. Exemplary release layer materials include Teddler™ paper (commercially available from du Pont), fluoropolymeric materials such as polytetrafluoroethylene (Teflon™), or metal (e.g., aluminum, copper). If the release layer is a copper foil, a shiny side of the foil is preferably in contact with the dielectric layer. In these embodiments, the previously described carrier layer (if used) may be optionally replaced with a release layer which has a higher melting temperature than the carrier layer. For example, the carrier layer can have a melting temperature less than 150° C. while the release layer can have a melting temperature greater than about 150° C. With reference to FIG. 68, carrier layers 342(a), 342(b) can be separated (e.g., peeled) from the first and second dielectric layers 341(a), 341(b) after they are laminated to the core structure 322.

Referring now to FIG. 69, openings or apertures 362(a) and 362(b) are formed respectively in dielectric layers 341(a) and 341(b), followed by depositing of seed layers 325(a) and 325(b), as best shown in FIG. 70. The seed layers 325(a), 325(b) can be used to help initiate the plating of the subsequently formed conductive posts. Preferably, the seed layers 325(a), 325(b) are deposited simultaneously, but they can be deposited sequentially in some instances. Any suitable process including sputtering and electroless plating can be used to deposit the seed layers. Electroless plating is preferred as it is generally less expensive than sputtering. Regardless of how they are deposited, the seed layers 325(a), 325(b) may have a thickness of about 3 microns or less. Preferably, the thickness of each seed layer is between about 0.1 to about 1.0 micron, and is more preferably between about 0.3 to about 0.6 micron.

Prior to depositing the seed layers 325(a) and 325(b), dieletric layers 341(a) and 341(b) may be conditioned. For example, to increase the adhesion of seed layers 325(a) and 325(b) to the dieletric layers 341(a) and 341(b), the surfaces of the dieletric layers 341(a) and 341(b) can be roughened. Roughening can be performed using any suitable process including an etch process such as a permanganate etch process. By roughening the surfaces of the dieletric layers 341(a) and 341(b) prior to depositing the seed layers 325(a) and 325(b), the seed layers 325(a) and 325(b) are more likely to adhere to the surfaces of the dieletric layers 341(a) and 341(b).

Referring now to FIGS. 71–73, after depositing the seed layers 325(a) and 325(b), a plurality of conductive posts 334(a), 334(b) are formed within the apertures 362(a) and 362(b). In this example, the conductive posts include conductive posts 334(a) on the first side of the core structure 322 and conductive posts 334(b) on the second side of the core structure 322. The plurality of conductive posts 334(a) and 334(b) are preferably formed on both sides of the core structure simultaneously. For example, the structure shown in FIG. 71 can be placed in an electroplating bath. In the electroplating bath, conductive material can plate from the conductive seeds 325(a) and 325(b) within apertures 362(a) and 362(b) to the open ends of the apertures 332(a) and 332(b) to form the plurality of conductive posts 334(a) and 334(b). In FIG. 71, mushrooms 335(a) and 335(b) are formed on and over conductive posts 334(a) and 334(b). Thus, plated via thickness can be higher than the dielectric thickness and form "mushrooms," or lower than the dielectric thickness (as shown in FIG. 72). In practice, two states might co-exist due to non-uniform plating (as shown in FIG. 73). Since buffing will remove upper part of dielectric material and planarize the vias, all scenarios are acceptable.

The layered structures of FIGS. 71, 72 or 73 may subsequently be planarized using a buffing machine, as best shown in FIG. 74, causing the removal of seed layers 325(a) and 325(b). Subsequently, seed layers 355(a), 355(b) may be deposited on the outer surfaces of the first and second dielectric layers 331(a), 331(b) and over the distal ends of the first plurality of conductive posts 334(a), 334(b), as best shown in FIG. 75. Prior to depositing the seed layers 331(a) and 331(b), the dielectric layer surfaces can be conditioned (e.g., roughened). Then, photoresist layers may be deposited over the seed layers 355(a) and 355(b), irradiated, and then developed to form patterned photoresist layers 361(a) and 361(b) (see FIG. 76). The photoresist layers 361(a) and 361(b) may have the same or different characteristics as the previously described photoresist layers 361(a), 361(b), 331(a) and 331(b). As shown in FIG. 76, the patterned photoresist layers 361(a) and 361(b) can be disposed on the seed layers 355(a) and 355(b).

With reference to FIG. 77, conductive patterns 356(a), 356(b) are then formed (e.g., by electroplating) on the portions of the seed layers not covered by the developed photoresist layers 361(a), 361(b). The conductive patterns are preferably made of the same material as the conductive posts. The thickness of the formed conductive patterns 356(a), 356(b) can be between about 5 to about 35 microns, preferably between about 10 and about 20 microns. After the conductive patterns 356(a), 356(b) are formed, the photoresist layers 361(a), 361(b) can be removed (e.g., by stripping) from the surfaces of the dielectric layers 331(a), 331(b).

The conductive patterns may include a number of pads 339(a), 339(b) which are disposed on the distal ends of the first plurality of conductive posts. The pads generally have a larger surface area than the diameter of the conductive posts upon which they are disposed. Typically, a pad is disposed between respectively stacked conductive posts and is in direct contact with the stacked conductive posts.

Then, a second plurality and any subsequent plurality of conductive posts, dielectric layers, and conductive patterns can be formed on the structure shown in FIG. 78, or any subsequent multilayer circuit structure precursor, by repeating one or more of the previously described steps. For example, the process used to form the second plurality of conductive posts can be the same or different process used to form the first plurality of conductive posts. Preferably, the first, second, and any subsequent plurality of posts are formed by electroplating. Once the conductive patterns 356(a), 356(b) and conductive posts are formed, any seed layers 355(a), 355(b) can be etched (e.g., by flash etching).

Any number of conductive patterns, conductive posts, and dielectric layers can be included in the formed multilayer circuit structure. For example, the multilayer circuit structure 370 shown in FIG. 79 includes a circuitized core structure 322, and three dielectric layers and three conductive layers on each side of the core structure 322. The multilayer circuit structure 370 also includes generally vertical conductive pathways, each pathway including stacked conductive posts, with a pad between each adjacent pair of stacked posts. The generally vertical conductive pathways permit the size of the formed multilayer circuit structure to be reduced in comparison with a similar multilayer circuit structure with staggered via structures. Consequently, embodiments of the invention of FIGS. 66–79 can be used to produce reliable, high density multilayer circuit structures efficiently and in a cost efficient manner.

Referring now to FIGS. 80–84, there is illustrated a process to facilitate plating of high aspect ratio vias. Traditionally, via opening can be drilled or lased through a laminate board 400 with copper surface layers 402 (FIG. 80). If plating 406 is applied to the deposited copper 402 in the through holes 410 to eventually close up the through holes, the ideal profile (FIG. 81A) may not be achieved, since it may happen that the pads/line end up too thick (FIG. 81B) or trapped voids/electrolyte occur inside the holes (FIG. 81C). If liquid-type coating or printing is applied on the top and bottom, the liquid will flow into the through holes and cover the seed layer. On the other hand, if viscous type of coating is applied, through holes 410 are likely covered (i.e., tented) with the viscous film due surface tension.

It is proposed to put a laminate board 414–414 in contact with a solid piece (FIG. 82), and a thin layer 414(a) of that solid material will adhere to the copper surface but not inside the through holes upon, for example, pressure, heating or reaction (FIG. 83). In such way, plating 420 will occur only on the side walls of the through holes (FIG. 84). It is also proposed to use sponge-type of material to hold coating liquid, then bring the laminate board 400 in contact with the sponge and have a thin layer of liquid adhere to the laminate board surface but not inside the through hole 410 by, for example, pressure, heating or reaction. In the proposed approach, less risk of trapped voids 408 (see FIG. 81C) in holes and better control in thickness on top surfaces can be achieved.

Referring now to FIGS. 85–89, there is illustrated a process to plate vias in a two-step process to reduce stress and improve adhesion. Traditionally, plate-up vias 450 in a dielectric 452 supported by substrate 456 have weak adhesion to the dielectric side walls (FIG. 86), while conformal plated (i.e., plate-in) through vias 460 (FIG. 86) tend to crack at the bottom where the dielectric opening is small and the stress in copper deposits is high. It is proposed to use a two-step process. Step 1 (FIG. 87) employs plate-up 464 at the bottom of the vias 468 and avoid stress-concentrated spots near the bottom of dielectric opening 470. Step 2 deposits a seed layer 474 (FIG. 88) and uses plate-in 480 (FIG. 89) to achieve good adhesion between vias and dielectric side walls in the top portion of the holes. In the proposed approach, lower stress at the via bottom and better sidewall adhesion can be achieved. Also, there is less concern for trapped void since the aspect ratio is reduced by plate-up before conformal plating starts.

Referring now to FIGS. 90–93, there is illustrated a method and apparatus for improving plating uniformity. By connecting a small power supply between a jet nozzle head and a sample, one can improve the plating uniformity caused by electrical field blockage in jet impingement plating. Jet impingement plating is used to fill through hole vias and plate fine lines/pads at the same time for low-cost fabrication. Embodiments of this invention improve the plating uniformity from jet impingement plating. The plating non-uniformity associated with a wrong positioned nozzle head may be solved by new designs as described herein.

Referring now to FIG. 90, there is illustrated a typical electroplating phenomenon where the electrical field is built up between an anode 500 and a sample 502. The conductive ions 510 flow in the direction of the electrical field. The electrochemical reactions occur at the interfaces of the anode/solution and sample/solution. The turbulence flow in the bulk solution provides a supply of ions that were consumed at the interface. When a nozzle 512 is disposed between the sample 502 and the anode 500, the nozzle 512 will block the flow of ions 510 and the electrical field, as illustrated in FIG. 91. Although the nozzle 512 does provide an ions stream to the sample 502, the electrical field may still diminished by the physical presence of the nozzle 512. The ions 510 that brought to the interface by jet stream cannot have reaction at the interface due to the lack of electrical field. The low electrical field by the blockage will create an area with low plating thickness.

In order to solve this thickness non-uniformity, one either can redistribute the nozzle head to the sides; or, as illustrated in FIG. 92, one can apply a small current on a metal nozzle. This supplemental electrical field will compensate the loss caused by the blockage. In FIG. 93, there is illustrated a fundamental way to solve this problem by using a machined anode 500(a) that will provide both the functions of an anode and a jet nozzle. Thus, this embodiment is a way to solve the plating thickness non-uniformity associated with jet impingement plating. When the nozzles are not positioned correctly, the nozzle head may block the electrical field between an anode and a sample. This blockage is one of the main cause of thickness non-uniformity. Connecting a small power supply to a metal nozzle can solve this problem. On the other hand, if the anode provides a function as a nozzle at the same time, there is no concern about the blockage.

Referring now to FIGS. 94–105, there is seen an illustration of a method to plate fine through hole vias without using special chemicals. By using jet stream impingement, the plating solution inside the fine through hole will have same characteristics as in the bulk tank. Due to this uniformity in solution properties, the through hole can be filled without voids at the same time when pads and lines are plated. This process can be used to plate fine filled through hole vias at the same time as fine lines and pads. Due to this simplified process, it can save the cost for reliable structures.

FIGS. 94–96 show the general tank set up for jet impingement plating. This set up is designed to have both sides of the sample 570 plated at the same time. There is one anode 560 at each side of the sample 570. The sample 570 in the middle is moving back and forth to have a mild agitation. The jet nozzles 574 and 578 are located at both sides of the sample 570 between anodes 560 and the sample 570. The jet stream directly hits the sample 570 within the plating solution, so the sample 570 needs to be securely held on a fixture. Electrical current is applied to the sample 570 by two power supplies. Each power supply provides plating current for each side of the sample 570.

FIGS. 97–98 show the jet streams flow pattern inside the through hole via. FIG. 97 illustrates an ideal case where the via wall 600(a) of via hole 601 in substrate 602 is straight. In FIG. 98, via hole 601 has a tapered sidewall 600(b). In both cases, the jet stream will flow into the via hole 601 to the other side. Due to this forced convection flow, the property of the solution, such as concentration of all the chemical species, inside via hole 601 is not much different from the solution in the bulk, where the agitation provides a uniform solution property. Due to this fast flow, the boundary layer within the via hole 601 will be much faster than no flow. This mechanism provides a defect-free filled via. On the surface, where the fine lines and pads sit, there is not much difference in these two cases, with or without jet impingement. These are the reason that both via hole and fine lines can be plated at the same time without extra steps.

FIGS. 99 and 100 illustrate samples 570 that have been plated. The respective samples 570 have different pad size in each side. The pictures illustrate the respective via holes having been filled and the respective surfaces having a small dimple of around 3 μm deep. FIG. 101 is a cross section picture that shows no defects within the via and the fine line has the same thickness as pads. In comparison, FIG. 102 is a sample plating without jet impingement. The via holes were not filled in this case. Thus, fine through hole via can be plated without voids or trapped solution.

Fine line can be plated at the same time with vias and pads. An advantage is that extra process steps may be saved. This set up may be extended to various nozzle layouts (e.g. one at center, two at the edge, round nozzle, slit nozzle, etc.) and spray patterns (e.g. mesh type, shower head spray, or cylindrical, cone-shape, etc.). Also, the plating current can be pulse current or d.c. current. The current applied to two sides may be different in terms of value, type (d.c. or pulse), and on-off pattern. The nozzle jet can have an alternative on-off pattern either on a single nozzle or on both nozzles. The alternative on-off pattern can be coupled with paddling speed or electrical current. This plating method can be used to plate various metals, such as Cu, Ni, Au, etc. It also can be used on various types of substrates, such as laminated board, flex film, and Si, etc.

Referring in detail now to FIGS. 106–114, there is illustrated a method to produce metal-filled microvias of less than 50 μm in diameter on a FR-4 or reinforced substrate 700 with thickness larger than 100 μm. Because it is difficult for a laser to drill blind holes of less than 50 μm in diameter on a substrate thicker than 100 μm, through holes are drilled instead. Since the substrate 700 has been clad with Cu 704 on one side, the through holes 702 are through the Cu layer 700. The Cu side of the substrate is covered with an adhesive tape or dry film photo resist 710. The Cu side 704 is then connected to a cathode in an electrolytic Cu-plating bath 720. The accumulating Cu plating 730 first closes the open holes in the Cu layer, then fills up the hole 702.

The method works well for producing microvias of 100 μm in diameter on a 100 μm (or less) thick substrate, as well as for producing microvias of 50 μm in diameter on a 100 μm (or larger) thick substrate. As the aspect ratio (substrate thickness/via diameter) increases to larger than 1.0, it becomes difficult to drill blind hole with a Nd-Yd laser. It should also be noted that $CO_2$ laser cannot be used for holes smaller than 50 μm. The difficulty comes in sufficiently controlling laser power to burn all polymer substrate but not to penetrate through the clad Cu. The control of laser process becomes even more difficult if the laser power shows a variation with time of more than 5%. The proposed new process for filling hole by electrolytic plating is applicable with through holes. Through holes are much easier to drill with high yield using a Nd-Yd laser and the shape of the hole can be less taped.

Referring further now to FIGS. 106–114, holes 702 are drilled on a polymer substrate 700 clad with Cu 704 on one side. The laser parameters are adjusted such that the laser power is high to easily drill holes. The Cu 704 side of substrate 700 surface may need to face the laser in order to obtain a better result in hole shape. If the Cu 704 layer does not face the laser beam, the top surface of an epoxy substrate may be severely burned, forming craters on the top of through holes. If for some reason the Cu 704 side cannot face the laser beam, the top epoxy surface should be covered with Cu foil, which will reduce the damage and the formation of craters. After laser drilling, substrates may go through the permanganate etching, which is perferable at least for FR-4 substrate. For FR-4 substrates, it has been observed that without permanganate etching, or the etching time for permanganate was not long enough, Cu was plated on not only the bottom, but also the inner wall of the hole.

There are various versions of plating process. A first version is illustrated in FIGS. 106–109. A second version is illustrated in FIGS. 110–113. The difference between the two approaches is that in the end, there is a hole or indentation 704a in the filled hole (as shown in FIG. 109), and a bump 740a on the bottom of the filled hole (as shown in FIG. 113). The bump 740a on the bottom of the filled hole (FIG. 113) and the bumps 740b and 730a on top of the filled holes (FIGS. 109 and 113) can be polished off using PC (position control) wheel machine. The hole 704a on the bottom of the filled hole (FIG. 109) may be filled by selective plating including attaching dry film with a hole pattern, and then electrolytic plating.

Compared with a conventional current method of filling blind holes, the proposed method results in a much-improved yield, especially for the hole sizes less than 50 μm and aspect ratios larger than 2. The proposed method here produces a less taped hole shape, especially for hole sizes less than 50 μm and aspect ratios larger than 2. The proposed method is also simpler, does not require electroless Cu plating, and can fill the hole with rough inner wall surface, e.g., hole in FR-4 with extruding glass fibers.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for forming a plurality of conductive posts employing a single lithographic step for each build up layer comprising:

forming a first plurality of conductive posts on first and second sides of a circuitized core structure, each conductive post having an end proximate to the core structure and an end distal to the core structure;

depositing a first dielectric layer on the first side of the core structure, comprising the step of laminating a composite to the first side of the core structure, wherein the composite comprises a carrier layer and the first dielectric layer;

depositing a second dielectric layer on the second side of the core structure;

removing dielectric layer material from the distal ends of the first plurality of conductive posts; and forming a second plurality of conductive posts on the distal ends of the first plurality of conductive posts.

2. The method of claim 1 further comprising:
removing the carrier layer.

3. The method of claim 2 further comprising:
curing the first dielectric layer.

4. The method of claim 2 further comprising:
laminating a release layer on the first dielectric layer; and
curing the first dielectric layer.

5. The method of claim 1 wherein removing dielectric layer material comprises:
etching, ablating, or abrading the dielectric layer material on the distal ends of the first plurality of conductive posts.

6. The method of claim 1 wherein forming the first plurality of conductive posts comprises electroplating.

7. The method of claim 1 wherein the first plurality of conductive posts are formed simultaneously on the first and second sides of the core structure.

8. The method of claim 1 wherein the first and second dielectric layers are deposited simultaneously.

9. The method of claim 1 wherein the first plurality and the second plurality of conductive posts comprise copper.

10. The method of claim 1 wherein the core structure comprises a plated through hole.

11. The method of claim 10 wherein the plated through hole is filled with a dielectric material.

12. The method of claim 1
wherein forming a first plurality of conductive posts comprises
depositing first and second photoresist layers on the first and second sides of the core structure,
forming a plurality of apertures in the first and second photoresist layers,
forming the first plurality of conductive posts in the apertures in the first and second photoresist layers, and
wherein the method further comprises
removing the photoresist layers after forming the first plurality of conductive posts.

13. The method of claim 1 wherein the first and second dielectric layers comprise a polymeric material.

14. The method of claim 1 wherein depositing the first and second dielectric layers comprises laminating the first and second dielectric layers.

15. The method of claim 14 wherein laminating the first and second dielectric layers is performed simultaneously.

16. The method of claim 1 further comprising:
partially curing the first and second dielectric layers;
conditioning outer surfaces of the first and second dielectric layers;
forming conductive patterns on the first and second dielectric layers; and
fully curing the first and second dielectric layers.

17. The method of claim 1 wherein the second plurality of conductive posts are formed simultaneously.

18. The method of claim 1 further comprising, before forming a second plurality of conductive posts:
forming first and second circuit patterns comprising a plurality of conductive pads on the first and second dielectric layers, wherein the conductive pads are disposed between the first plurality of conductive posts and the second plurality of conductive posts.

19. The method of claim 18 wherein the first and second circuit patterns are formed by electroplating.

20. A method for forming a plurality of conductive posts employing a single lithographic step for each build up layer comprising:
forming a first plurality of conductive posts on first and second sides of a circuitized core structure, each conductive post having an end proximate to the core structure and an end distal to the core structure;
depositing a first dielectric layer on the first side of the core structure;
depositing a second dielectric layer on the second side of the core structure;
depositing first and second protective layers respectively on the first and second dielectric layers, wherein the dielectric layer material on the distal ends of the first plurality of conductive posts is removed through first and second protective layers;
thereafter removing dielectric layer material from the distal ends of the first plurality of conductive posts; and
forming a second plurality of conductive posts on the distal ends of the first plurality of conductive posts.

21. The method of claim 20 wherein the dielectric layer material is removed through preformed apertures in the first and second protective layers.

22. The method of claim 1, wherein each of the second plurality of conductive posts includes an end proximate to the core structure and distal to the core structure, and wherein the method further comprises:
curing the first and second dielectric layers after depositing the first and second dielectric layers;
forming first and second conductive patterns comprising a plurality of conductive pads on the first and second dielectric layers after removing dielectric layer material from the distal ends of the first plurality of conductive posts and before forming a second plurality of conductive posts, wherein the conductive pads are disposed between the first plurality of conductive posts and the second plurality of conductive posts;
depositing third and fourth dielectric layers on the first and second conductive patterns;
removing dielectric layer material from the distal ends of the second plurality of conductive posts; and
forming third and fourth circuit patterns on the third and fourth dielectric layers.

23. A method for forming a plurality of conductive posts employing a single lithographic step for each build up layer comprising:
forming a first plurality of conductive posts on a side of a circuitized core structure, each conductive post having an end proximate to the core structure and an end distal to the core structure;
laminating a dielectric layer on the core structure;
depositing a protective layer on the dielectric layer;
removing dielectric layer material from the distal ends of the first plurality of conductive posts through the protective layer; and
forming a second plurality of conductive posts on the distal ends of the first plurality of conductive posts.

24. The method of claim 23 further comprising, after removing dielectric layer material:
removing the protective layer.

25. The method of claim 23 wherein the protective layer comprises preformed apertures, and the dielectric layer material is removed through the preformed apertures.

26. The method of claim 23 wherein the deposited protective layer is continuous, and wherein removing dielectric layer material comprises laser ablating dielectric layer material from the distal ends of the first plurality of conductive posts.

27. The method of claim 23 further comprising:
forming a conductive pattern including conductive pads on the dielectric layer prior to forming the second plurality of conductive posts on the first plurality of conductive posts, wherein the conductive pads are disposed between the first and second plurality of conductive posts.

28. A method for forming a plurality of conductive posts employing a single lithographic step for each build up layer comprising:
forming a first plurality of conductive posts on first and second sides of a circuitized core structure, each conductive post having an end proximate to the core structure and an end distal to the core structure;
depositing a first dielectric layer on the first side of the core structure, said depositing including laminating a composite to the first side of the core structure, wherein the composite comprises a carrier layer and the first dielectric layer;
depositing a second dielectric layer on the second side of the core structure;
removing dielectric layer material from the distal ends of the first plurality of conductive posts;
forming a second plurality of conductive posts on the distal ends of the first plurality of conductive posts; and
removing the carrier layer.

29. The method of claim 28 further comprising:
curing the first dielectric layer.

30. The method of claim 28 further comprising:
laminating a release layer on the first dielectric layer; and
curing the first dielectric layer.

31. A method for forming a plurality of conductive posts employing a single lithographic step for each build up layer comprising:
forming a first plurality of conductive posts on first and second sides of a circuitized core structure, each conductive post having an end proximate to the core structure and an end distal to the core structure;
depositing a first dielectric layer on the first side of the core structure;
depositing a second dielectric layer on the second side of the core structure;
depositing a first and second protective layers respectively on the first and second dielectric layers, wherein the dielectric layer material on the distal ends of the first plurality of conductive posts is removed through first and second protective layers;
removing dielectric layer material from the distal ends of the first plurality of conductive posts; and
forming a second plurality of conductive posts on the distal ends of the first plurality of conductive posts.

32. The method of claim 31 wherein depositing a first dielectric layer on the first side of the core structure comprises:
laminating a composite to the first side of the core structure, wherein the composite comprises a carrier layer and the first dielectric layer.

33. The method of claim 32 further comprising:
removing the carrier layer.

34. The method of claim 33 further comprising:
curing the first dielectric layer.

35. The method of claim 33 further comprising:
laminating a release layer on the first dielectric layer; and
curing the first dielectric layer.

36. The method of claim 31 wherein the dielectric layer material is removed through preformed apertures in the first and second protective layers.

37. A method for forming a plurality of conductive posts employing a single lithographic step for each build up layer comprising:
forming a first plurality of conductive posts on first and second sides of a circuitized core structure comprising a plated through hole, each conductive post having an end proximate to the core structure and an end distal to the core structure;
depositing a first dielectric layer on the first side of the core structure;
depositing a second dielectric layer on the second side of the core structure;
removing dielectric layer material from the distal ends of the first plurality of conductive posts; and
forming a second plurality of conductive posts on the distal ends of the first plurality of conductive posts;
wherein said conductive posts are offset from said plated through hole.

38. The method of claim 37 wherein said conductive posts are electrically coupled to a plate of the plated through hole.

39. A method for forming a plurality of conductive posts employing a single lithographic step for each build up layer comprising:
forming a plurality of pads on a circuitized core structure;
thereafter forming a first plurality of conductive posts on first and second sides of said core structure, each conductive post having an end proximate to the core structure and an end distal to the core structure;
depositing a first dielectric layer on the first side of the core structure;
depositing a second dielectric layer on the second side of the core structure;
removing dielectric layer material from the distal ends of the first plurality of conductive posts; and
forming a second plurality of conductive posts on the distal ends of the first plurality of conductive posts.

40. The method of claim 37 additionally comprising forming, prior to forming the first plurality of conductive posts, a plurality of pads on said core structure.

41. The method of claim 38 additionally comprising forming, prior to forming the first plurality of conductive posts, a plurality of pads on said core structure.

42. The method of claim 39 wherein the end of each conductive post which is proximate to the core structure is supported by a pad.

43. The method of claim 40 wherein the end of each conductive post which is proximate to the core structure is supported by a pad.

44. The method of claim 41 wherein the end of each conductive post which is proximate to the core structure is supported by a pad.

45. The method of claim 36 wherein the core structure comprises a plated through hole.

46. The method of claim 45 wherein the plated through hole is filled with a dielectric material.

47. The method of claim 31 wherein the core structure comprises a plated through hole.

48. The method of claim 47 wherein the plated through hole is filled with a dielectric material.

49. The method of claim 45 wherein said conductive posts are offset from said plated through hole.

50. The method of claim 49 wherein said conductive posts are electrically coupled to a plate of the plated through hole.

51. The method of claim 45 additionally comprising forming, prior to forming the first plurality of conductive posts, a plurality of pads on said core structure.

52. The method of claim 46 additionally comprising forming, prior to forming the first plurality of conductive posts, a plurality of pads on said core structure.

53. The method of claim 50 additionally comprising forming, prior to forming the first plurality of conductive posts, a plurality of pads on said core structure.

54. The method of claim 51 wherein the end of each conductive post which is proximate to the core structure is supported by a pad.

55. The method of claim 52 wherein the end of each conductive post which is proximate to the core structure is supported by a pad.

56. The method of claim 53 wherein the end of each conductive post which is proximate to the core structure is supported by a pad.

57. The method of claim 47 wherein said conductive posts are offset from said plated through hole.

58. The method of claim 48 wherein said conductive posts are electrically coupled to a plate of the plated through hole.

59. The method of claim 47 additionally comprising forming, prior to forming the first plurality of conductive posts, a plurality of pads on said core structure.

60. The method of claim 57 additionally comprising forming, prior to forming the first plurality of conductive posts, a plurality of pads on said core structure.

61. The method of claim 58 additionally comprising forming, prior to forming the first plurality of conductive posts, a plurality of pads on said core structure.

62. The method of claim 59 wherein the end of each conductive post which is proximate to the core structure is supported by a pad.

63. The method of claim 60 wherein the end of each conductive post which is proximate to the core structure is supported by a pad.

64. The method of claim 61 wherein the end of each conductive post which is proximate to the core structure is supported by a pad.

* * * * *